United States Patent
Takahashi et al.

(10) Patent No.: US 11,592,604 B2
(45) Date of Patent: Feb. 28, 2023

(54) COMPOSITION, FILM, LAMINATE, INFRARED TRANSMITTING FILTER, SOLID IMAGE PICKUP ELEMENT, AND INFRARED SENSOR

(71) Applicant: FUJIFILM Corporation, Tokyo (JP)

(72) Inventors: Kazutaka Takahashi, Haibara-gun (JP); Shunsuke Kitajima, Haibara-gun (JP); Tokihiko Matsumura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 440 days.

(21) Appl. No.: 16/815,877

(22) Filed: Mar. 11, 2020

(65) Prior Publication Data

US 2020/0225390 A1 Jul. 16, 2020

Related U.S. Application Data

(63) Continuation of application No. PCT/JP2018/033116, filed on Sep. 7, 2018.

(30) Foreign Application Priority Data

Sep. 15, 2017 (JP) .............................. JP2017-177805
Mar. 27, 2018 (JP) .............................. JP2018-059756

(51) Int. Cl.
*G02B 5/20* (2006.01)
*H01L 27/146* (2006.01)
(Continued)

(52) U.S. Cl.
CPC .............. *G02B 5/208* (2013.01); *B32B 7/023* (2019.01); *C09B 67/0097* (2013.01);
(Continued)

(58) Field of Classification Search
CPC ......... G02B 5/28; G02B 5/201; G02B 5/223; G01J 1/0448; G03F 7/0007;
(Continued)

(56) References Cited

U.S. PATENT DOCUMENTS

2012/0285528 A1  11/2012  Takanohashi et al.
2014/0027685 A1   1/2014  Ueda et al.
(Continued)

FOREIGN PATENT DOCUMENTS

CN   101120272 A   2/2008
CN   101233208 A   7/2008
(Continued)

OTHER PUBLICATIONS

Korean Office Action for corresponding Korean Application No. 10-2020-7007124, dated Dec. 8, 2021, with an English translation.
(Continued)

*Primary Examiner* — Ruiyun Zhang
(74) *Attorney, Agent, or Firm* — Birch, Stewart, Kolasch & Birch, LLP

(57) ABSTRACT

Provided is a composition with which a film that allows transmission of infrared light in a state where noise generated from visible light is small can be formed. In addition, provided are a film, a laminate, an infrared transmitting filter, a solid image pickup element, and an infrared sensor. This composition includes: a coloring material that allows transmission of infrared light and shields visible light; an infrared absorber; and a curable compound, in which the infrared absorber includes a material that shields light in a wavelength range of longer than 1000 nm and 1200 nm or shorter. In the composition, a ratio A/B of a minimum value A of an absorbance of the composition in a wavelength range
(Continued)

of 400 to 1100 nm to a maximum value B of an absorbance of the composition in a wavelength range of 1400 to 1500 nm is 4.5 or higher.

11 Claims, 1 Drawing Sheet

(51) Int. Cl.
| | |
|---|---|
| *G01J 1/04* | (2006.01) |
| *G02F 1/1335* | (2006.01) |
| *G02B 5/22* | (2006.01) |
| *B32B 7/023* | (2019.01) |
| *G03F 7/00* | (2006.01) |
| *H01L 31/0216* | (2014.01) |
| *C09B 67/02* | (2006.01) |

(52) U.S. Cl.
CPC ............ *G01J 1/0488* (2013.01); *G02B 5/201* (2013.01); *G02B 5/223* (2013.01); *G02F 1/133514* (2013.01); *G03F 7/0007* (2013.01); *H01L 27/1462* (2013.01); *H01L 31/02162* (2013.01); *B32B 2551/00* (2013.01); *G02F 2203/11* (2013.01)

(58) Field of Classification Search
CPC ........... G02F 1/133514; G02F 2203/11; H01L 1/02162; B32B 2551/00; B32B 7/023
USPC ....................................................... 359/359
See application file for complete search history.

(56) References Cited

U.S. PATENT DOCUMENTS

| | | | |
|---|---|---|---|
| 2014/0120473 | A1 | 5/2014 | Aoyagi |
| 2015/0260885 | A1 | 9/2015 | Takishita et al. |
| 2015/0260889 | A1 | 9/2015 | Shiono et al. |
| 2015/0372037 | A1 | 12/2015 | Tomeba |
| 2016/0018576 | A1 | 1/2016 | Yamamoto et al. |
| 2017/0010528 | A1 | 1/2017 | Takishita et al. |
| 2017/0038507 | A1 | 2/2017 | Norizuki et al. |
| 2017/0174869 | A1 | 6/2017 | Arayama et al. |
| 2018/0057690 | A1 | 3/2018 | Mori et al. |
| 2018/0356575 | A1 | 12/2018 | Takahashi |

FOREIGN PATENT DOCUMENTS

| | | | |
|---|---|---|---|
| CN | 102341467 | A | 2/2012 |
| CN | 103429600 | A | 12/2013 |
| CN | 104838294 | A | 8/2015 |
| CN | 105122095 | A | 12/2015 |
| CN | 105190374 | A | 12/2015 |
| CN | 106461830 | A | 2/2017 |
| CN | 106661340 | A | 5/2017 |
| JP | 6-222211 | A | 8/1994 |
| JP | 8-44049 | A | 2/1996 |
| JP | 2004-219995 | A | 8/2004 |
| JP | 2008-133447 | A | 6/2008 |
| JP | 4991479 | B2 | 8/2012 |
| JP | 2013-77009 | A | 4/2013 |
| JP | 2014-130338 | A | 7/2014 |
| JP | 2016-60671 | A | 4/2016 |
| JP | 2016-162946 | A | 9/2016 |
| JP | 2017-109887 | A | 6/2017 |
| TW | 201641612 | A | 12/2016 |
| WO | WO 2015/166779 | A1 | 11/2015 |
| WO | WO 2016/190162 | A1 | 12/2016 |
| WO | WO 2017/146091 | A1 | 8/2017 |

OTHER PUBLICATIONS

Taiwanese Office Action and Search Report for corresponding Taiwanese Application No. 107131794, dated Dec. 6, 2021.
Chinese Office Action for corresponding Chinese Application No. 201880058699.3, dated Dec. 16, 2021, with an English translation.
Extended European Search Report, dated Aug. 21, 2020, for corresponding European Application No. 18857140 0.
International Preliminary Report on Patentability and Written Opinion of the International Searching Authority (Forms PCT/IB/326, PCT/IB/373 and PCT/ISA/237) for International Application No. PCT/JP2018/033116, dated Mar. 26, 2020, with English translation.
International Search Report (Form PCT/ISA/210) for International Application No. PCT/JP2018/033116, dated Nov. 27, 2018, with English translation.
Chinese Office Action and Search Report for corresponding Chinese Application No. 201880058699.3, dated May 24, 2021, with English translation of the Office Action.
Korean Office Action for corresponding Korean Application No. 10-2020-7007124, dated Jun. 27, 2022, with an English translation.

COMPOSITION, FILM, LAMINATE, INFRARED TRANSMITTING FILTER, SOLID IMAGE PICKUP ELEMENT, AND INFRARED SENSOR

CROSS-REFERENCE TO RELATED APPLICATIONS

This application is a Continuation of PCT International Application No. PCT/JP2018/033116 filed on Sep. 7, 2018, which claims priority under 35 U.S.C § 119(a) to Japanese Patent Application No. 2017-177805 filed on Sep. 15, 2017, and Japanese Patent Application No. 2018-059756 filed on Mar. 27, 2018. Each of the above application(s) is hereby expressly incorporated by reference, in its entirety, into the present application.

BACKGROUND OF THE INVENTION

1. Field of the Invention

The present invention relates to a composition that is suitable for forming an infrared transmitting filter or the like, and a film formed of the composition. In addition, the present invention relates to a laminate that is suitable for an infrared transmitting filter or the like. In addition, the present invention relates to an infrared transmitting filter, a solid image pickup element including the infrared transmitting filter, and an infrared sensor including the infrared transmitting filter.

2. Description of the Related Art

A solid image pickup element is used as an optical sensor in various applications. For example, infrared light is less likely to be scattered than visible light due to its longer wavelength and can be used in, for example, distance measurement or three-dimensional measurement. In addition, infrared light is invisible to humans or animals. Therefore, even in a case where a subject is irradiated with infrared light using an infrared light source at night, the subject cannot recognize the infrared light. Thus, infrared light can be used for imaging a nocturnal wild animal or imaging a subject without provoking the subject for security reasons. This way, an optical sensor (infrared sensor) that detects infrared light can be used in various applications, and the development of a film that can be used in an infrared sensor is desired.

JP2014-130338A describes a composition in which, in a case where a film having a thickness of 1 µm is formed using the composition, a maximum value of a light transmittance of the film in a thickness direction in a wavelength range of 400 to 750 nm is 20% or lower, and a minimum value of a light transmittance of the film in the thickness direction in a wavelength range of 900 to 1300 nm is 90% or higher.

JP2013-077009A describes a radiation-sensitive coloring composition for a color filter including (A) a pigment, (B) a photopolymerization initiator, and (C) a polymerizable compound, in which in a case where a radiation-sensitive coloring composition layer having a spectral transmittance of 30% at a wavelength of 600 nm is formed, the radiation-sensitive coloring composition layer satisfies the following conditions (1) to (5):

(1) a spectral transmittance at a wavelength of 400 nm is 20% or lower;

(2) a spectral transmittance at a wavelength of 550 nm is 10% or lower;

(3) a spectral transmittance at a wavelength of 700 nm is 70% or higher;

(4) a wavelength at which a spectral transmittance is 50% is in a range of 650 nm to 680 nm; and (5) the radiation-sensitive coloring composition layer has a thickness in a range of 0.55 µm to 1.8 µm.

WO2015/166779A describes a coloring composition including colorants and a resin, in which a ratio A/B of a minimum value A of an absorbance in a wavelength range of 400 to 830 nm to a maximum value B of an absorbance in a wavelength range of 1000 to 1300 nm is 4.5 or higher, and the colorants include one or more first colorants having an absorption maximum in a wavelength range of 800 to 900 nm and two or more second colorants having an absorption maximum in a wavelength range of 400 to 700 nm.

SUMMARY OF THE INVENTION

This way, recently, various investigations were conducted on a film that shields visible light and allows transmission of infrared light.

On the other hand, recently, it has been attempted to perform sensing or imaging using infrared light having a longer wavelength.

However, it was found that, in a case where films which have been known until now such as the films described in JP2014-130338A, JP2013-077009A, and WO2015/166779A are applied to an optical sensor or the like in which infrared light having a wavelength of longer than 1400 nm is used as a light source, noise is likely to be generated.

Accordingly, an object of the present invention is to provide a composition with which a film that allows transmission of infrared light in a state where noise is small can be formed. In addition, another object of the present invention is to provide a film, a laminate, an infrared transmitting filter, a solid image pickup element, and an infrared sensor.

As a result of detailed investigation, the present inventors found that the objects can be achieved using a composition described below, thereby completing the present invention. That is, the present invention is as follows.

<1> A composition comprising:
a coloring material that allows transmission of infrared light and shields visible light;
an infrared absorber; and
a curable compound,
in which the infrared absorber includes a material that shields light in a wavelength range of longer than 1000 nm and 1200 nm or shorter, and
a ratio A/B of a minimum value A of an absorbance of the composition in a wavelength range of 400 to 1100 nm to a maximum value B of an absorbance of the composition in a wavelength range of 1400 to 1500 nm is 4.5 or higher.

<2> The composition according to <1>,
in which the material that shields light in a wavelength range of longer than 1000 nm and 1200 nm or shorter is a compound having an absorption maximum in a wavelength range of longer than 1000 nm and 1200 nm or shorter.

<3> The composition according to <2>,
in which in the compound having an absorption maximum in a wavelength range of longer than 1000 nm and 1200 nm or shorter, a ratio absorbance $A_{max}$/absorbance $A_{1400}$ of an absorbance $A_{max}$ at the absorption maximum to an absorbance $A_{1400}$ at a wavelength of 1400 nm is 4.5 or higher.

<4> The composition according to <1>,
in which the material that shields light in a wavelength range of longer than 1000 nm and 1200 nm or shorter is at least one selected from a diiminium compound, a squarylium compound, a croconium compound, a cyanine compound, a dithiol metal complex, a lanthanum boride compound, flat metal particles, a quantum dot, or a rare earth-containing ceramic.

<5> The composition according to any one of <1> to <4>, in which the infrared absorber further includes a compound having an absorption maximum in a wavelength range of longer than 900 nm and 1000 nm or shorter.

<6> The composition according to any one of <1> to <5>, in which the infrared absorber further includes a compound having an absorption maximum in a wavelength range of longer than 700 nm and 900 nm or shorter.

<7> A film which is formed using the composition according to any one of <1> to <6>.

<8> The film according to <7>,
in which a maximum value of a light transmittance of the film in a thickness direction in a wavelength range of 400 to 1100 nm is 20% or lower, and
a minimum value of a light transmittance of the film in the thickness direction in a wavelength range of 1400 to 1500 nm is 70% or higher.

<9> A laminate comprising:
a layer including a coloring material that allows transmission of infrared light and shields visible light; and
a layer including a material that shields light in a wavelength range of longer than 1000 nm and 1200 nm or shorter,
in which a ratio A/B of a minimum value A of an absorbance of the laminate in a wavelength range of 400 to 1100 nm to a maximum value B of an absorbance of the laminate in a wavelength range of 1400 to 1500 nm is 4.5 or higher.

<10> The laminate according to <9>,
in which a maximum value of a light transmittance of the laminate in a thickness direction in a wavelength range of 400 to 1100 nm is 20% or lower, and
a minimum value of a light transmittance of the laminate in the thickness direction in a wavelength range of 1400 to 1500 nm is 70% or higher.

<11> An infrared transmitting filter comprising:
the film according to <7> or <8> or the laminate according to <9> or <10>.

<12> A solid image pickup element comprising:
the film according to <7> or <8> or the laminate according to <9> or <10>.

<13> An infrared sensor comprising:
the film according to <7> or <8> or the laminate according to <9> or <10>.

According to the present invention, a composition can be provided with which a film that allows transmission of infrared light in a state where noise generated from visible light is small can be formed. In addition, a film, a laminate, a solid image pickup element, and an infrared sensor can be provided.

DESCRIPTION OF THE PREFERRED EMBODIMENTS

Figure 1:
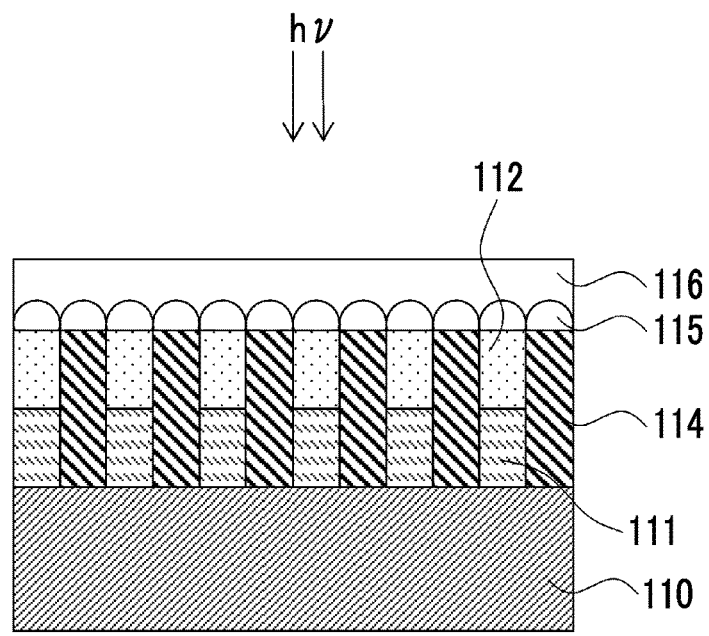
FIG. 1 is a schematic cross-sectional view showing a configuration of an embodiment of an infrared sensor according to the present invention.

In this specification, a total solid content denotes the total mass of components of a composition excluding a solvent.

In this specification, infrared light denotes light (electromagnetic wave) having a wavelength in a range of 700 to 2,500 nm.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, and Ph represents a phenyl group.

In this specification, the term "step" denotes not only an individual step but also a step which is not clearly distinguishable from another step as long as an effect expected from the step can be achieved.

In this specification, a weight-average molecular weight and a number-average molecular weight are defined as values in terms of polystyrene obtained by gel permeation chromatography (GPC). In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

A pigment described in the present invention denotes an insoluble colorant compound which is not likely to dissolve in a solvent. Typically, a pigment denotes a colorant compound which is present in a state of being dispersed as particles in a composition. As the solvent described herein, for example, an arbitrary solvent can be used, and examples thereof are described in "Solvent" described below. It is preferable that the pigment used in the present invention has a solubility of 0.1 g/100 g Solvent or lower at 25° C., for example, both in propylene glycol monomethyl ether acetate and in water.

<Composition>

A composition according to an embodiment of the present invention comprises:
a coloring material that allows transmission of infrared light and shields visible light;
an infrared absorber; and
a curable compound,
in which the infrared absorber includes a material that shields light in a wavelength range of longer than 1000 nm and 1200 nm or shorter, and
a ratio A/B of a minimum value A of an absorbance of the composition in a wavelength range of 400 to 1100 nm to a maximum value B of an absorbance of the composition in a wavelength range of 1400 to 1500 nm is 4.5 or higher.

With the composition according to the embodiment of the present invention, it is possible to suitably form a film having spectral characteristics in which a maximum value of a light transmittance of the film in a thickness direction in a wavelength range of 400 to 1100 nm is 20% or lower, and a minimum value of a light transmittance of the film in the thickness direction in a wavelength range of 1400 to 1500 nm is 70% or higher.

The absorbance conditions may be satisfied using any means. For example, as described below in detail, the composition includes: a coloring material that allows transmission of infrared light and shields visible light; and a material that shields light in a wavelength range of longer than 1000 nm and 1200 nm or shorter, in which the contents and kinds of the components are adjusted. As a result, the absorbance conditions can be suitably satisfied.

Regarding the spectral characteristics of the composition according to the embodiment of the present invention, the value of A/B is preferably 10 or higher, more preferably 20 or higher, and still more preferably 30 or higher. The upper limit is, for example, 90 or lower.

An absorbance $A\lambda$ at a wavelength $\lambda$ is defined by the following Expression (1).

$$A\lambda = -\log(T\lambda/100) \quad (1)$$

$A\lambda$ is an absorbance at the wavelength $\lambda$ and $T\lambda$ is a transmittance (%) at the wavelength $\lambda$.

In the present invention, the value of the absorbance may be a value measured in the form of a solution, or may be a value measured in the form of a film formed using the composition according to the embodiment of the present invention. In a case where the absorbance is measured in the form of the film, it is preferable that the absorbance is measured using a film that is formed by applying the composition to a glass substrate using a method such as spin coating such that the thickness of the dried film is a predetermined value, and drying the applied composition using a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be obtained by measuring using a well-known spectrophotometer of the related art. Measurement conditions of the absorbance are not particularly limited. It is preferable that the maximum value B of the absorbance in a wavelength range of 1400 to 1500 nm is measured under conditions which are adjusted such that the minimum value A of the absorbance in a wavelength range of 400 to 1100 nm is 0.1 to 3.0. By measuring the absorbance under the conditions, the measurement error can be further reduced. A method of adjusting the minimum value A of the absorbance in a wavelength range of 400 to 1100 nm to be 0.1 to 3.0 is not particularly limited. For example, examples of a method of measuring the absorbance in the form of a solution include a method of adjusting the optical path length of a sample cell. In addition, in a case where the absorbance is measured in the form of the film, for example, a method of adjusting the thickness of the film can be used.

A method of measuring the spectral characteristics and the thickness of the film formed using the composition according to the embodiment of the present invention is as follows.

The composition according to the embodiment of the present invention is applied to a glass substrate using a method such as spin coating such that the thickness of the dried film is a predetermined value, and then is dried using a hot plate at 100° C. for 120 seconds. The thickness of the film is obtained by measuring the thickness of the dried substrate including the film using a stylus surface profilometer (DEKTAK 150, manufactured by ULVAC Inc.). The transmittance of the dried substrate including the film is measured in a wavelength range of 300 to 1300 nm using an ultraviolet-visible-near infrared spectrophotometer (U-4100, manufactured by Hitachi High-Technologies Corporation).

The composition according to the embodiment of the present invention can also be referred to as an infrared light transmitting composition because it allows transmission of infrared light. Hereinafter, each of components which can form the composition according to the embodiment of the present invention will be described.

<<Coloring Material that Allows Transmission of Infrared Light and Shields Visible Light>>

The composition according to the embodiment of the present invention includes the coloring material that allows transmission of infrared light and shields visible light (hereinafter, also referred to as "coloring material that shields visible light").

In the present invention, it is preferable that the coloring material that shields visible light is a coloring material that absorbs light in a wavelength range of violet to red. In addition, in the present invention, it is preferable that the coloring material that shields visible light is a coloring material that shields light in a wavelength range of 450 to 650 nm (preferably in a wavelength range of 400 to 700 nm). In addition, in the present invention, it is preferable that the coloring material that shields visible light has an absorption maximum in a wavelength range of 400 nm to 700 nm. In addition, it is preferable that the coloring material that shields visible light is a coloring material that has high transmittance with respect to light in a wavelength range of 1400 to 1500 nm.

In the present invention, it is preferable that the coloring material that shields visible light satisfies at least one of the following requirement (1) or (2).

(1): The coloring material that shields visible light includes two or more chromatic colorants, and a combination of the two or more chromatic colorants forms black.

(2) The coloring material includes an organic black colorant.

In the aspect (2), it is preferable that the coloring material further includes a chromatic colorant.

In the present invention, the chromatic colorant denotes a colorant other than a white colorant and a black colorant. It is preferable that the chromatic colorant is a colorant having a maximum absorption wavelength in a wavelength range of 400 nm to 700 nm. In addition, "having an absorption maximum in a wavelength range of 400 nm to 700 nm" denotes having a maximum absorbance in a wavelength range of 400 nm to 700 nm in an absorption spectrum. For example, in an absorption spectrum in a wavelength range of 350 to 1300 nm, it is preferable that the chromatic colorant has a maximum absorbance in a wavelength range of 400 nm to 700 nm.

In addition, in the present invention, the organic black colorant as the coloring material that shields visible light denotes a material that absorbs visible light and allows transmission of at least a part of infrared light. Accordingly, in the present invention, the organic black colorant as the coloring material that shields visible light does not denote a black colorant that absorbs both visible light and infrared light, for example, carbon black or titanium black. It is preferable that the organic black colorant is a colorant having a maximum absorption wavelength in a wavelength range of 400 nm to 700 nm.

In the present invention, it is preferable that the coloring material that shields visible light is a material in which a ratio A1/B1 of a minimum value A1 of an absorbance in a wavelength range of 450 to 650 nm to a maximum value B1 of an absorbance in a wavelength range of 1400 to 1500 nm is 4.5 or higher.

The above-described spectral characteristics of the coloring material that shields visible light may be satisfied using one material alone or using a combination of a plurality of materials. For example, in the aspect (1), it is preferable that the spectral characteristics are satisfied using a combination of a plurality of chromatic colorants. In addition, in the aspect (2), the spectral characteristics may be satisfied using an organic black colorant. In addition, the spectral characteristics may be satisfied using a combination of an organic black colorant and a chromatic colorant.

(Chromatic Colorant)

In the present invention, it is preferable that the chromatic colorant is selected from a red colorant, a green colorant, a blue colorant, a yellow colorant, a violet colorant, or an orange colorant.

In the present invention, the chromatic colorant may be a pigment or a dye. It is preferable that the chromatic colorant is a pigment.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size+100) nm account for 70 mass % or higher, preferably, 80 mass % or higher in the pigment. The particle size distribution of the secondary particles can be measured using a scattering intensity distribution.

The pigment having an average particle size and a particle size distribution in the above-described ranges can be prepared by mixing and dispersing a pigment mixed solution while pulverizing the pigment mixed solution using a pulverizer such as a beads mill or a roll mill, the pigment mixed solution being obtained by mixing a commercially available pigment, another pigment (having an average particle size of secondary particles of more than 300 nm) which is optionally used, and a resin and an organic solvent which are preferably used with each other. The pigment obtained as described above is typically in the form of a pigment dispersion.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments); C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In a case where a combination of two or more chromatic colorants forms black, examples of the combination of chromatic colorants are as follows.

(1) An aspect in which the coloring material that shields visible light includes a yellow colorant, a blue colorant, a violet colorant, and a red colorant.

(2) An aspect in which the coloring material that shields visible light includes a yellow colorant, a blue colorant, and a red colorant.

(3) An aspect in which the coloring material that shields visible light includes a yellow colorant, a violet colorant, and a red colorant.

(4) An aspect in which the coloring material that shields visible light includes a yellow colorant and a violet colorant.

(5) An aspect in which the coloring material that shields visible light includes a green colorant, a blue colorant, a violet colorant, and a red colorant.

(6) An aspect in which the coloring material that shields visible light includes a violet colorant and an orange colorant.

(7) An aspect in which the coloring material that shields visible light includes a green colorant, a violet colorant, and a red colorant.

(8) An aspect in which the coloring material that shields visible light includes a green colorant and a red colorant.

Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

TABLE 1

| No. | Yellow Colorant | Green Colorant | Blue Colorant | Violet Colorant | Red Colorant | Orange Colorant |
|---|---|---|---|---|---|---|
| 1 | 0.1 to 0.4 |  | 0.1 to 0.6 | 0.01 to 0.3 | 0.1 to 0.6 |  |
| 2 | 0.1 to 0.4 |  | 0.1 to 0.6 |  | 0.2 to 0.7 |  |
| 3 | 0.1 to 0.6 |  |  | 0.1 to 0.6 | 0.1 to 0.6 |  |
| 4 | 0.2 to 0.8 |  |  | 0.2 to 0.8 |  |  |
| 5 |  | 0.1 to 0.4 | 0.1 to 0.4 | 0.1 to 0.4 | 0.1 to 0.4 |  |
| 6 |  |  |  | 0.2 to 0.6 |  | 0.4 to 0.8 |
| 7 |  | 0.1 to 0.5 |  | 0.2 to 0.7 | 0.1 to 0.4 |  |
| 8 |  | 0.5 to 0.8 |  |  | 0.2 to 0.5 |  |

(Organic Black Colorant)

In the present invention, examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

In the present invention, it is preferable that the bisbenzofuranone compound is one of the following compounds represented by the following formulae or a mixture thereof.

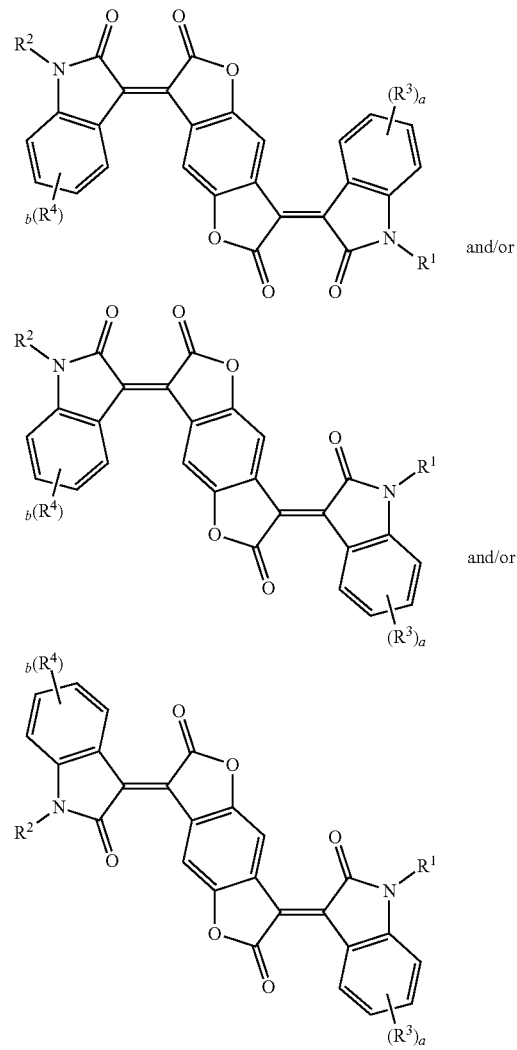

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, —$OR^{301}$, —$COR^{302}$, —$COOR^{303}$, —$OCOR^{304}$, —$NR^{305}R^{306}$, —$NHCOR^{307}$, —$CONR^{308}R^{309}$, —$NHCONR^{310}R^{311}$, —$NHCOOR^{312}$, —$SR^{313}$, —$SO_2R^{314}$, —$SO_2OR^{315}$, —$NHSO_2R^{316}$, or —$SO_2NR^{317}R^{318}$. $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

In the present invention, in a case where an organic black colorant is used as the coloring material that shields visible light, it is preferable that the organic black colorant is used in combination with a chromatic colorant. By using the organic black colorant in combination with a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination.

In addition, regarding a mixing ratio between the chromatic colorant and the organic black colorant, the amount of the chromatic colorant is preferably 10 to 200 parts by mass and more preferably 15 to 150 parts by mass with respect to 100 parts by mass of the organic black colorant.

In the present invention, the content of the pigment in the coloring material that shields visible light is preferably 95 mass % or higher, more preferably 97 mass % or higher, and still more preferably 99 mass % or higher with respect to the total mass of the coloring material that shields visible light.

The content of the coloring material that shields visible light in the composition according to the embodiment of the present invention is preferably 10 to 60 mass % with respect to the total solid content of the composition. The upper limit is preferably 50 mass % or lower and more preferably 45 mass % or lower. The lower limit is preferably 20 mass % or higher and more preferably 25 mass % or higher.

<<Infrared Absorber>>

The composition according to the embodiment of the present invention includes an infrared absorber. The infrared absorber used in the present invention includes a material that shields light in a wavelength range of longer than 1000 nm and 1200 nm or shorter.

(Material that Shields Light in Wavelength Range of Longer than 1000 nm and 1200 nm or Shorter)

Examples of the material that shields light in a wavelength range of longer than 1000 nm and 1200 nm or shorter include a material that absorbs light in a wavelength range of longer than 1000 nm and 1200 nm or shorter and a material that reflects light in a wavelength range of longer than 1000 nm and 1200 nm or shorter to shield the light. Examples of the material that absorbs light in a wavelength range of longer than 1000 nm and 1200 nm or shorter include a compound having an absorption maximum in a wavelength range of longer than 1000 nm and 1200 nm or shorter. The absorption maximum of the compound is present preferably in a wavelength range of 1030 to 1170 nm, more preferably in a wavelength range of 1050 to 1150 nm, and still more preferably in a wavelength range of 1070 to 1130 nm. In addition, in the compound, a ratio absorbance $A_{max}$/absorbance $A_{1400}$ of an absorbance $A_{max}$ at the absorption maximum to an absorbance $A_{1400}$ at a wavelength of 1400 nm is preferably 4.5 or higher, more preferably 10 or higher, and still more preferably 30 or higher. For example, the upper limit is preferably 90 or lower. According to this aspect, transmittance of infrared light having a wavelength of longer than 1400 nm can be improved.

Examples of the material that shields light in a wavelength range of longer than 1000 nm and 1200 nm or shorter include a diiminium compound, a squarylium compound, a croconium compound, a cyanine compound, a dithiol metal complex, lanthanum boride, flat metal particles, a quantum dot, and a rare earth-containing ceramic. From the viewpoints of visible transparency and infrared shielding properties, a diiminium compound is preferable.

As the diiminium compound used as the material that shields light in a wavelength range of longer than 1000 nm and 1200 nm or shorter, a compound represented by the following Formula (Im) is preferable.

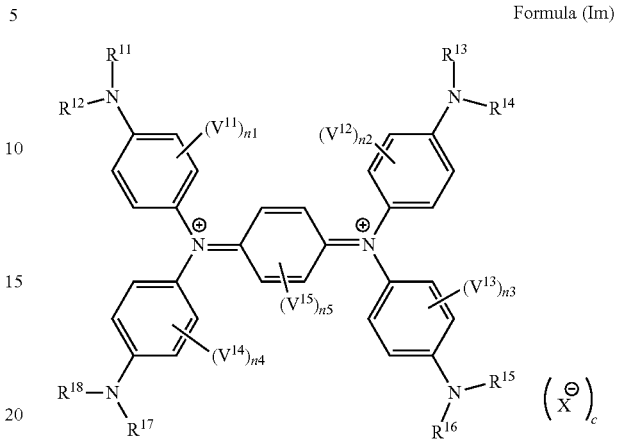

Formula (Im)

In the formula, $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, X represents a counter anion, c represents the number of X's for balancing charge, and n1 to n5 each independently 0 to 4.

$R^{11}$ to $R^{18}$ each independently represent an alkyl group or an aryl group. The number of carbon atoms in the alkyl group is preferably 1 to 20, more preferably 1 to 12, and still more preferably 1 to 8. The alkyl group may be linear, branched, or cyclic and is preferably linear or branched. The number of carbon atoms in the aryl group is preferably 6 to 25, more preferably 6 to 15, and still more preferably 6 to 12. The alkyl group and the aryl group may have a substituent or may be unsubstituted. Examples of the substituent include groups described below regarding a substituent T.

$V^{11}$ to $V^{15}$ each independently represent an alkyl group, an aryl group, a halogen atom, an alkoxy group, or a cyano group. Examples of the halogen atom include a fluorine atom, a chlorine atom, a bromine atom, and an iodine atom. The number of carbon atoms in the alkyl group is preferably 1 to 20, more preferably 1 to 12, and still more preferably 1 to 8. The alkyl group may be linear, branched, or cyclic and is preferably linear or branched and more preferably linear. The number of carbon atoms in the aryl group is preferably 6 to 25, more preferably 6 to 15, and still more preferably 6 to 12. The number of carbon atoms in the alkoxy group is preferably 1 to 20, more preferably 1 to 12, and still more preferably 1 to 8. The alkoxy group may be linear, branched, or cyclic and is preferably linear or branched and more preferably linear.

n1 to n5 each independently 0 to 4. n1 to n4 represents preferably 0 to 2 and more preferably 0 or 1. n5 represents preferably 0 to 3 and more preferably 0 to 2.

X represents a counter anion. Examples of the counter anion include an halide ion ($Cl^-$, $Br^-$, $I^-$), or a p-toluenesulfonate ion, an ethyl sulfate ion, $SbF_6^-$, $PF_6^-$, $BF_4^-$, $ClO_4^-$, a tris(halogenoalkylsufonyl)methide anion (for example, $(CF_3SO_2)_3C^-$), a di(halogenoalkylsulfonyl)imide anion (for example, $(CF_3SO_2)_2N^-$), and a tetracyanoborate anion.

c represents the number of X's for balancing charge, for example, preferably 2.

(Substituent T)

The substituent T includes an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a hydroxy group, a carboxyl group, a sulfo group, a phosphate group, a carboxylic acid amide group (preferably a group represented by —NHCOR$^{41}$; R$^{41}$ represents a hydrocarbon group or a heterocyclic group, and the hydrocarbon group and the heterocyclic group may further have a substituent; as the substituent, a halogen atom is preferable, and a fluorine atom is more preferable), a sulfonic acid amide group (preferably a group represented by —NHSO$_2$R$^{42}$; R$^{42}$ represents a hydrocarbon group or a heterocyclic group, and the hydrocarbon group and the heterocyclic group may further have a substituent; as the substituent, a halogen atom is preferable, and a fluorine atom is more preferable), an imide acid group (preferably a group represented by —SO$_2$NHSO$_2$R$^{43}$, —CONHSO$_2$R$^{44}$, —CONHCOR$^{45}$, or —SO$_2$NHCOR$^{46}$; R$^{43}$ to R$^{46}$ each independently represent a hydrocarbon group or a heterocyclic group; the hydrocarbon group and the heterocyclic group may further have a substituent), a mercapto group, a halogen atom, a cyano group, an alkylsulfino group, an arylsulfino group, a hydrazino group, an imino group, and a heteroaryl group (preferably having 1 to 30 carbon atoms).

In a case where the above-described groups can be further substituted, the groups may further have a substituent. Examples of the substituent include the groups described regarding the substituent T.

Specific examples of the diiminium compound include the following compounds. In the table, λmax represents an absorption maximum of the same compound. In addition, examples of a commercially available product of the diiminium compound include IRG-068 (manufactured by Nippon Kayaku Co., Ltd.).

TABLE 2

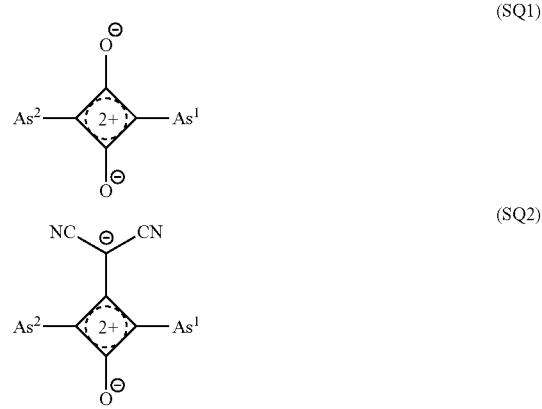

| | R | X | λ max (nm) |
|---|---|---|---|
| im-1 | n-C$_3$H$_7$ | SbF$_6^-$ | 1095 |
| im-2 | n-C$_4$H$_9$ | SbF$_6^-$ | 1100 |
| im-3 | n-C$_5$H$_{11}$ | SbF$_6^-$ | 1103 |
| im-4 | n-C$_6$H$_{13}$ | SbF$_6^-$ | 1102 |
| im-5 | n-C$_8$H$_{17}$ | SbF$_6^-$ | 1104 |
| im-6 | i-C$_4$H$_9$ | SbF$_6^-$ | 1108 |
| im-7 | i-C$_5$H$_{11}$ | SbF$_6^-$ | 1101 |
| im-8 | i-C$_6$H$_{13}$ | SbF$_6^-$ | 1098 |
| im-9 | n-C$_3$H$_6$CN | SbF$_6^-$ | 1061 |
| im-10 | n-C$_4$H$_9$ | ClO$_4^-$ | 1095 |
| im-11 | n-C$_4$H$_9$ | PF$_6^-$ | 1100 |
| im-12 | n-C$_4$H$_9$ | (CF$_3$SO$_2$)$_2$N$^-$ | 1102 |
| im-13 | i-C$_4$H$_9$ | (CF$_3$SO$_2$)$_2$N$^-$ | 1106 |

Examples of the squarylium compound used as the material that shields light in a wavelength range of longer than 1000 nm and 1200 nm or shorter include a compound represented by the following Formula (SQ1) or Formula (SQ2).

(SQ1)

(SQ2)

In the formulae, As$^1$ and As$^2$ each independently represent an aryl group, a heterocyclic group, or a group represented by Formula (As-1).

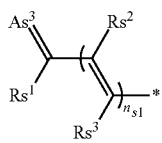

(As-1)

In the formula, represents a direct bond.

$Rs^1$ to $Rs^3$ each independently represent a hydrogen atom or an alkyl group.

$As^3$ represents a heterocyclic group.

$n_{s1}$ represents an integer of 0 or more.

$Rs^1$ and $Rs^2$ may be bonded to each other to form a ring.

$Rs^1$ and $As^3$ may be bonded to each other to form a ring.

$Rs^2$ and $Rs^3$ may be bonded to each other to form a ring.

In a case where $n_{s1}$ represents 2 or more, a plurality of $Rs^2$'s and a plurality of $Rs^3$'s may be the same as or different from each other, respectively.

The number of carbon atoms in the aryl group represented by $As^1$ and $As^2$ is preferably 6 to 48, more preferably 6 to 22, and still more preferably 6 to 12.

It is preferable that the heterocyclic group represented by $As^1$, $As^2$, and $As^3$ is a 5- or 6-membered heterocyclic group. In addition, the heterocyclic group is preferably a monocyclic or fused heterocyclic group composed of 2 to 8 rings, more preferably a monocycle or a monocyclic or fused heterocyclic group composed of 2 to 4 rings, still more preferably a monocyclic or fused heterocyclic group composed of 2 or 3 rings, and still more preferably a monocyclic or fused heterocyclic group composed of 2 rings. Examples of a heteroatom included in the ring of the heterocyclic group include a nitrogen atom, an oxygen atom, and a sulfur atom. Among these, a nitrogen atom or a sulfur atom is preferable. The number of heteroatoms constituting the ring of the heterocyclic group is preferably 1 to 3 and more preferably 1 or 2.

$Rs^1$ to $Rs^3$ in Formula (As-1) each independently represent a hydrogen atom or an alkyl group. The number of carbon atoms in the alkyl group represented by $Rs^1$ to $Rs^3$ is preferably 1 to 20, more preferably 1 to 15, and still more preferably 1 to 8. The alkyl group may be linear, branched, or cyclic and is preferably linear or branched. It is preferable that $Rs^1$ to $Rs^3$ represent a hydrogen atom.

$n_{s1}$ in Formula (As-1) represents an integer of 0 or more. $n_{s1}$ represents preferably an integer of 0 to 2, more preferably 0 or 1, and still more preferably 0.

In Formula (As-1), $Rs^1$ and $Rs^2$ may be bonded to each other to form a ring, $Rs^1$ and $As^3$ may be bonded to each other to form a ring, and $Rs^2$ and $Rs^3$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

In Formula (SQ1) and Formula (SQ2), it is preferable that the group represented by $As^1$ and $As^2$ has a substituent. Examples of the substituent include the above-described substituent T.

In Formula (SQ1) and Formula (SQ2), it is preferable that $As^1$ and $As^2$ each independently represent an aryl group or a heterocyclic group, or it is preferable that $As^1$ and $As^2$ each independently represent a group represented by Formula (As-1).

As shown below, cations in Formula (SQ1) are present without being localized.

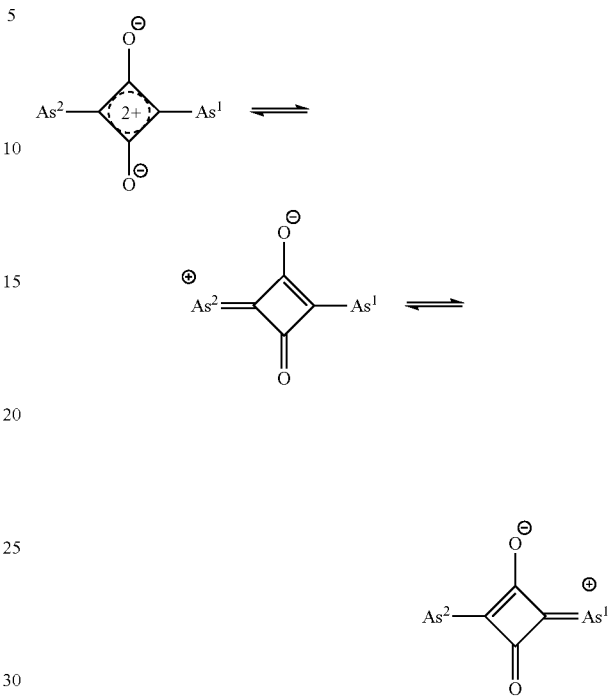

In addition, cations in Formula (SQ2) are present without being localized.

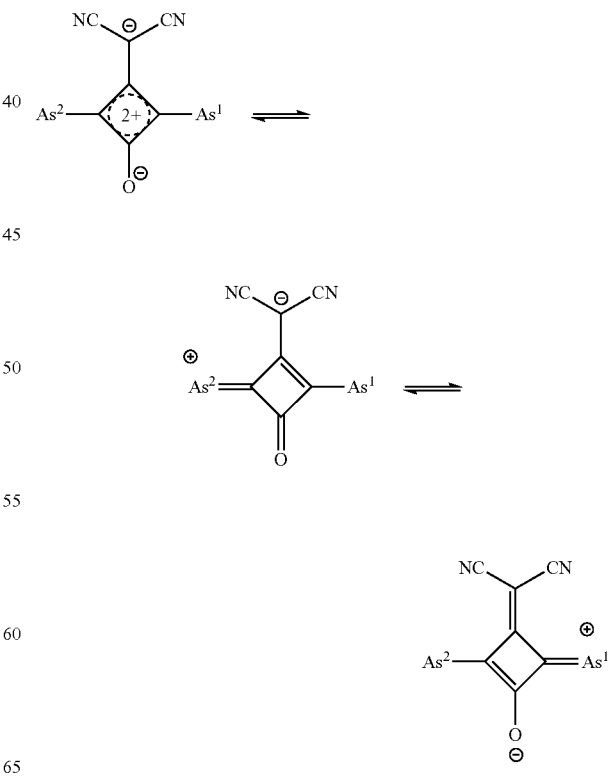

In addition, it is also preferable that the squarylium compound used as the material that shields light in a wavelength range of longer than 1000 nm and 1200 nm or shorter is a compound having two or more partial structures represented by Formula (SQ1a) or Formula (SQ2b) in one molecule.

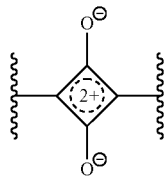

(SQ1a)

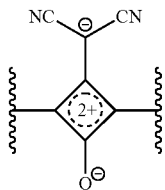

(SQ2a)

In the formula, a wave line represents a direct bond.

Specific examples of the squarylium compound include a compound having the following structure.

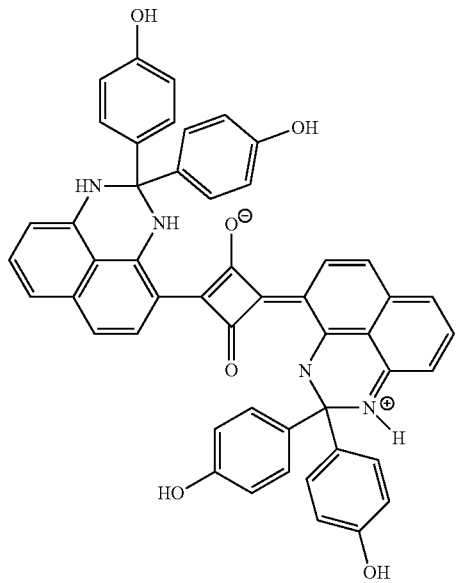

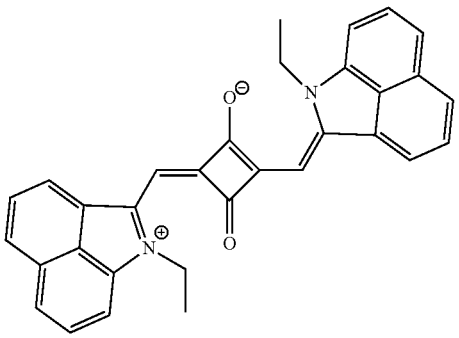

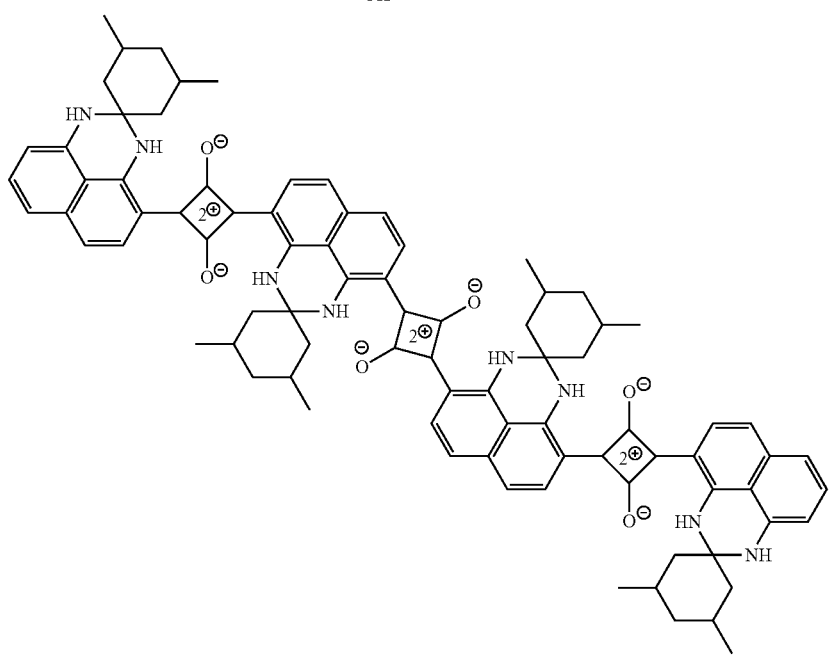

-continued

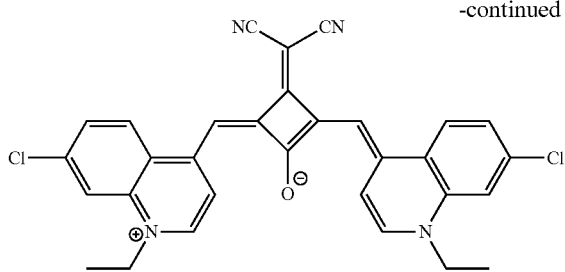

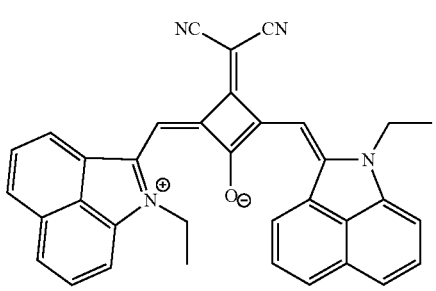

As the croconium compound used as the material that shields light in a wavelength range of longer than 1000 nm and 1200 nm or shorter, a compound represented by the following Formula (Cr1) is preferable.

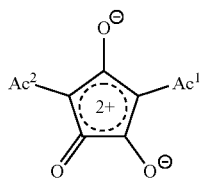
(Cr1)

In the formulae, $Ac^1$ and $Ac^2$ each independently represent an aryl group, a heterocyclic group, or a group represented by Formula (Ac-1).

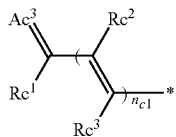
(Ac-1)

In the formula, * represents a direct bond.

$Rc^1$ to $Rc^3$ each independently represent a hydrogen atom or an alkyl group.

$Ac^3$ represents a heterocyclic group.

$n_{c1}$ represents an integer of 0 or more.

$Rc^1$ and $Rc^2$ may be bonded to each other to form a ring.
$Rc^1$ and $Ac^3$ may be bonded to each other to form a ring.
$Rc^2$ and $Rc^3$ may be bonded to each other to form a ring.

In a case where $n_{c1}$ represents 2 or more, a plurality of $Rc^2$'s and a plurality of $Rc^3$'s may be the same as or different from each other, respectively.

The number of carbon atoms in the aryl group represented by $Ac^1$ and $Ac^2$ is preferably 6 to 48, more preferably 6 to 22, and still more preferably 6 to 12.

It is preferable that the heterocyclic group represented by $Ac^1$, $Ac^2$, and $Ac^3$ is a 5- or 6-membered heterocyclic group.

In addition, the heterocycle is preferably a monocyclic or fused heterocyclic group composed of 2 to 8 rings, more preferably a monocycle or a monocyclic or fused heterocyclic group composed of 2 to 4 rings, still more preferably a monocyclic or fused heterocyclic group composed of 2 or 3 rings, and still more preferably a monocyclic or fused heterocyclic group composed of 2 rings. Examples of a heteroatom included in the ring of the heterocyclic group include a nitrogen atom, an oxygen atom, and a sulfur atom. Among these, a nitrogen atom or a sulfur atom is preferable. The number of heteroatoms constituting the ring of the heterocyclic group is preferably 1 to 3 and more preferably 1 or 2.

$Rc^1$ to $Rc^3$ in Formula (Ac-1) each independently represent a hydrogen atom or an alkyl group. The number of carbon atoms in the alkyl group represented by $Rc^1$ to $Rc^3$ is preferably 1 to 20, more preferably 1 to 15, and still more preferably 1 to 8. The alkyl group may be linear, branched, or cyclic and is preferably linear or branched. It is preferable that $Rc^1$ to $Rc^3$ represent a hydrogen atom.

$n_{c1}$ in Formula (Ac-1) represents an integer of 0 or more. $n_{c1}$ represents preferably an integer of 0 to 2, more preferably 0 or 1, and still more preferably 1.

In Formula (Ac-1), $Rc^1$ and $Rc^2$ may be bonded to each other to form a ring, $Rc^1$ and $Ac^3$ may be bonded to each other to form a ring, and $Rc^2$ and $Rc^3$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

In Formula (Cr1), it is preferable that the group represented by $Ac^1$ and $Ac^2$ has a substituent. Examples of the substituent include the above-described substituent T.

In Formula (Cr1), it is preferable that $Ac^1$ and $Ac^2$ each independently represent an aryl group or a heterocyclic group, or it is preferable that $Ac^1$ and $Ac^2$ each independently represent a group represented by Formula (Ac-1).

As shown below, cations in Formula (Cr1) are present without being localized.

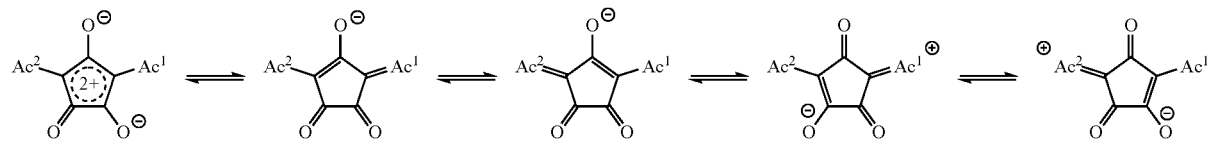

In addition, it is also preferable that the croconium compound used as the material that shields light in a wavelength range of longer than 1000 nm and 1200 nm or shorter is a compound having two or more partial structures represented by Formula (Cr1a) in one molecule.

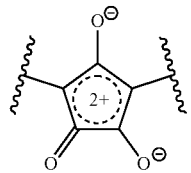
(Cr1a)

In the formula, a wave line represents a direct bond.

Specific examples of the croconium compound include compounds having the following structures.

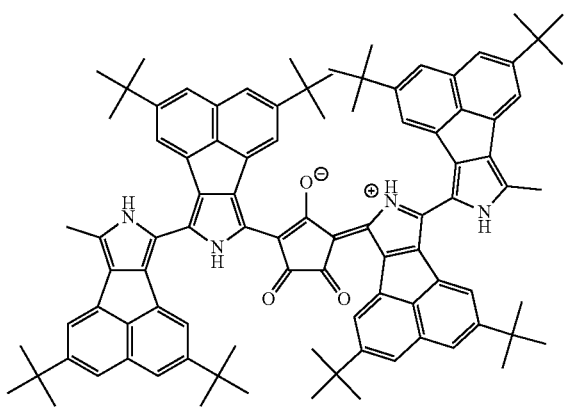

As the cyanine compound used as the material that shields light in a wavelength range of longer than 1000 nm and 1200 nm or shorter, a compound represented by the following Formula (Cy1) is preferable.

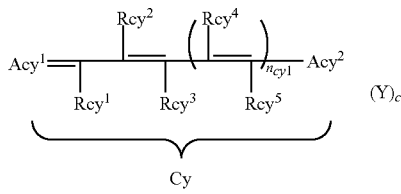
(Cy1)

$Rcy^1$ to $Rcy^5$ each independently represent a hydrogen atom or a substituent, and two of $Rcy^1$ to $Rcy^5$ may be bonded to each other to form a ring. $n_{cy1}$ represents an integer of 0 to 2, and in a case where $n_{cy1}$ represents 2, a plurality of $Rcy^4$'s and a plurality of $Rcy^5$'s may be the same as or different from each other, respectively. $Acy^1$ and $Acy^2$ each independently represent an aryl group or a heterocyclic group. In a case where a site represented by Cy in the formula is a cation site, Y represents a counter anion, and c represents the number of Y's for balancing charge. In a case where a site represented by Cy in the formula is an anion site, Y represents a counter cation, and c represents the number of Y's for balancing charge. In a case where charge of a site represented by Cy in the formula is neutralized in a molecule, c represents 0.

$Rcy^1$ to $Rcy^5$ each independently represent a hydrogen atom or a substituent. Examples of the substituent include the above-described substituent T. In Formula (Cy1), two of $Rcy^1$ to $Rcy^5$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

$n_{cy1}$ represents an integer of 0 to 2 and preferably 0 or 1. In a case where $n_{cy1}$ represents 2, a plurality of $Rcy^4$'s and a plurality of $Rcy^5$'s may be the same as or different from each other, respectively.

The number of carbon atoms in the aryl group represented by $Acy^1$ and $Acy^2$ is preferably 6 to 48, more preferably 6 to 22, and still more preferably 6 to 12. It is preferable that the heterocyclic group represented by $Acy^1$ and $Acy^2$ is a 5- or 6-membered heterocyclic group. In addition, the heterocycle is preferably a monocyclic or fused heterocyclic group composed of 2 to 8 rings, more preferably a monocycle or a monocyclic or fused heterocyclic group composed of 2 to 4 rings, still more preferably a monocyclic or fused heterocyclic group composed of 2 or 3 rings, and still more preferably a monocyclic or fused heterocyclic group composed of 2 rings. Examples of a heteroatom included in the ring of the heterocyclic group include a nitrogen atom, an oxygen atom, and a sulfur atom. Among these, an oxygen atom or a sulfur atom is preferable. The number of heteroatoms constituting the ring of the heterocyclic group is preferably 1 to 3 and more preferably 1 or 2. The group represented by $Acy^1$ and $Acy^2$ may have a substituent. Examples of the substituent include the above-described substituent T.

It is preferable that $Acy^1$ and $Acy^2$ each independently represent a heterocyclic group.

As the cyanine compound used as the material that shields light in a wavelength range of longer than 1000 nm and 1200 nm or shorter, a compound represented by the following Formula (Cy1a) is preferable.

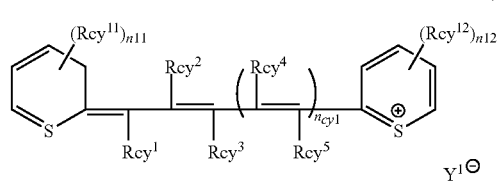
(Cy1a)

$Rcy^1$ to $Rcy^5$ each independently represent a hydrogen atom or a substituent, and two of $Rcy^1$ to $Rcy^5$ may be bonded to each other to form a ring.

$Rcy^{11}$ and $Rcy^{12}$ each independently represent a substituent.

$n_{cy1}$ represents an integer of 0 to 2, and in a case where $n_{cy1}$ represents 2, a plurality of $Rcy^4$'s and a plurality of $Rcy^5$'s may be the same as or different from each other, respectively.

n11 represents an integer of 0 to 4, in a case where n11 represents, a plurality of $Rcy^{11}$'s may be the same as or different from each other, and two of n11 $Rcy^{11}$'s may be bonded to each other to form a ring.

n12 represents an integer of 0 to 4, in a case where n12 represents, a plurality of $Rcy^{12}$'s may be the same as or different from each other, and two of n12 $Rcy^{12}$'s may be bonded to each other to form a ring.

$Y^1$ represents a counter anion.

Examples of the substituent represented by $Rcy^1$ to $Rcy^5$, $Rcy^{11}$, and $Rcy^{12}$ include the above-described substituent T. Examples of the counter anion represented by $Y^1$ include the counter anions described above regarding Formula (Cy1).

Specific examples of the cyanine compound include a compound having the following structure.

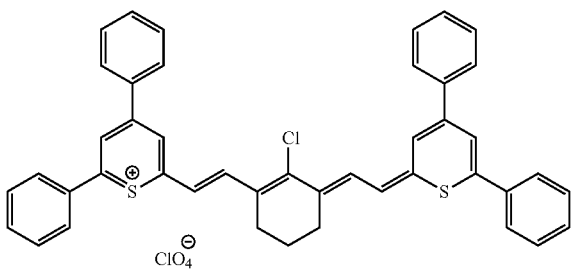

As the dithiol metal complex used as the material that shields light in a wavelength range of longer than 1000 nm and 1200 nm or shorter, a compound represented by the following Formula (Dt1) is preferable.

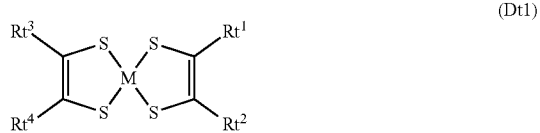

In the formula, $Rt^1$ to $Rt^4$ each independently represent an alkyl group, an aryl group, or a heteroaryl group. $Rt^1$ and $Rt^2$ may be bonded to each other to form a ring, and $Rt^3$ and $Rt^4$ may be bonded to each other to form a ring. M represents a metal atom. The alkyl group, the aryl group, and the heteroaryl group represented by $Rt^1$ to $Rt^4$ may have a substituent. Examples of the substituent include the above-described substituent T. It is preferable that $Rt^1$ to $Rt^4$ each independently represent an aryl group. Examples of the metal atom represented by M include Ni, Pt, Co, Fe, Cu, and Mo. Among these, Ni is preferable.

Specific examples of the dithiol metal complex include a compound having the following structure.

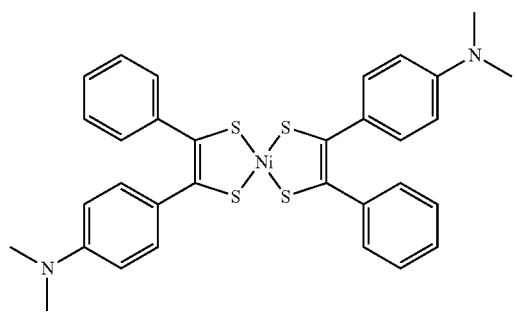

As a material of flat metal particles used as the material that shields light in a wavelength range of longer than 1000 nm and 1200 nm or shorter, silver, gold, aluminum, copper, rhodium, nickel, or platinum is preferable, and silver is more preferable. The flat metal particles are not particularly limited as long as they are particles having two principal planes and can be appropriately selected depending on the purposes. Examples of the shape of the flat metal particles include a hexagonal shape, a circular, and a triangular shape. In particular, from the viewpoint of increasing visible transmittance, a hexagonal shape or more polygonal shape is more preferable, and a hexagonal shape or a circular shape is still more preferable. The thickness of the flat metal particles is preferably 20 nm or less and more preferably 14 nm or less. An aspect ratio of the flat metal particles is not particularly limited and can be appropriately selected depending on the purposes. From the viewpoint of increasing a reflectivity of light in a wavelength range of longer than 1000 nm and 1200 nm or shorter, the aspect ratio is preferably 6 to 40 and more preferably 8 to 30. The above-described aspect ratio refers to a value obtained by dividing the average primary particle size (average equivalent circle diameter) of the flat metal particles by the average particle thickness of the flat metal particles. The average particle thickness corresponds to the distance between the principal planes of the flat metal particles and can be measured using an atomic force microscope (AFM). The details of the flat metal particles can be found in paragraphs "0017" to "0027" of JP2013-195563A, the content of which is incorporated herein by reference.

Examples of a material of the quantum dot used as the material that shields light in a wavelength range of longer than 1000 nm and 1200 nm or shorter include FeSi, Ge, InN, InAs, PbTe, PbSe, and InSb. The shape of the quantum dot is not particularly limited, and examples thereof include a spherical shape, a flaky shape, a plate shape, an oval spherical shape, and an unstructured shape.

Examples of the rare earth-containing ceramic used as the material that shields light in a wavelength range of longer than 1000 nm and 1200 nm or shorter include a ceramic include a rare earth atom such as Yb, Ho, or Tm. Specific examples include $Y_2O_3$ including Yb and Ho and $Y_2O_3$ including Yb and Tm.

In the composition according to the embodiment of the present invention, the content of the material that shields light in a wavelength range of longer than 1000 nm and 1200 nm or shorter is preferably 1 to 50 mass % with respect to the total solid content of the composition. The upper limit is preferably 45 mass % or lower, and more preferably 40 mass % or lower. The lower limit is preferably 2 mass % or higher and more preferably 3 mass % or higher.

In addition, in a case where the diiminium compound is used as the material that shields light in a wavelength range of longer than 1000 nm and 1200 nm or shorter, the content of the diiminium compound is preferably 2 to 40 mass % with respect to the total solid content of the composition. The upper limit is preferably 35 mass % or lower, and more preferably 30 mass % or lower. The lower limit is preferably 3 mass % or higher and more preferably 5 mass % or higher.

In addition, the total content of the diiminium compound as the material that shields light in a wavelength range of longer than 1000 nm and 1200 nm or shorter and the coloring material that shields visible light is preferably 10 to 90 mass % with respect to the total solid content of the composition. The upper limit is preferably 80 mass % or lower, and more preferably 70 mass % or lower. The lower limit is preferably 15 mass % or higher and more preferably 30 mass % or higher.

In addition, the content of the diiminium compound as the material that shields light in a wavelength range of longer than 1000 nm and 1200 nm or shorter is preferably 10 to 80 mass % with respect to the total content of the infrared absorber and the coloring material that shields visible light. The upper limit is preferably 70 mass % or lower, and more preferably 50 mass % or lower. The lower limit is preferably 12 mass % or higher and more preferably 18 mass % or higher.

(Compound Having Absorption Maximum in Wavelength Range of Longer than 900 Nm and 1000 nm or Shorter)

It is preferable that the infrared absorber according to the embodiment of the present invention further includes a compound having an absorption maximum in a wavelength range of longer than 900 nm and 1000 nm or shorter. By including the above-described compound the light shielding properties of infrared light having a wavelength of about 900 to 1000 nm can be improved. The absorption maximum of the compound is preferably in a wavelength range of 900 to 990 nm, more preferably in a wavelength range of 900 to 980 nm, and still more preferably in a wavelength range of 900 to 960 nm. In addition, in the compound, a ratio absorbance $A_{max}$/absorbance $A_{1020}$ of an absorbance $A_{max}$ at the absorption maximum to an absorbance $A_{1020}$ at a wavelength of 1020 nm is preferably 4.5 or higher, more preferably 10 or higher, and still more preferably 30 or higher. For example, the upper limit is preferably 90 or lower. According to this aspect, transmittance of infrared light having a wavelength of longer than 1000 nm can be improved.

As the compound having an absorption maximum in a wavelength range of longer than 900 nm and 1000 nm or shorter, at least one compound selected from a pyrrolopyrrole compound, a cyanine compound, a squarylium compound, a phthalocyanine compound, or a naphthalocyanine compound is preferable, and a pyrrolopyrrole compound is more preferable. Examples of the pyrrolopyrrole compound include a compound described in paragraphs "0010" to "0033" of WO2015/166873A. Examples of the cyanine compound include a compound having the following structure and a compound described in JP2014-095007A. Examples of the phthalocyanine compound include a compound described in JP2014-021421A. Examples of the squarylium compound include a compound described in JP2014-077066A and a compound described in JP2013-147595A. The contents of the above-described citations are incorporated herein by reference. In addition, as a commercially available product, FDN-005, FDN-006, or FDN-007 (phthalocyanine compound, all of which are manufactured by Yamada Chemical Co., Ltd.) can also be used.

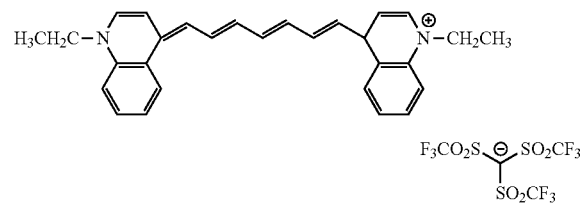

As the pyrrolopyrrole compound which is used as the compound having an absorption maximum in a wavelength range of longer than 900 nm and 1000 nm or shorter, a compound represented by the following Formula (1) is preferable. By using this compound, an effect of improving the heat resistance or light fastness of the obtained film can be expected.

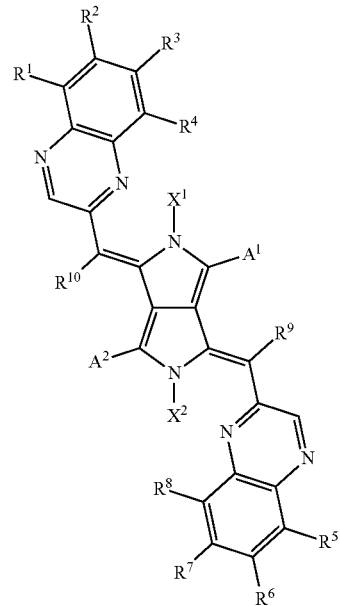

in Formula (1), $X^1$ and $X^2$ each independently represent a hydrogen atom or a substituent, $A^1$ and $A^2$ each independently represent a substituent, $R^1$ to $R^{10}$ each independently represent a hydrogen atom or a substituent, and at least one of $R^1$, . . . , or $R^8$ represents a substituent.

Examples of the substituent represented by $A^1$ and $A^2$ include an aryl group and a heteroaryl group. Among these, an aryl group is preferable.

As the aryl group, an aryl group having 6 to 20 carbon atoms is preferable, and an aryl group having 6 to 12 carbon atoms is more preferable. A phenyl group or a naphthyl group is still more preferable.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms in the heteroaryl group is preferably 3 to 30, more preferably 3 to 18, and still more preferably 3 to 12. Specific examples of the heteroaryl group include an imidazolyl group, a pyridyl group, a quinolyl group, a furyl group, a thienyl group, a benzoxazolyl group, a benzimidazolyl group, a benzothiazolyl group, a naphthothiazolyl group, a m-carbazolyl group, and an azepinyl group.

The aryl group and the heteroaryl group may have a substituent or may be unsubstituted. From the viewpoint of improving solubility in a solvent, it is preferable that the aryl group and the heteroaryl group have a substituent. Examples of the substituent include groups described above as the examples of the above-described substituent T and a group represented by -$L^{100}$-$X^{100}$.

The number of carbon atoms in the alkyl group is preferably 1 to 40, more preferably 1 to 30, and still more preferably 1 to 25. The alkyl group may be linear, branched, or cyclic and is preferably linear or branched and more preferably branched.

The number of carbon atoms in the alkenyl group is preferably 2 to 40. For example, the lower limit is more preferably 3 or more, still more preferably 5 or more, still more preferably 8 or more, and still more preferably 10 or more. The upper limit is more preferably 35 or less and still more preferably 30 or less. The alkenyl group may be linear, branched, or cyclic and is preferably linear or branched and more preferably branched.

The number of carbon atoms in the alkoxy group is preferably 1 to 40, more preferably 1 to 30, and still more preferably 1 to 25. The alkoxy group may be linear, branched, or cyclic and is preferably linear or branched and more preferably branched.

In -$L^{100}$-$X^{100}$, $L^{100}$ represents a single bond or a divalent linking group, and $X^{100}$ represents a reactive group. As the reactive group, one or more selected from the group consisting of a vinyl group, a (meth)allyl group, a (meth)acryloyl group, an epoxy group, an oxetanyl group, an isocyanate group, a hydroxy group, an amino group, a carboxy group, a thiol group, an alkoxysilyl group, a methylol group, a sulfo group, a styrene group, and a maleimide group are more preferable, and a vinyl group, a (meth)allyl group, a (meth)acryloyl group, a hydroxy group, or a carboxy group is more preferable. In addition, as the reactive group, a group represented by the following Formula (A-1), a group represented by the following Formula (A-2), or a group represented by the following Formula (A-3) is also preferable.

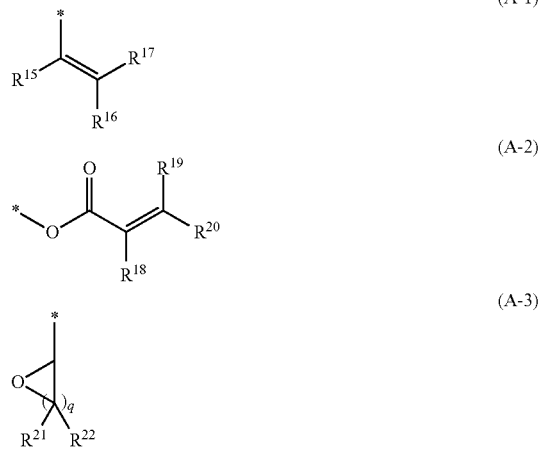

In Formula (A-1), $R^{15}$, $R^{16}$, and $R^{17}$ each independently represent a hydrogen atom, an alkyl group, an alkenyl group, an alkynyl group, or an aryl group.

The number of carbon atoms in the alkyl group is preferably 1 to 18, more preferably 1 to 10, still more preferably 1 to 6, more preferably 1 to 3, and most preferably 1. The alkyl group may be linear, branched, or cyclic.

The number of carbon atoms in the alkenyl group is preferably 2 to 18, more preferably 2 to 10, still more preferably 2 to 6, and still more preferably 2 or 3. The alkenyl group may be linear, branched, or cyclic.

The number of carbon atoms in the alkynyl group is preferably 2 to 18, more preferably 2 to 10, still more preferably 2 to 6, and still more preferably 2 or 3. The alkynyl group may be linear, branched, or cyclic.

The number of carbon atoms in the aryl group is preferably 6 to 12, more preferably 6 to 8, and still more preferably 6.

In Formula (A-1), $R^{13}$ represents preferably a hydrogen atom or an alkyl group having 1 to 18 carbon atoms and more preferably a hydrogen atom. In Formula (A-1), $R^{16}$ and $R^{17}$ each independently represent preferably a hydrogen atom or an alkyl group having 1 to 18 carbon atoms and more preferably a hydrogen atom.

In Formula (A-2), $R^{18}$, $R^{19}$, and $R^{20}$ each independently represent a hydrogen atom, a methyl group, a fluorine atom, or —$CF_3$. In Formula (A-2), it is preferable that $R^{18}$ represents a methyl group. In Formula (A-2), it is preferable that $R^{19}$ and $R^{20}$ represent a hydrogen atom.

In Formula (A-3), $R^{21}$ and $R^{22}$ each independently represent a hydrogen atom, a methyl group, a fluorine atom, or —$CF_3$ and preferably a hydrogen atom. In Formula (A-3), Q represents 1 or 2.

In a case where $L^{100}$ represents a divalent linking group, it is preferable that $L^{100}$ represents an alkylene group having 1 to 20 carbon atoms, an arylene group having 6 to 18 carbon atoms, a heteroarylene group having 3 to 18 carbon atoms, —O—, —S—, —CO—, —COO—, —OCO—, or a group of a combination thereof.

In Formula (1), $R^1$ to $R^{10}$ each independently represent a hydrogen atom or a substituent, and at least one of $R^1$, . . . , or $R^8$ represents a substituent. It is preferable that two to eight of $R^1$ to $R^8$ represent a substituent, it is more preferable that two to six of $R^1$ to $R^8$ represent a substituent, and it is still more preferable that two to four of $R^1$ to $R^8$ represent a substituent.

Examples of the substituent represented by $R^1$ to $R^8$ include the above-described substituent T and the above-described group represented by -$L^{100}$-$X^{100}$. A halogen atom, an alkyl group, an alkoxy group, an aryl group, or a cyano group is preferable, and a halogen atom is more preferable.

As the halogen atom, a fluorine atom, a chlorine atom, a bromine atom, or an iodine atom is preferable, and a chlorine atom is more preferable.

The number of carbon atoms in the alkyl group is preferably 1 to 40, more preferably 1 to 30, and still more preferably 1 to 25. The alkyl group may be linear, branched, or cyclic and is preferably linear or branched and more preferably linear.

The number of carbon atoms in the alkoxy group is preferably 1 to 40, more preferably 1 to 30, and still more preferably 1 to 25. The alkoxy group may be linear, branched, or cyclic and is preferably linear or branched and more preferably linear.

The number of carbon atoms in the aryl group is preferably 6 to 20 and more preferably 6 to 12.

Examples of the substituent represented by $R^9$ to $R^{19}$ include the above-described substituent T. It is preferable that the substituent represented by $R^9$ and $R^{10}$ is an electron-withdrawing group. As the electron-withdrawing group, for example, a substituent having a positive Hammett substituent constant sigma para value (σp value) is preferable. The σp value is preferably 0.20 or higher, more preferably 0.25 or higher, still more preferably 0.3 or higher, and still more preferably 0.35 or higher. The upper limit is not particularly limited, but preferably 0.80 or less. Specific examples of the substituent having a Hammett lap value of 0.2 or higher include a cyano group (σp value=0.66), a carboxy group (for example, —COOH; σp value=0.45), an alkoxycarbonyl group (—COOMe: σp value=0.45), an aryloxycarbonyl group (for example, —COOPh; σp value=0.44), a carbamoyl group (for example, —$CONH_2$; σp value=0.36), an alkylcarbonyl group (for example, —COMe; σp value=0.50), an arylcarbonyl group (for example, —COPh; σp value=0.43), an alkylsulfonyl group (for example, —$SO_2Me$; σp value=0.72), and an arylsulfonyl group (for example, —$SO_2Ph$; σp value=0.68). Here, Me represents a methyl group, and Ph represents a phenyl group. The details of the Hammett substituent constant σp value can be found in paragraphs "0017" and "0018" of JP2011-068731A, the content of which is incorporated herein by reference.

As the substituent represented by $R^9$ and $R^{10}$, a cyano group, a carboxy group, an acyl group, an alkoxycarbonyl group, an aryloxycarbonyl group, a carbamoyl group, an alkylcarbonyl group, an arylcarbonyl group, an alkylsulfonyl group, an arylsulfonyl group, is preferable, and a cyano group is more preferable.

In Formula (1), $X^1$ and $X^2$ each independently represent a hydrogen atom or a substituent.

Examples of the substituent represented by $X^1$ and $X^2$ include an alkyl group, an aryl group, a heteroaryl group, a metal atom, and a group represented by $-BR^{23}R^{24}$. Among these, a hydrogen atom or a group represented by $-BR^{23}R^{24}$ is preferable, and a group represented by $-BR^{23}R^{24}$ is more preferable.

The number of carbon atoms in the alkyl group is preferably 1 to 40, more preferably 1 to 30, and still more preferably 1 to 25. The alkyl group may be linear, branched, or cyclic and is preferably linear or branched and more preferably linear.

The number of carbon atoms in the aryl group is preferably 6 to 20 and more preferably 6 to 12.

The heteroaryl group may be monocyclic or polycyclic and is preferably monocyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms in the heteroaryl group is preferably 3 to 30, more preferably 3 to 18, still more preferably 3 to 12 and still more preferably 3 to 5.

As the metal atom, magnesium, aluminum, calcium, barium, zinc, tin, vanadium, iron, cobalt, nickel, copper, palladium, iridium, or platinum is preferable, and aluminum, zinc, vanadium, iron, copper, palladium, iridium, or platinum is more preferable.

In the group represented by $-BR^{23}R^{24}$, $R^{23}$ and $R^{24}$ each independently represent a substituent and may be bonded to each other to form a ring. Examples of the substituent represented by $R^{23}$ and $R^{24}$ include the above-described substituent T and a group represented by $-L^{100}-X^{100}$. Among these, a halogen atom, an alkyl group, an aryl group, a heteroaryl group, or a group represented by $-L^{100}-X^{100}$ is preferable.

As the halogen atom, a fluorine atom, a chlorine atom, a bromine atom, or an iodine atom is preferable, and a fluorine atom is more preferable.

The alkyl group, the aryl group, and the heteroaryl group have the same definitions and the same preferable ranges as the alkyl group, the aryl group, and the heteroaryl group described above regarding $X^1$ and $X^2$.

$R^{23}$ and $R^{24}$ may be bonded to each other to form a ring. Examples of a ring which is formed by $R^{23}$ and $R^{24}$ being bonded to each other include the following structure.

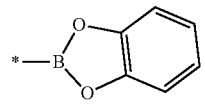

Examples of the compound represented by Formula (1) include compounds described below, compounds described in paragraphs "0026" to "0033" of WO2015/166873A, the content of which is incorporated herein by reference.

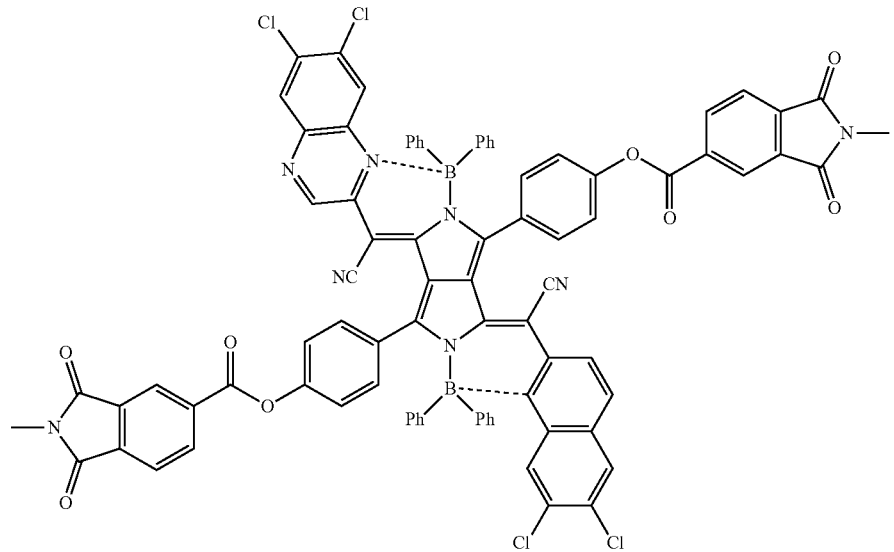

In the composition according to the embodiment of the present invention, the content of the compound having an absorption maximum in a wavelength range of longer than 900 μm and 1000 nm or shorter is preferably 1 to 40 mass % with respect to the total solid content of the composition. The upper limit is preferably 30 mass % or lower, and more preferably 20 mass % or lower. The lower limit is preferably 3 mass % or higher and more preferably 5 mass % or higher.

In addition, the total content of the compound having an absorption maximum in a wavelength range of longer than 900 nm and 1000 nm or shorter and the coloring material that shields visible light is preferably 10 to 60 mass % with respect to the total solid content of the composition. The upper limit is preferably 55 mass % or lower, and more preferably 50 mass % or lower. The lower limit is preferably 20 mass % or higher and more preferably 25 mass % or higher.

In addition, the content of the compound having an absorption maximum in a wavelength range of longer than 900 nm and 1000 nm or shorter is preferably 5 to 40 mass % with respect to the total content of the infrared absorber and the coloring material that shields visible light. The upper limit is preferably 30 mass % or lower and more preferably 25 mass % or lower. The lower limit is preferably 10 mass % or higher and more preferably 15 mass % or higher.

(Compound Having Absorption Maximum in Wavelength Range of Longer than 700 nm and 900 nm or Shorter)

It is preferable that the infrared absorber according to the embodiment of the present invention further includes a compound having an absorption maximum in a wavelength range of longer than 700 nm and 900 nm or shorter. According to this aspect, light in a visible range can be more effectively shielded, and a film capable of selectively allowing transmission of infrared light having a wavelength of longer than 1400 run in a state where noise generated from visible light is small can be easily manufactured. The absorption maximum of the compound is preferably in a wavelength range of 750 to 900 nm and more preferably in a wavelength range of 800 to 880 nm.

Examples of the compound having an absorption maximum in a wavelength range of longer than 700 nm and 900 nm or shorter include a pyrrolopyrrole compound, a cyanine compound, a squarylium compound, a phthalocyanine compound, a naphthalocyanine compound, a merocyanine compound, a croconium compound, and an oxonol compound. Among these, a pyrrolopyrrole compound, a cyanine compound, or a squarylium compound is preferable.

Examples of the phthalocyanine compound include a compound described in paragraph "0093" of JP2012-077153A, oxytitaniumphthalocyanine described in JP2006-343631A, a compound described in paragraphs "0013" to "0029" of JP2013-195480A, vanadium phthalocyanine described in JP6081771B, the contents of which are incorporated herein by reference. As the phthalocyanine compound, for example, a compound having the following structure can also be used. Examples of the naphthalocyanine compound include a compound described in paragraph "0093" of JP2012-077153A, the content of which is incorporated herein by reference.

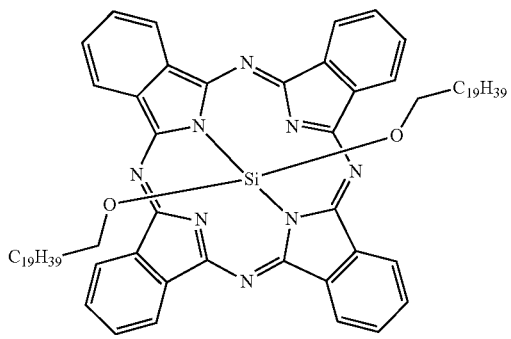

As the pyrrolopyrrole compound, a compound represented by Formula (PP) is preferable.

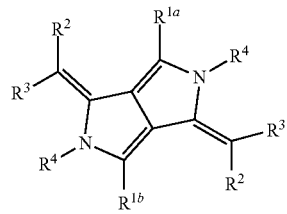

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from $R^{1a}$, $R^{1b}$, or $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

In Formula (PP), $R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ and $R^{1b}$ may have a substituent or may be unsubstituted. Examples of the substituent include the above-described substituent T.

In Formula (PP), $R^2$ and $R^3$ each independently represent a hydrogen atom or a substituent. Examples of the substituent include the above-described substituent T. It is preferable that at least one of $R^2$ or $R^3$ represents an electron-withdrawing group, it is more preferable that at least one of $R^2$ or $R^3$ represents a cyano group, a carboxy group, an acyl group, an alkoxycarbonyl group, an aryloxycarbonyl group, a carbamoyl group, an alkylcarbonyl group, an arylcarbonyl group, an alkylsulfonyl group, or an arylsulfonyl group, and it is preferable that at least one of $R^2$ or $R^3$ represents a cyano group.

In Formula (PP), it is preferable that $R^2$ represents an electron-withdrawing group (preferably a cyano group) and $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two $R^2$'s in Formula (PP) may be the same as or different from each other. In addition, two $R^3$'s in Formula (PP) may be the same as or different from each other.

In Formula (PP), $R^4$ represents preferably a hydrogen atom, an alkyl group, an aryl group, a heteroaryl group, or a group represented by —$BR^{4A}R^{4B}$, more preferably a hydrogen atom, an alkyl group, an aryl group, or a group represented by —$BR^{4A}R^{4B}$, and still more preferably a group represented by —$BR^{4A}R^{4B}$. As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two $R^4$'s in Formula (PP) may be the same as or different from each other. $R^{4A}$ and $R^{4B}$ may be bonded to each other to form a ring.

Specific examples of the compound represented by Formula (PP) include the following compounds. In the following structural formulae, Me represents a methyl group, and Ph represents a phenyl group. In addition, examples of the pyrrolopyrrole compound include a compound described in paragraphs "0016" to "0058" of JP2009-263614A and a compound described in paragraphs "0037" to "0052" of JP2011-068731A, the contents of which are incorporated herein by reference.

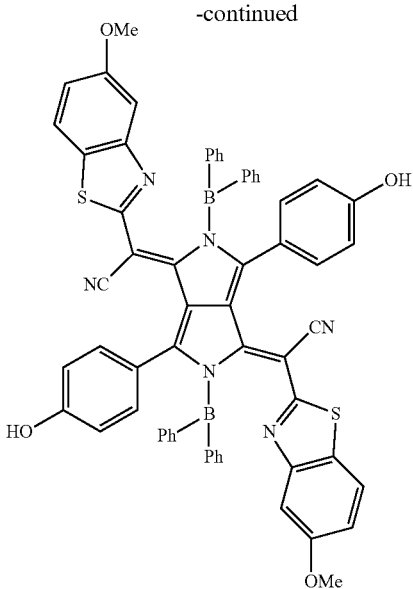

-continued

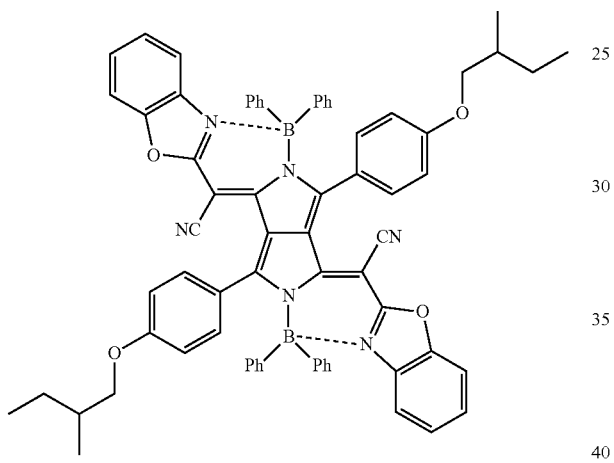

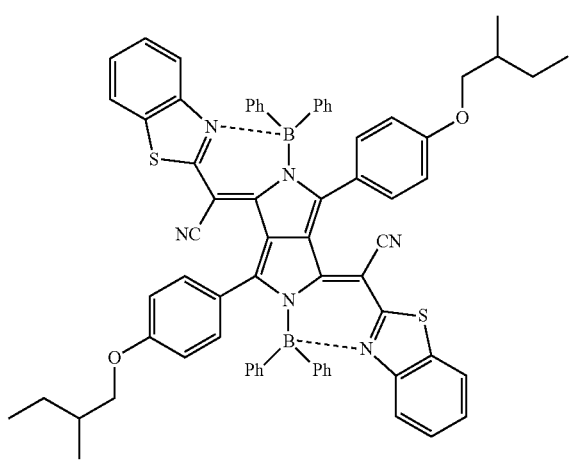

As the squarylium compound, a compound represented by the following Formula (SQ) is preferable.

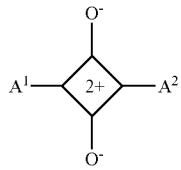

(SQ)

In Formula (SQ), $A^1$ and $A^2$ each independently represent an aryl group, a heteroaryl group, or a group represented by the following Formula (A-1).

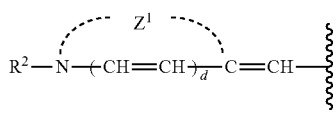

(A-1)

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond. The details of Formula (SQ) can be found in paragraphs "0020" to "0049" of JP2011-208101A, paragraphs "0043" to "0062" of JP6065169B, and paragraphs "0024" to "0040" of WO2016/181987A, the contents of which are incorporated herein by reference.

As shown below, cations in Formula (SQ) are present without being localized.

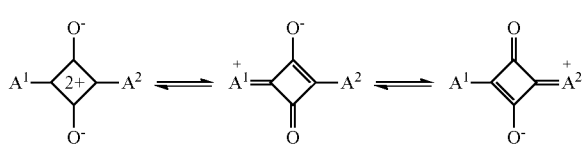

It is preferable that the squarylium compound is a compound represented by the following Formula (SQ-1).

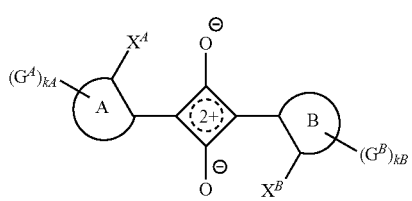 (SQ-1)

A Ring A and a ring B each independently represent an aromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represents integers representing the maximum numbers of $G^A$'s and $G^B$'s which may be substituted in the ring A and the ring B, respectively.

$X^A$ and $G^A$, $X^B$ and $G^B$, or $X^A$ and $X^B$ may be bonded to each other to form a ring, and in a case where a plurality of $G^A$'s and a plurality of $G^B$'s are present, $G^A$'s and $G^B$'s may be bonded to each other to form ring structures, respectively.

Examples of the substituent represented by $G^A$ and $G^B$ include the above-described substituent T.

As the substituent represented by $X^A$ and $X^B$, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable. R$^{X1}$ and R$^{X2}$ each independently represent a hydrogen atom or a substituent. Examples of the substituent X$^A$ and X$^B$ include an alkyl group, an aryl group, and a heteroaryl group. Among these, an alkyl group is preferable.

The ring A and the ring B each independently represent an aromatic ring. The aromatic ring may be a monocycle or a fused ring. Specific examples of the aromatic ring include a benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable. The aromatic ring may be unsubstituted or may have a substituent. Examples of the substituent include the above-described substituent T.

$X^A$ and $G^A$, $X^B$ and $G^B$, or $X^A$ and $X^B$ may be bonded to each other to form a ring, and in a case where a plurality of $G^A$'s and a plurality of $G^B$'s are present, $G^A$'s and $G^B$'s may be bonded to each other to form rings, respectively. It is preferable that the ring is a 5- or 6-membered ring. The ring may be a monocycle or a fused ring. In a case where $X^A$ and $G^A$, $X^B$ and $G^B$, $X^A$ and $X^B$, $G^A$'s, or $G^B$'s are bonded to each other to form a ring, the groups may be directly bonded to each other to form a ring, or may be bonded to each other through a divalent linking group selected from an alkylene group, —CO—, —O—, —NH—, —BR—, or a combination thereof to form a ring. R represents a hydrogen atom or a substituent. Examples of the substituent include the substituent T. Among these, an alkyl group or an aryl group is preferable.

kA represents an integer of 0 to $n_A$, kB represents an integer of 0 to $n_B$, $n_A$ represents an integer representing the maximum number of $G^A$'s which may be substituted in the ring A, and $n_B$ represents an integer representing the maximum number of $G^B$'s which may be substituted in the ring B. kA and kB each independently represent preferably an integer of 0 to 4, more preferably 0 to 2, and still more preferably 0 or 1.

It is also preferable that the squarylium compound is a compound represented by the following Formula (SQ-10), Formula (SQ-11), or Formula (SQ-12).

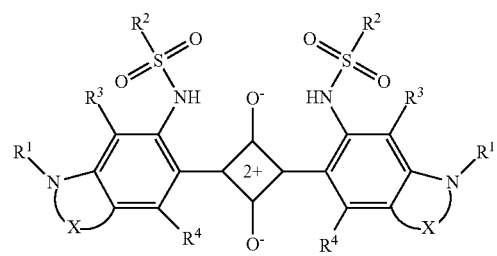

Formula (SQ-10)

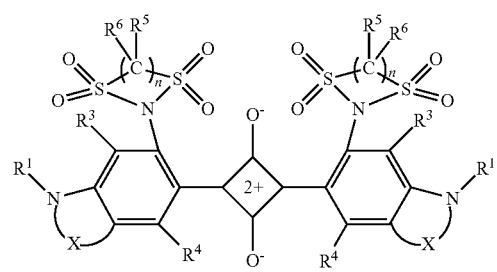

Formula (SQ-11)

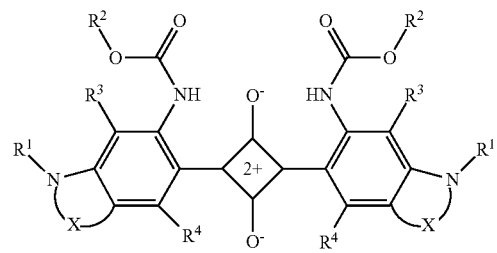

Formula (SQ-12)

In Formulae (SQ-10) to (SQ-12), X's each independently represent a divalent organic group represented by Formula (1) or Formula (2) in which one or more hydrogen atoms may be substituted with a halogen atom, an alkyl group having 1 to 12 carbon atoms, or an alkoxy group.

—(CH$_2$)$_{n1}$— (1)

In Formula (1), n1 represents 2 or 3.

—(CH$_2$)$_{n2}$—O—(CH$_2$)$_{n3}$— (2)

In Formula (2), n2 and n3 each independently represent an integer of 0 to 2, and n2+n3 represents 1 or 2.

$R^1$ and $R^2$ each independently represent an alkyl group or an aryl group. The alkyl group and the aryl group may have a substituent or may be unsubstituted. Examples of the substituent include a substituent T.

$R^3$ to $R^6$ each independently represent a hydrogen atom, a halogen atom, an alkyl group, or an alkoxy group.

n represents 2 or 3.

Examples of the squarylium compound include a compound having the following structure. In addition, examples of the squarylium compound include a compound described in paragraphs "0044" to "0049" of JP2011-208101A, a compound described in paragraphs "0060" and "0061" of JP6065169B, a compound described in paragraph "0040" of WO2016/181987A, a compound described in WO2013/133099A, a compound described in WO2014/088063A, a compound described in JP2014-126642A, a compound described in JP2016-146619A, a compound described in JP2015-176046A, a compound described in JP2017-025311A, a compound described in WO2016/154782A, a compound described in JP5884953B, a compound described in JP6036689B, a compound described in JP5810604B, and a compound described in JP2017-068120A, the contents of which are incorporated herein by reference.

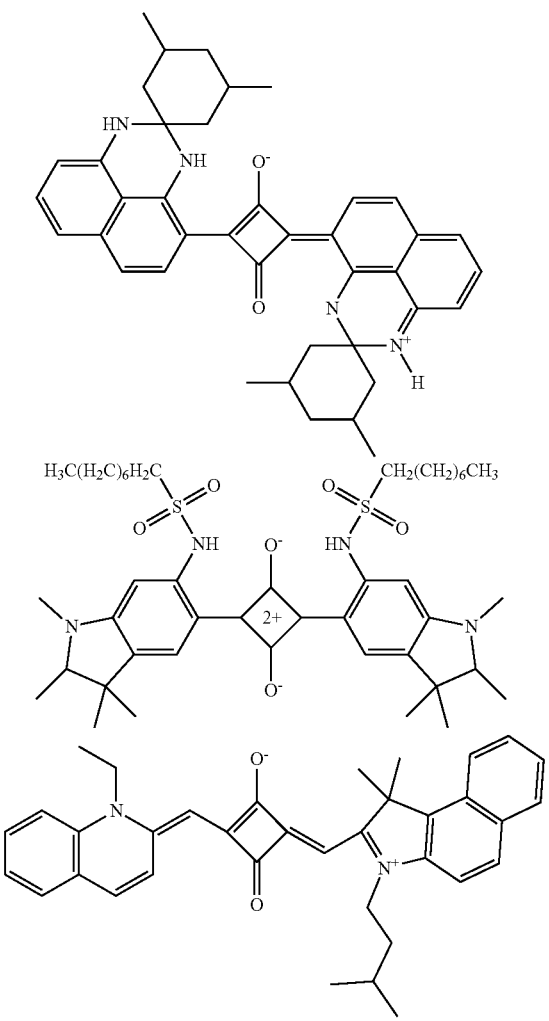

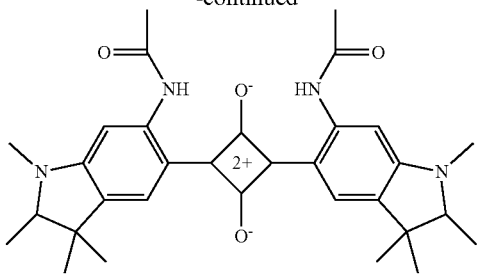

As the cyanine compound, a compound represented by Formula (C) is preferable.

Formula (C)

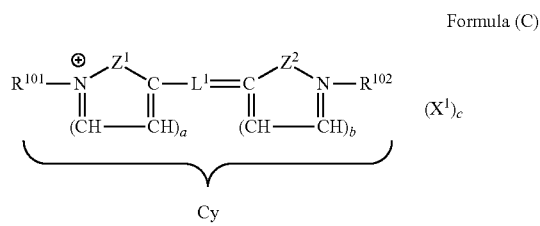

In the formula, $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In addition, examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, a compound described in JP2008-088426A, and a compound described in JP2017-031394A, the contents of which are incorporated herein by reference.

In the present invention, as the compound having an absorption maximum in a wavelength range of longer than 700 nm and 900 nm or shorter, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.);

Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

In the composition according to the embodiment of the present invention, the content of the compound having an absorption maximum in a wavelength range of longer than 700 nm and 900 nm or shorter is preferably 0.5 to 30 mass % with respect to the total solid content of the composition. The upper limit is preferably 20 mass % or lower, and more preferably 15 mass % or lower. The lower limit is preferably 1 mass % or higher and more preferably 2 mass % or higher.

In addition, the total content of the compound having an absorption maximum in a wavelength range of longer than 700 nm and 900 nm or shorter and the compound having an absorption maximum in a wavelength range of longer than 900 nm and 1000 nm or shorter is preferably 1 to 30 mass % with respect to the total solid content of the composition. The upper limit is preferably 25 mass % or lower and more preferably 20 mass % or lower. The lower limit is preferably 3 mass % or higher and more preferably 5 mass % or higher.

In addition, the total content of the compound having an absorption maximum in a wavelength range of longer than 700 nm and 900 nm or shorter and the coloring material that shields visible light is preferably 15 to 45 mass % with respect to the total solid content of the composition. The upper limit is preferably 40 mass % or lower, and more preferably 35 mass % or lower. The lower limit is preferably 18 mass % or higher and more preferably 20 mass % or higher.

In addition, the content of the compound having an absorption maximum in a wavelength range of longer than 700 nm and 900 nm or shorter is preferably 1 to 40 mass % with respect to the total content of the infrared absorber and the coloring material that shields visible light. The upper limit is preferably 38 mass % or lower, and more preferably 35 mass % or lower. The lower limit is preferably 3 mass % or higher and more preferably 5 mass % or higher.

<<Curable Compound>>

The composition according to the embodiment of the present invention includes a curable compound. Examples of the curable compound include a polymerizable compound, a resin, and a natural polymer such as gelatin or cellulose. As the gelatin, any one of an acid-treated gelatin and an alkali-treated gelatin (for example, a lime-treated gelatin) can be preferably used in terms of a synthesis method thereof. The molecular weight of the gelatin is preferably 10000 to 1000000. In addition, a modified gelatin which is modified using an amino group or a carboxyl group of a gelatin can also be used (for example, phthalated gelatin). As the gelatin, for example, inert gelatin (for example, NITTA GELATIN 750) or phthalated gelatin (for example, NITTA GELATIN 801) can be used. The resin may be a non-polymerizable resin (resin not having a polymerizable group) or a polymerizable resin (resin having a polymerizable group). Examples of the polymerizable group include a group having an ethylenically unsaturated bond, an epoxy group, a methylol group, and an alkoxymethyl group. Examples of the group having an ethylenically unsaturated bond include a vinyl group, a (meth)allyl group, and a (meth)acryloyl group. The polymerizable resin (resin having a polymerizable group) may be a polymerizable compound.

In the present invention, it is preferable that a compound including at least a resin is used as the curable compound, it is more preferable that a monomer type polymerizable compound including a resin is used as the curable compound, and it is still more preferable that a monomer type polymerizable compound including a resin and a group having an ethylenically unsaturated bond is used as the curable compound.

In the composition according to the embodiment of the present invention, the content of the curable compound is preferably 0.1 to 80 mass % with respect to the total solid content of the composition according to the embodiment of the present invention. The lower limit is preferably 0.5 mass % or higher, more preferably 1 mass % or higher, and still more preferably 5 mass % or higher. The upper limit is preferably 70 mass % or lower, more preferably 60 mass % or lower, still more preferably 50 mass % or lower, still more preferably 40 mass % or lower, and still more preferably 30 mass % or lower. As the curable compound, one kind may be used alone, or two or more kinds may be used. In a case where two or more surfactants are used in combination, it is preferable that the total content of the two or more surfactants is in the above-described range.

(Polymerizable Compound)

Examples of the polymerizable compound include a compound which has a group having an ethylenically unsaturated bond, a compound having an epoxy group, a compound having a methylol group, and a compound having an alkoxymethyl group. The polymerizable compound may be a monomer or a resin. The monomer type polymerizable compound that has a group having an ethylenically unsaturated bond can be preferably used as a radically polymerizable compound. In addition, the compound having an epoxy group, the compound having a methylol group, and the compound having an alkoxymethyl group can be preferably used as a cationically polymerizable compound.

The molecular weight of the monomer type polymerizable compound is preferably lower than 2000, more preferably 100 or higher and lower than 2000, and still more preferably 200 or higher and lower than 2000. The upper limit is, for example, preferably 1500 or lower. The weight-average molecular weight (Mw) of the resin type polymerizable compound is preferably 2000 to 2000000. The upper limit is preferably 1,000,000 or lower and more preferably 500,000 or lower. The lower limit is preferably 3,000 or higher and more preferably 5,000 or higher.

Examples of the resin type polymerizable compound include an epoxy resin and a resin which includes a repeating unit having a polymerizable group. Examples of the repeating unit having a polymerizable group include the following (A2-1) to (A2-4).

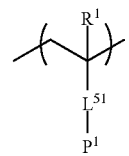

(A2-1)

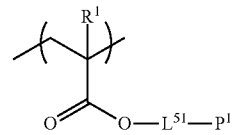

(A2-2)

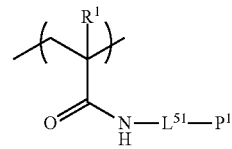

(A2-3)

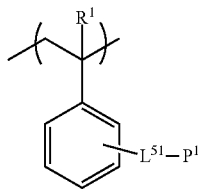

(A2-4)

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —SO$_2$—, —NR$^{10}$— (R$^{10}$ represents a hydrogen atom or an alkyl group and preferably a hydrogen atom), and a group including a combination thereof. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a polymerizable group. Examples of the polymerizable group include a group having an ethylenically unsaturated bond, an epoxy group, a methylol group, and an alkoxymethyl group.

The compound which has a group having an ethylenically unsaturated bond is preferably a (meth)acrylate compound having 3 to 15 functional groups and more preferably a (meth)acrylate compound having 3 to 6 functional groups. Examples of the compound which includes a group having an ethylenically unsaturated bond can be found in paragraphs "0033" and "0034" of JP2013-253224A, the content of which is incorporated herein by reference. As the compound which has a group having an ethylenically unsaturated bond, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the contents of which are incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For example, RP-1040 (manufactured by Nippon Kayaku Co., Ltd.) is used. In addition, ARONIX M-350 or TO-2349 (manufactured by Toagosei Co., Ltd.) can also be used.

The compound which includes a group having an ethylenically unsaturated bond may further have an acid group such as a carboxyl group, a sulfo group, or a phosphate group. Examples of a commercially available product include ARONIX series (for example, M-305, M-510, or M-520, manufactured by Toagosei Co., Ltd.).

In addition, a compound having a caprolactone structure is also preferable as the compound which includes a group having an ethylenically unsaturated bond. Examples of the compound having a caprolactone structure can be found in paragraphs "0042" to "0045" of JP2013-253224A, the content of which is incorporated herein by reference. As the compound having a caprolactone structure, for example, KAYARAD DPCA series (manufactured by Nippon Kayaku Co., Ltd.) is commercially available, and examples thereof include DPCA-20, DPCA-30, DPCA-60, and DPCA-120.

As the compound which has a group having an ethylenically unsaturated bond, a compound which has a group having an ethylenically unsaturated bond and an alkyleneoxy group can also be used. As the compound which has a group having an ethylenically unsaturated bond and an alkyleneoxy group, a compound which has a group having an ethylenically unsaturated bond, an ethyleneoxy group, and/or a propyleneoxy group is preferable, a compound which has a group having an ethylenically unsaturated bond and an ethyleneoxy group is more preferable, and a trifunctional to hexafunctional (meth)acrylate compound having 4 to 20 ethyleneoxy groups is still more preferable. Examples of a commercially available product of the compound which has a group having an ethylenically unsaturated bond and an alkyleneoxy group include SR-494 (manufactured by Sartomer) which is a tetrafunctional (meth)acrylate having four ethyleneoxy groups, and KAYARAD TPA-330 (manufactured by Nippon Kayaku Co., Ltd.) which is a trifunctional (meth)acrylate having three isobutyleneoxy groups.

As the compound which has a group having an ethylenically unsaturated bond, a urethane acrylate described in JP1973-41708B (JP-S48-41708B), JP1976-037193A (JP-S51-037193A), JP1990-32293B (JP-H2-32293B), or JP1990-16765B (JP-H2-16765B), or a urethane compound having an ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

In addition, as the compound which has a group having an ethylenically unsaturated bond, a compound described in JP2017-048367A, JP6057891B, or JP6031807B can also be used.

In addition, as the compound that includes the group having an ethylenically unsaturated bond, for example, 8UH-1006 or 8UH-1012 (manufactured by Taisei Fine Chemical Co., Ltd.) or LIGHT ACRYLATE POB-A0 (manufactured by Kyoeisha Chemical Co., Ltd.) is also preferably used.

In a case where the composition according to the embodiment of the present invention includes the compound which includes a group having an ethylenically unsaturated bond, the content of the compound which includes a group having an ethylenically unsaturated bond is preferably 0.1 mass % or higher, more preferably 0.5 mass % or higher, still more preferably 1 mass % or higher, and still more preferably 5 mass % or higher with respect to the total solid content of the composition. The upper limit is preferably 80 mass % or lower, more preferably 70 mass % or lower, still more preferably 60 mass % or lower, still more preferably 50 mass % or lower, still more preferably 40 mass % or lower, and still more preferably 30 mass % or lower.

Examples of the compound having an epoxy group (hereinafter, also referred to as "epoxy compound") include a monofunctional or polyfunctional glycidyl ether compound, and a polyfunctional aliphatic glycidyl ether compound. In addition, as the epoxy compound, a compound having an alicyclic epoxy group can also be used.

Examples of the epoxy compound include a compound having one or more epoxy groups in one molecule. It is preferable that the epoxy compound is a compound having 1 to 100 epoxy groups in one molecule. The upper limit of the number of epoxy groups is, for example, 10 or less or 5 or less. The lower limit of the number of epoxy groups is preferably 2 or more.

The epoxy compound may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the epoxy compound is preferably 2000 to 100000. The upper limit of the weight-average molecular weight is preferably 10000 or lower, more preferably 5000 or lower, and still more preferably 3000 or lower.

Examples of a commercially available product of the epoxy compound include EHPE 3150 (manufactured by Daicel Corporation), EPICLON N-695 (manufactured by DIC Corporation), ADEKA GLYCILOL ED-505 (manufactured by Adeka Corporation, an epoxy group-containing monomer), and MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer). In addition, as the epoxy compound, compounds described in paragraphs "0034" to "0036" of JP2013-011869A, paragraphs "0147" to "0156" of JP2014-043556A, and paragraphs "0085" to "0092" of JP2014-089408A can also be used. The contents of this specification are incorporated herein by reference.

In a case where the composition according to the embodiment of the present invention includes the epoxy compound, the content of the epoxy compound is preferably 0.1 mass % or higher, more preferably 0.5 mass % or higher, still more preferably 1 mass % or higher, and still more preferably 5 mass % or higher with respect to the total solid content of the composition. The upper limit is preferably 80 mass % or lower, more preferably 70 mass % or lower, still more preferably 60 mass % or lower, still more preferably 50 mass % or lower, still more preferably 40 mass % or lower, and still more preferably 30 mass % or lower.

Examples of the compound having a methylol group (hereinafter, also referred to as "methylol compound") include a compound in which a methylol group is bonded to a nitrogen atom or a carbon atom which forms an aromatic ring. In addition, examples of the compound having an alkoxymethyl group (hereinafter, also referred to as "alkoxymethyl compound") include a compound in which an alkoxymethyl group is bonded to a nitrogen atom or a carbon atom which forms an aromatic ring. As the compound in which an alkoxymethyl group or a methylol group is bonded to a nitrogen atom, for example, alkoxy methylated melamine, methylolated melamine, alkoxy methylated benzoguanamine, methylolated benzoguanamine, alkoxy methylated glycoluril, methylolated glycoluril, alkoxy methylated urea, or methylolated urea is preferable. In addition, the details can be found in paragraphs "0134" to "0147" of JP2004-295116A or paragraphs "0095" to "0126" of JP2014-089408A, the contents of which are incorporated herein by reference.

In a case where the composition according to the embodiment of the present invention includes the methylol compound, the content of the methylol compound is preferably 0.1 mass % or higher, more preferably 0.5 mass % or higher, still more preferably 1 mass % or higher, and still more preferably 5 mass % or higher with respect to the total solid content of the composition. The upper limit is preferably 80 mass % or lower, more preferably 70 mass % or lower, still more preferably 60 mass % or lower, still more preferably 50 mass % or lower, still more preferably 40 mass % or lower, and still more preferably 30 mass % or lower.

In a case where the composition according to the embodiment of the present invention includes the alkoxymethyl compound, the content of the alkoxymethyl compound is preferably 0.1 mass % or higher, more preferably 0.5 mass % or higher, still more preferably 1 mass % or higher, and still more preferably 5 mass % or higher with respect to the total solid content of the composition. The upper limit is preferably 80 mass % or lower, more preferably 70 mass % or lower, still more preferably 60 mass % or lower, still more preferably 50 mass % or lower, still more preferably 40 mass % or lower, and still more preferably 30 mass % or lower.

(Resin)

The composition according to the embodiment of the present invention may include a resin as the curable compound. It is preferable that the curable compound includes at least a resin. The resin can also be used as a dispersant. The resin which is used to disperse the pigments and the like will also be referred to as a dispersant. However, the above-described uses of the resin are merely exemplary, and the resin can be used for purposes other than the uses. The resin having a polymerizable group also corresponds to the polymerizable compound.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Examples of the epoxy resin include the polymer type compounds among the compounds described above as the examples of the epoxy compound regarding the polyrnerizable compound. Examples of a commercially available product of the cyclic olefin resin include ARTON F4520 (manufactured by JSR Corporation). In addition, a resin described in Examples of WO2016/088645A, a resin described in JP2017-057265A, a resin described in JP2017-032685A, a resin described in JP2017-075248A, or a resin described in JP2017-066240A can also be used, the contents of which are incorporated herein by reference. In addition, a resin having a fluorene skeleton can also be preferably used. Examples of the resin having a fluorene skeleton include a resin having the following structure. In the following structural formula, A represents a residue of a carboxylic dianhydride selected from pyromellitic dianhydride, benzophenone tetracarboxylic dianhydride, biphenyl tetracarboxylic dianhydride, or diphenyl ether tetracarboxylic dianhydride, and M represents a phenyl group or a benzyl group. The details of the resin having a fluorene skeleton can be found in US2017/0102610A, the content of which is incorporated herein by reference.

(meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

The resin having an acid group may further include a repeating unit having a polymerizable group. In a case where the resin having an acid group further includes the repeating unit having a polymerizable group, the content of the repeating unit having a polymerizable group is preferably 10% to 90 mol %, more preferably 20% to 90 mol %, and still more preferably 20% to 85 mol % with respect to all the repeating units. In addition, the content of the repeating unit having an acid group is preferably 1% to 50 mol %, more preferably 5% to 40 mol %, and still more preferably 5% to 30 mol % with respect to all the repeating units.

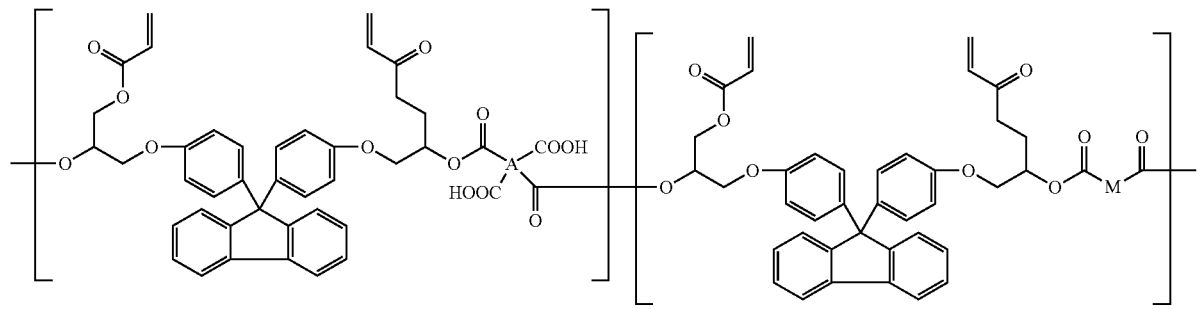

The resin used in the present invention may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. The resin having an acid group can also be used as an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth) acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer obtained by polymerization of monomer components including a compound represented by the following Formula (ED1) and/or a compound represented by the following Formula (ED2) (hereinafter, these compounds will also be referred to as "ether dimer") is also preferable.

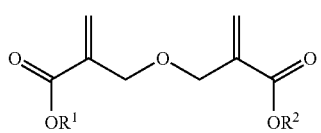
(ED1)

In Formula (ED1), $R^1$ and $R^2$ each independently represent a hydrogen atom or a hydrocarbon group having 1 to 25 carbon atoms which may have a substituent.

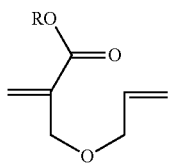
(ED2)

In Formula (ED2), R represents a hydrogen atom or an organic group having 1 to 30 carbon atoms. Specific examples of the compound represented by Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

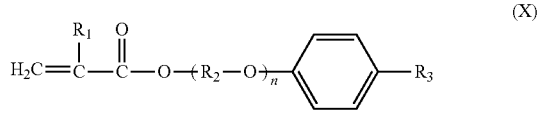
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

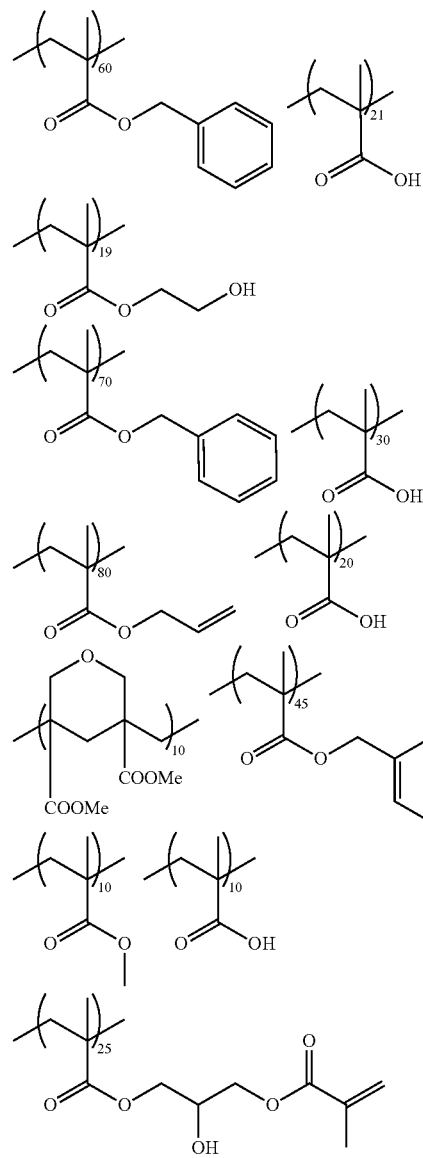

The composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

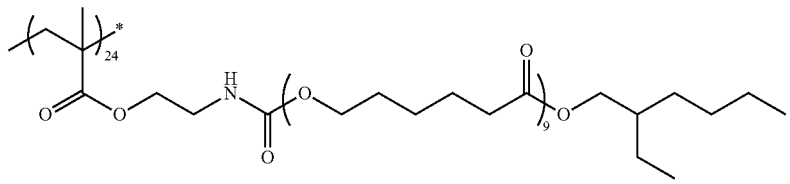

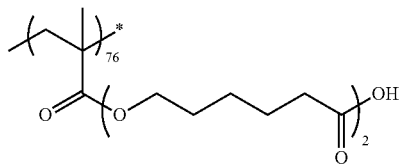

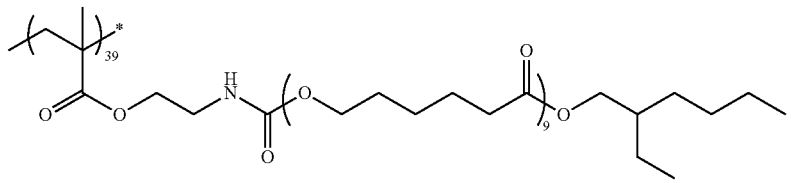

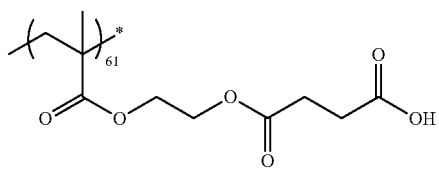

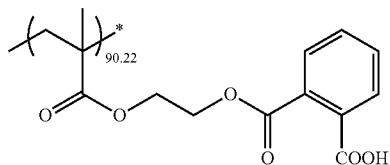

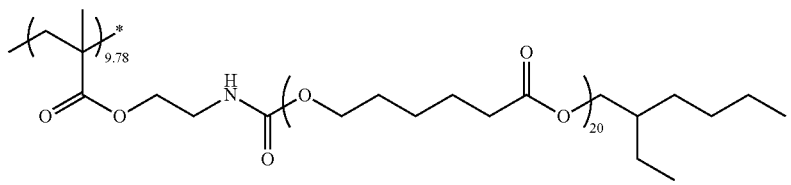

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. As the oligoimine dispersant, a resin having the following structure or a resin described in paragraphs "0168" to "0174" of JP2012-255128A can be used.

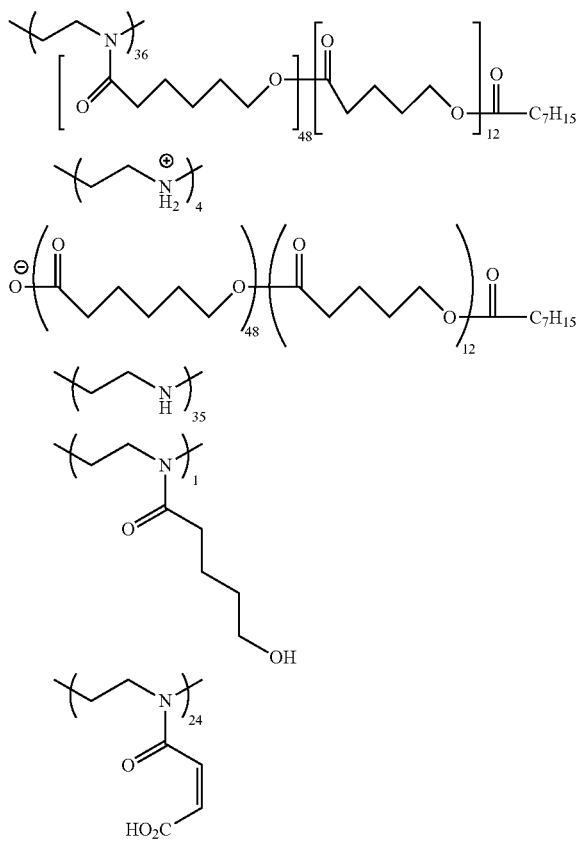

The dispersant is available as a commercially available product, and specific examples thereof include BYK 2000 (manufactured by BYK Chemie). In addition, a pigment dispersant described in paragraphs "0041" to "0130" of JP2014-130338A can also be used, the content of which is incorporated herein by reference. In addition, the resin having an acid group or the like can also be used as a dispersant.

In a case where the composition according to the embodiment of the present invention includes a resin, the content of the resin is preferably 0.1 to 50 mass % with respect to the total solid content of the composition according to the embodiment of the present invention. The lower limit is preferably 1 mass % or higher, more preferably 3 mass % or higher, still more preferably 5 mass % or higher, and still more preferably 10 mass % or higher. The upper limit is more preferably 40 mass % or lower, and still more preferably 30 mass % or lower. In addition, the content of the resin having an acid group is preferably 0.1 to 50 mass % with respect to the total solid content of the composition according to the embodiment of the present invention. The lower limit is preferably 1 mass % or higher, more preferably 3 mass % or higher, still more preferably 5 mass % or higher, and still more preferably 10 mass % or higher. The upper limit is more preferably 40 mass % or lower, and still more preferably 30 mass % or lower. The composition according to the embodiment of the present invention may include one resin or two or more resins. In a case where the composition includes two or more resins, it is preferable that the total content of the two or more resins is in the above-described range.

In a case where the composition according to the embodiment of the present invention includes the polymerizable compound (preferably the monomer type polymerizable compound that has a group having an ethylenically unsaturated bond) and the resin, a mass ratio (polymerizable compound/resin) of the polymerizable compound to the resin is preferably 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed.

In addition, a mass ratio (polymerizable compound/resin having an acid group) of the polymerizable compound (preferably the monomer type polymerizable compound that has a group having an ethylenically unsaturated bond) to the resin having an acid group is preferably 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed.

<<Photopolymerization Initiator>>

The composition according to the embodiment of the present invention may include a photopolymerization initiator. Examples of the photopolymerization initiator include a photoradical polymerization initiator and a photocationic polymerization initiator. It is preferable that the photoinitiator is selected and used according to the kind of the polymerizable compound. In a case where a radically polymerizable compound such as the compound which has a group having an ethylenically unsaturated bond is used as the polymerizable compound, it is preferable that a photoradical polymerization initiator is used as the photopolymerization initiator. In a case where the cationically polymerizable compound is used as the polymerizable compound, it is preferable that the photocationic polymerization initiator is used as the photopolymerization initiator. The photopolymerization initiator is not particularly limited and can be appropriately selected from well-known photopolymerization initiators. For example, a compound having photosensitivity to light in a range from an ultraviolet range to a visible range is preferable.

The content of the photopolymerization initiator is preferably 0.1 to 50 mass %, more preferably 0.5 to 30 mass %, and still more preferably 1 to 20 mass % with respect to the total solid content of the composition. In a case where the content of the photopolymerization initiator is in the above-described range, higher sensitivity and pattern formability can be obtained. The composition according to the embodiment of the present invention may include one photopolymerization initiator or two or more photopolymerization initiators. In a case where the composition includes two or more photopolymerization initiators, it is preferable that the total content of the photopolymerization initiators is in the above-described range.

(Photoradical Polymerization Initiator)

Examples of the photoradical polymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from the group consisting of an oxime compound, an α-hydroxy ketone compound, an α-aminoketone compound, and an acylphosphine compound is more preferable, and an oxime compound is still more preferable. The details of the photoradical polymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

Examples of the oxime compound include a compound described in JP2001-233842A, a compound described in JP2000-080068A, a compound described in JP2006-342166A, a compound described in J. C. S. Perkin II (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, and a compound described in WO2017/051680A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photoradical polymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photoradical polymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by Adeka Corporation).

In the present invention, as the photoradical polymerization initiator, an oxime compound having a benzofuran skeleton can also be used. Specific examples include OE-01 to OE-75 described in WO2015/036910A.

Hereinafter, specific examples of the oxime compound which are preferably used in the present invention are shown below, but the present invention is not limited thereto.

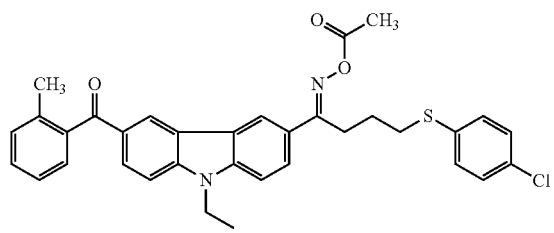

(C-1)

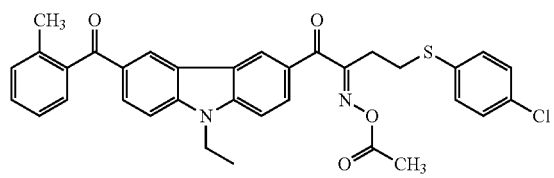

(C-2)

-continued
(C-3)
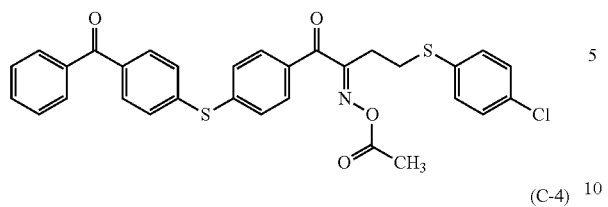
(C-4)
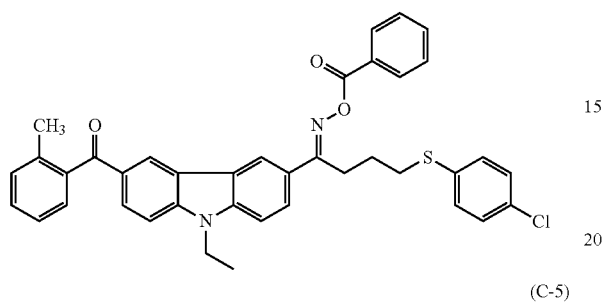
(C-5)
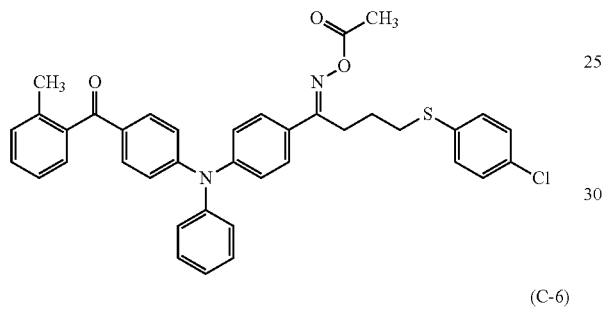
(C-6)
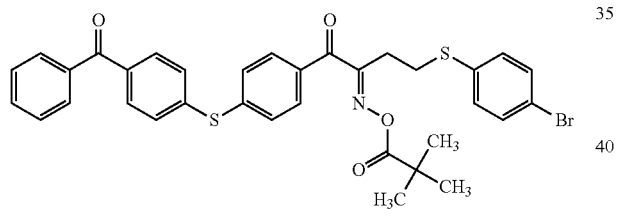
(C-7)
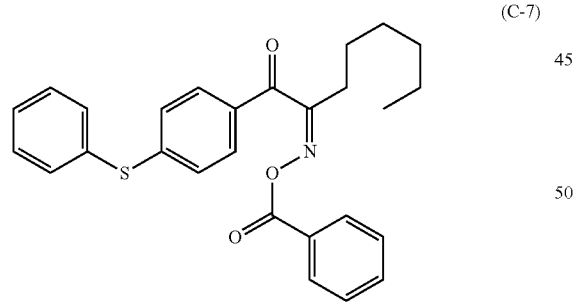
(C-8)
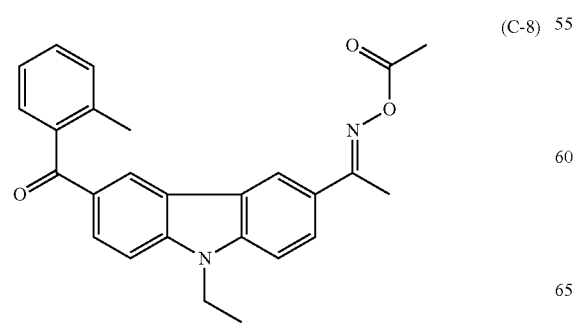
-continued
(C-9)
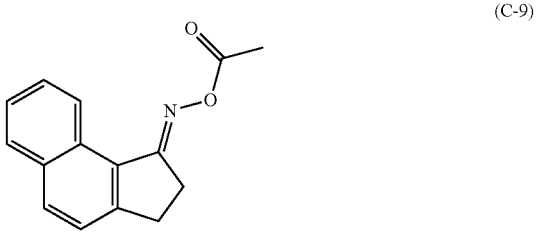
(C-10)
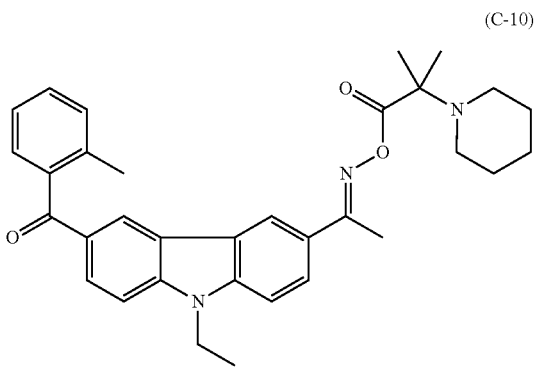
(C-11)
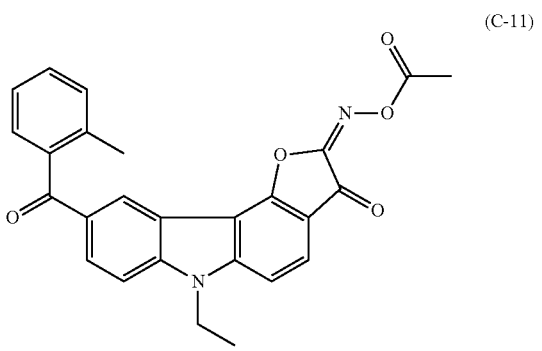
(C-12)
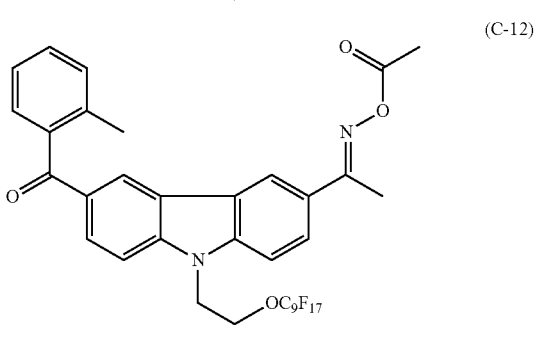
(C-13)
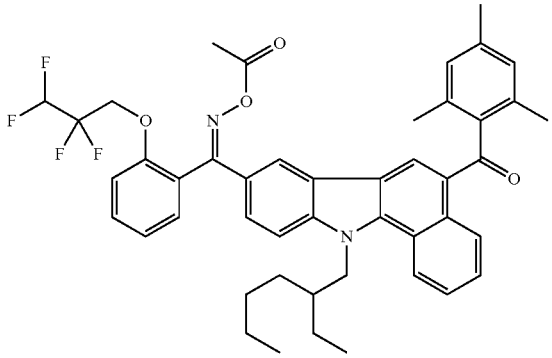

-continued

(C-14)

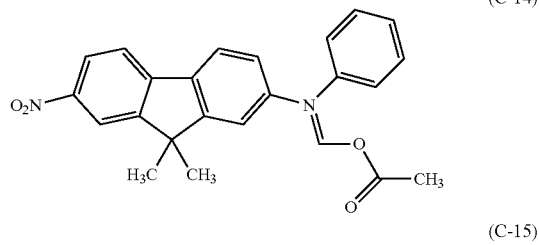
(C-15)

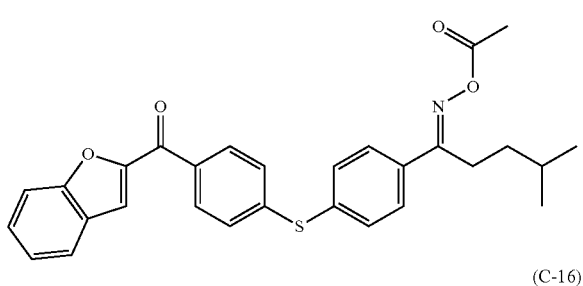
(C-16)

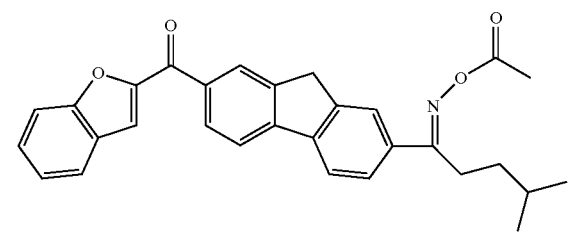

The oxime compound is preferably a compound having a maximum absorption wavelength in a wavelength range of 350 to 500 nm and more preferably a compound having a maximum absorption wavelength in a wavelength range of 360 to 480 nm. In addition, the molar absorption coefficient of the oxime compound at a wavelength of 365 nm or 405 nm is preferably high, more preferably 1,000 to 300,000, still more preferably 2,000 to 300,000, and still more preferably 5,000 to 200,000 from the viewpoint of sensitivity. The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photoradical polymerization initiator, a photoradical polymerization initiator having two functional groups or three or more functional groups may be used. Specific examples of the photoradical polymerization initiator include a dimer of an oxime compound described in JP2010-527339A, JP2011-524436A, WO2015/004565A, paragraphs "0417" to "0412" of JP2016-532675A, or paragraphs "0039" to "0055" of WO2017/033680A, a compound (E) and a compound (G) described in JP2013-522445A, and Cmpd 1 to 7 described in WO2016/034963A.

It is preferable that the photoradical polymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photoradical polymerization initiator is preferably 0.1 to 50 mass %, more preferably 0.5 to 30 mass %, and still more preferably 1 to 20 mass % with respect to the total solid content of the composition according to the embodiment of the present invention. In a case where the content of the photoradical polymerization initiator is in the above-described range, higher sensitivity and pattern formability can be obtained. The composition according to the embodiment of the present invention may include one photoradical polymerization initiator or two or more photoradical polymerization initiators. In a case where the composition includes two or more photoradical polymerization initiators, it is preferable that the total content of the photoradical polymerization initiators is in the above-described range.

(Photocationic Polymerization Initiator)

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. The details of the photocationic polymerization initiator can be found in paragraphs "0139" to "0214" of JP2009-258603A, the content of which is incorporated herein by reference.

The content of the photocationic polymerization initiator is preferably 0.1 to 50 mass %, more preferably 0.5 to 30 mass %, and still more preferably 1 to 20 mass % with respect to the total solid content of the composition according to the embodiment of the present invention. In a case where the content of the photocationic polymerization initiator is in the above-described range, higher sensitivity and pattern formability can be obtained. The composition according to the embodiment of the present invention may include one photocationic polymerization initiator or two or more photocationic polymerization initiators. In a case where the composition includes two or more photocationic polymerization initiators, it is preferable that the total content of the two or more photocationic polymerization initiators is in the above-described range.

<<Polyfunctional Thiol>>

The composition according to the embodiment of the present invention may include a polyfunctional thiol. The polyfunctional thiol is a compound having two or more thiol (SH) groups. By using the above-described photoradical polymerization initiator in combination, the polyfunctional thiol functions as a chain transfer agent in the process of radical polymerization after light irradiation such that a thiyl radical that is not likely to undergo polymerization inhibition due to oxygen is generated. Therefore, the sensitivity of the composition can be improved. In particular, it is preferable that the SH group is a polyfunctional aliphatic thiol that is bonded to an aliphatic group such as an ethylene group.

Examples of the polyfunctional thiol include hexanedithiol, decanedithiol, 1,4-butanediol bisthio propionate, 1,4-butanediolbisthioglycolate, ethylene glycol bisthioglycolate, ethylene glycol bisthiopropionate, trimethylolpropane tristhioglycolate, trimethylolpropane tristhiopropionate, trimethylolethane tris(3-mercaptobutyrate), trimethylolpropane tris(3-mercaptobutyrate), trimethylolpropane tris(3-mercaptopropionate), pentaerythritol tetrakisthioglycolate, pentaerythritol tetrakisthiopropionate, pentaerythritol tetrakis (3-mercaptopropionate), dipentaeiythritol hexakis(3-mercaptopropionate), trimercaptopropionic acid tris(2-hydroxyethyl)isocyanurate, 1,4-dimethylmercaptobenzene, 2,4,6-trimercapto-s-triazine, and 2-(N,N-dibutylamino)-4,6-dimercapto-s-triazine. In addition, for example, a compound having the following structure can also be used.

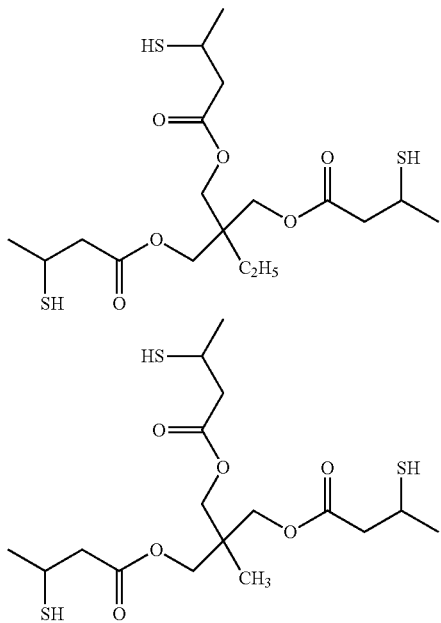

The content of the polyfunctional thiol is preferably 0.1 to 20 mass %, more preferably 0.1 to 15 mass %, and still more preferably 0.1 to 10 mass % with respect to the total solid content of the composition according to the embodiment of the present invention. The composition according to the embodiment of the present invention may include one polyfunctional thiol or two or more polyfunctional thiols. In a case where the composition includes two or more polyfunctional thiols, it is preferable that the total content of the two or more polyfunctional thiols is in the above-described range.

<<Epoxy Resin Curing Agent>>

In a case where the composition according to the embodiment of the present invention includes an epoxy resin, it is preferable that the composition further includes an epoxy resin curing agent. Examples of the epoxy resin curing agent include an amine compound, an acid anhydride compound, an amide compound, a phenol compound, and a polycarboxylic acid. From the viewpoints of heat resistance and transparency of a cured product, as the epoxy resin curing agent, a polycarboxylic acid is preferable, and a compound having two or more carboxylic anhydride groups in a molecule is most preferable. Specific examples of the epoxy resin curing agent include butanedioic acid. The details of the epoxy resin curing agent can be found in paragraphs "0072" to "0078", the content of which is incorporated herein by reference.

The content of the epoxy resin curing agent is preferably 0.01 to 20 parts by mass, more preferably 0.01 to 10 parts by mass, and still more preferably 0.1 to 6.0 parts by mass with respect to 100 parts by mass of the epoxy resin.

<<Pigment Derivative>>

The composition according to the embodiment of the present invention may further include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

The colorant structure represented by P is preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, or a benzoxazole colorant structure, more preferably at least one selected from a pyrrolopyrrole colorant structure, a diketo pyrrolopyrrole colorant structure, a quinacridone colorant structure, or a benzimidazolone colorant structure, and still more preferably a pyrrolopyrrole colorant structure.

Examples of the linking group represented by L include a hydrocarbon group, a heterocyclic group, —NR—, —SO$_2$—, —S—, —O—, —CO—, and a group of a combination thereof. R represents a hydrogen atom, an alkyl group, or an aryl group.

Examples of the acid group represented by X include a carboxyl group, a sulfo group, a carboxylic acid amide group, a sulfonic acid amide group, and an imide acid group. As the carboxylic acid amide group, a group represented by —NHCOR$^{X1}$ is preferable. As the sulfonic acid amide group, a group represented by —NHSO$_2$R$^{X2}$ is preferable. As the imide acid group, a group represented by —SO$_2$NHSO$_2$R$^{X3}$, —CONHSO$_2$R$^{X4}$, —CONHCOR$^{X5}$, or —SO$_2$NHCOR$^{X6}$ is preferable. R$^{X1}$ to R$^{X6}$ each independently represent a hydrocarbon group or a heterocyclic group. The hydrocarbon group and the heterocyclic group represented by R$^{X1}$ to R$^{X6}$ may further have a substituent. Examples of the substituent which may be further included include the substituent T described above regarding Formula (PP). Among these, a halogen atom is preferable and a fluorine atom is more preferable. Examples of the basic group represented by X include an amino group. Examples of the salt structure represented by X include a salt of the acid group or the basic group described above.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-l13-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, paragraphs "0063" to "0094" of WO2012/102399A, paragraph "0082" of WO2017/038252A, and JP5299151B can be used, the contents of which are incorporated herein by reference.

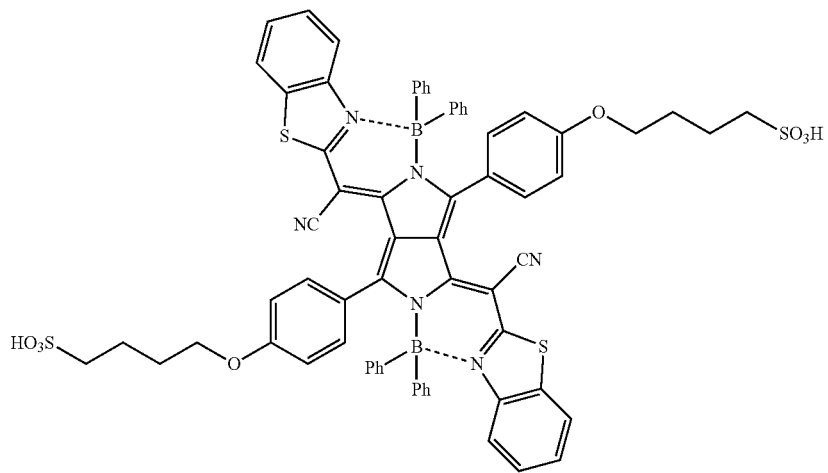

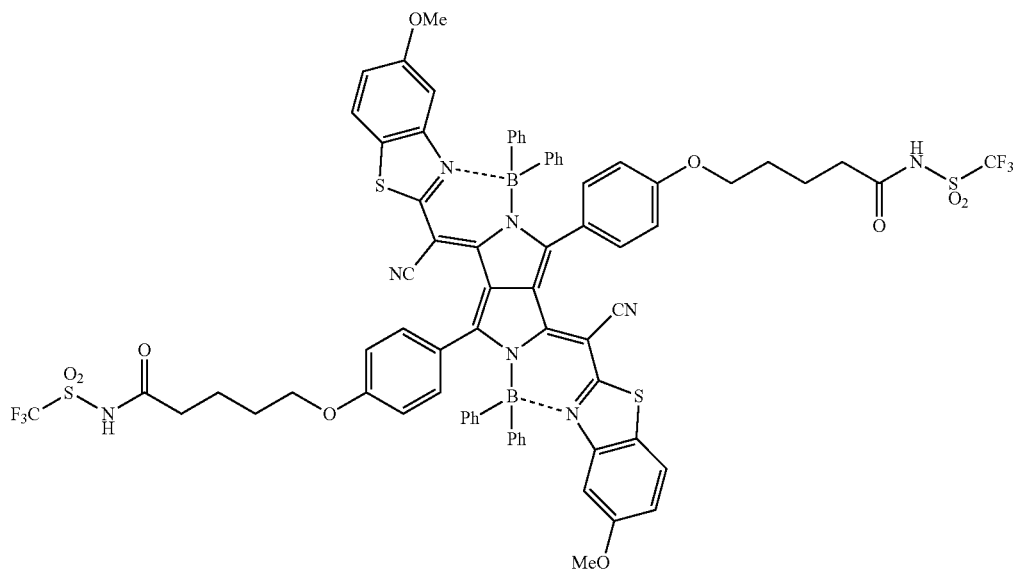

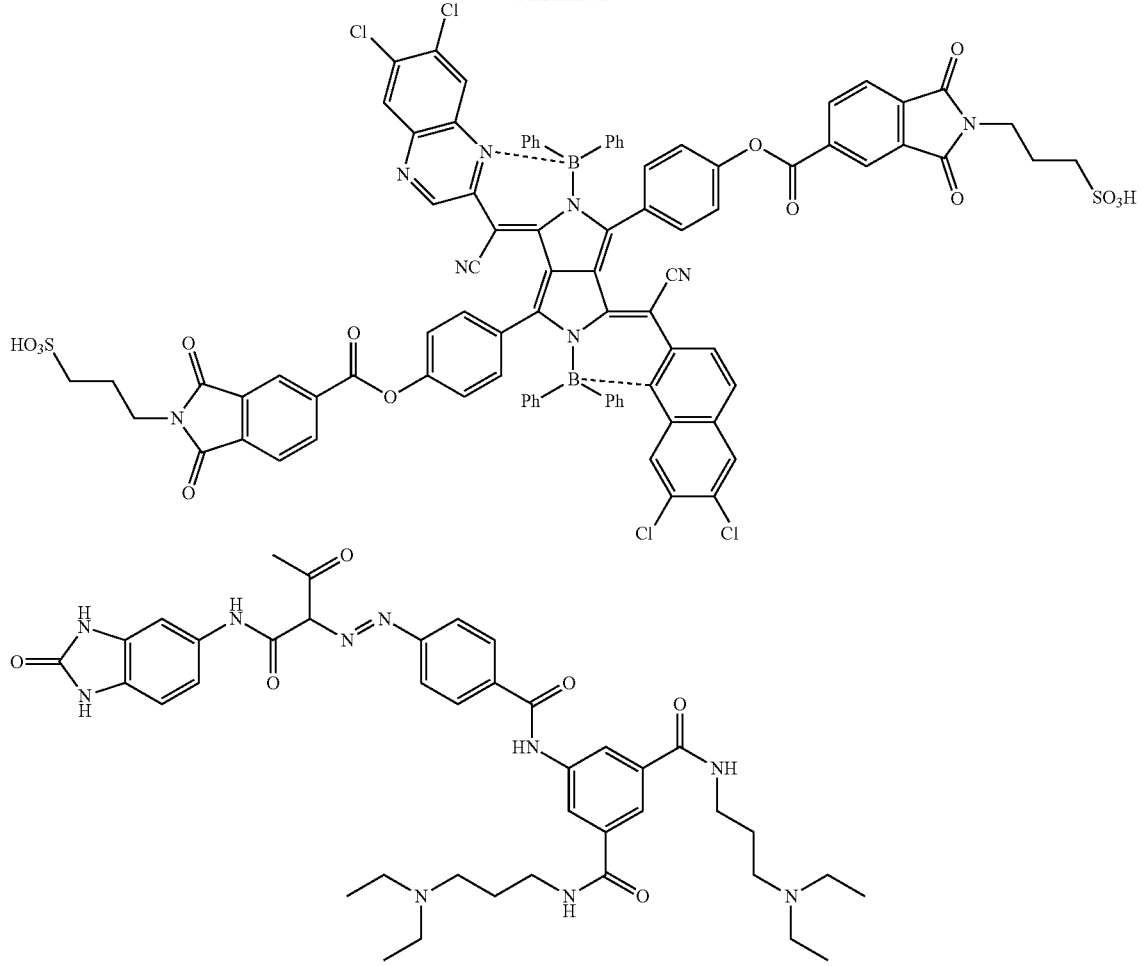

In a case where the composition according to the embodiment of the present invention includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used in combination. In a case where two or more pigment derivatives are used in combination, it is preferable that the total content of the two or more pigment derivatives is in the above-described range.

<<Solvent>>

The composition according to the embodiment of the present invention may include a solvent. Examples of the solvent include an organic solvent. Basically, the solvent is not particularly limited as long as it satisfies the solubility of the respective components and the coating properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 µm or less, more preferably 5 µm or less, and still more preferably 3 µm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 99 mass % with respect to the total mass of the composition according to the embodiment of the present invention. The upper limit is preferably 95 mass % or lower, and more preferably 90 mass % or lower. The lower limit is preferably 30 mass % or higher, more preferably 40 mass % or higher, still more preferably 50 mass % or higher, still more preferably 60 mass % or higher, and still most preferably 70 mass % or higher.

<<Polymerization Inhibitor>>

The composition according to the embodiment of the present invention may include a polymerization inhibitor. Examples of the polymerization inhibitor include hydroquinone, p-methoxyphenol, di-tert-butyl-p-cresol, pyrogallol, t-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the composition according to the embodiment of the present invention.

<<Silane Coupling Agent>>

The composition according to the embodiment of the present invention may include a silane coupling agent. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.01 to 15.0 mass % and more preferably 0.05 to 10.0 mass % with respect to the total solid content of the composition according to the embodiment of the present invention. As the silane coupling agent, one kind may be used alone, or two or more kinds may be used. In a case where two or more surfactants are used in combination, it is preferable that the total content of the two or more surfactants is in the above-described range.

<<Surfactant>>

The composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

In the present invention, it is preferable that the surfactant is a fluorine surfactant. By the composition according to the embodiment of the present invention containing a fluorine surfactant, liquid characteristics (for example, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, as the fluorine surfactant, a polymer of a fluorine-containing vinyl ether compound having a fluorinated alkyl group or a fluorinated alkylene ether group and a hydrophilic vinyl ether compound is also preferable. The details of this fluorine surfactant can be found in JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

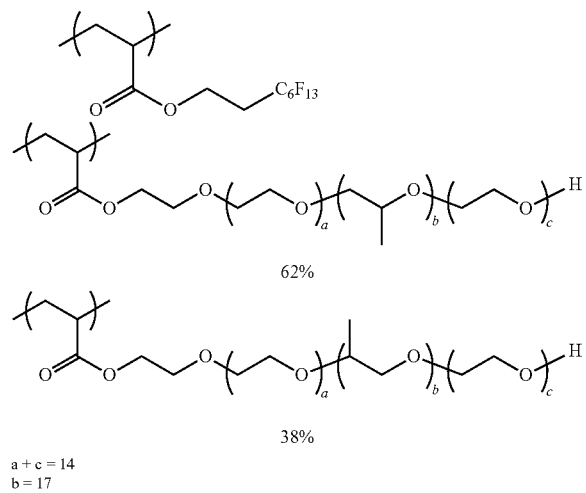

62%

38% a + c = 14
b = 17

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SURFYNOL 104, 400, and 440 (all of which are manufactured by Nissin Chemical Co., Ltd.).

The content of the surfactant is preferably 0.001 mass % to 5.0 mass % and more preferably 0.005 to 3.0 mass % with respect to the total solid content of the composition according to the embodiment of the present invention. As the surfactant, one kind may be used alone, or two or more kinds may be used. In a case where two or more surfactants are used in combination, it is preferable that the total content of the two or more surfactants is in the above-described range.

<<Ultraviolet Absorber>>

The composition according to the embodiment of the present invention can include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, an azomethine compound, an indole compound, or a triazine compound can be used. The details of the ultraviolet absorber can be found in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Examples of a commercially available product of the conjugated diene compound include UV-503 (manufactured by Daito Chemical Co., Ltd.). Specific examples of the indole compound include compounds having the following structures. In addition, as the benzotriazole compound, MYUA series (manufactured by Miyoshi Oil&Fat Co., Ltd.; The Chemical Daily, Feb. 1, 2016) may be used.

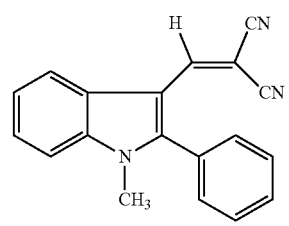 [SMILES: Cn1c(-c2ccccc2)c(C=C(C#N)C#N)c2ccccc21]

In the present invention, as the ultraviolet absorber, compounds represented by Formulae (UV-1) to (UV-3) can also be preferably used.

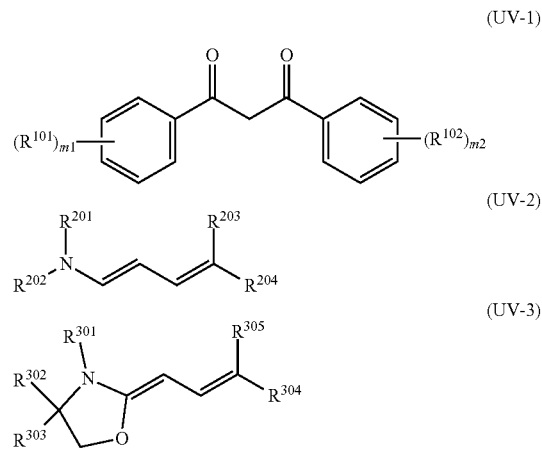

In Formula (UV-1), $R^{101}$ and $R^{102}$ each independently represent a substituent, and m1 and m2 each independently represent 0 to 4. In Formula (UV-2), $R^{201}$ and $R^{202}$ each independently represent a hydrogen atom or an alkyl group, and $R^{203}$ and $R^{204}$ each independently represent a substituent. In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formulae (UV-1) to (UV-3) include the following compounds.

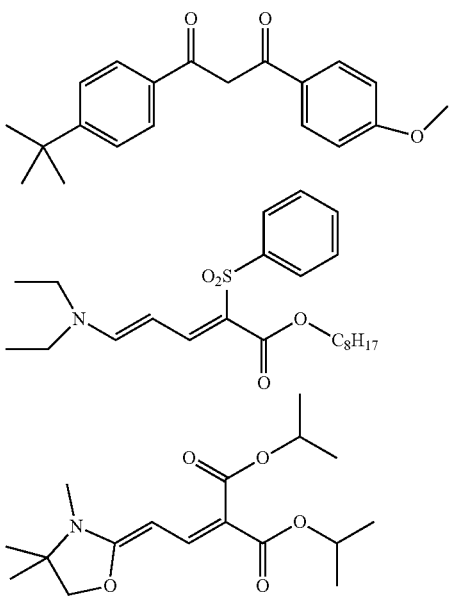

The content of the ultraviolet absorber is preferably 0.01 to 10 mass % and more preferably 0.01 to 5 mass % with respect to the total solid content of the composition according to the embodiment of the present invention. In the present invention, as the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Antioxidant>>

The composition according to the embodiment of the present invention may include an antioxidant. Examples of the antioxidant include a phenol compound, a phosphite compound, and a thioether compound. As the phenol compound, any phenol compound which is known as a phenol antioxidant can be used. As the phenol compound, for example, a hindered phenol compound is preferable. A compound having a substituent at a position (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). In addition, as the antioxidant, a polyfunctional hindered amine antioxidant described in WO17/006600A can also be used.

The content of the antioxidant is preferably 0.01 to 20 mass % and more preferably 0.3 to 15 mass % with respect to the mass of the total solid content of the composition according to the embodiment of the present invention. As the antioxidant, one kind may be used alone, or two or more kinds may be used in combination. In a case where two or more antioxidants are used in combination, it is preferable that the total content of the two or more antioxidants is in the above-described range.

<<Other Components>>

Optionally, the composition according to the embodiment of the present invention may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By the composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference.

In addition, the composition according to the embodiment of the present invention may optionally include a potential antioxidant. The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

A storage container of the composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The use of the composition according to the embodiment of the present invention is not particularly limited. The composition according to the embodiment of the present invention can be preferably used to form an infrared transmitting filter or the like.

<Method of Preparing Composition>

The composition according to the embodiment of the present invention can be prepared by mixing the above-described components with each other. During the preparation of the composition, all the components may be dissolved or dispersed in a solvent at the same time to prepare the composition. Optionally, two or more solutions or dispersions to which the respective components are appropriately added may be prepared, and the solutions or dispersions may be mixed with each other during use (during application) to prepare the composition.

In addition, in a case where the composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 µm and is preferably about 0.01 to 3.0 µm and more preferably about 0.05 to 0.5 µm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more.

In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation.

The second filter may be formed of the same material as that of the first filter.

In addition, the filtering using the first filter may be performed only on the dispersion, and the filtering using the second filter may be performed on a mixture of the dispersion and other components.

The total solid content (solid content concentration) of the composition according to the embodiment of the present invention changes depending on a coating method and, for example, is preferably 1 to 50 mass %. The lower limit is more preferably 10 mass % or higher. The upper limit is more preferably 30 mass % or lower.

In a case where a film is formed using the composition according to the embodiment of the present invention such that the thickness after drying is 0.1 to 50 µm (preferably 0.1 to 20 µm and more preferably 0.5 to 10 µm), it is preferable that the film has the following spectral characteristics at at least one of the above-described thicknesses: that a maximum value of a light transmittance of the film in a thickness direction in a wavelength range of 400 to 1100 nm is 20% or lower (preferably 15% or lower and more preferably 10% or lower); and that a minimum value of a light transmittance of the film in the thickness direction in a wavelength range of 1400 to 1500 nm is 70% or higher (preferably 75% or higher and more preferably 80% or higher).

In addition, It is preferable that the composition according to the embodiment of the present invention satisfies at least one of the following spectral characteristics (1) to (4).

(1) In a case where a film having a thickness of 1 µm after drying is formed, a maximum value of a light transmittance of the film in a thickness direction in a wavelength range of 400 to 1100 nm is 20% or lower (preferably 15% or lower and more preferably 10% or lower), and a minimum value of a light transmittance of the film in the thickness direction in a wavelength range of 1400 to 1500 nm is 70% or higher (preferably 75% or higher and more preferably 80% or higher).

(2) In a case where a film having a thickness of 2 µm after drying is formed, a maximum value of a light transmittance of the film in a thickness direction in a wavelength range of 400 to 1100 nm is 20% or lower (preferably 15% or lower and more preferably 10% or lower), and a minimum value of a light transmittance of the film in the thickness direction in a wavelength range of 1400 to 1500 nm is 70% or higher (preferably 75% or higher and more preferably 80% or higher).

(3) In a case where a film having a thickness of 3 µm after drying is formed, a maximum value of a light transmittance of the film in a thickness direction in a wavelength range of 400 to 1100 nm is 20% or lower (preferably 15% or lower and more preferably 10% or lower), and a minimum value of a light transmittance of the film in the thickness direction in a wavelength range of 1400 to 1500 nm is 70% or higher (preferably 75% or higher and more preferably 80% or higher).

(4) In a case where a film having a thickness of 5 µm after drying is formed, a maximum value of a light transmittance of the film in a thickness direction in a wavelength range of 400 to 1100 nm is 20% or lower (preferably 15% or lower and more preferably 10% or lower), and a minimum value of a light transmittance of the film in the thickness direction in a wavelength range of 1400 to 1500 nm is 70% or higher (preferably 75% or higher and more preferably 80% or higher).

In addition, regarding the composition according to the embodiment of the present invention, at at least one value of the film thicknesses, the minimum value A of the absorbance in a wavelength range of 400 to 1100 nm is, for example, preferably 0.1 to 5 and more preferably 0.3 to 3. In addition, the maximum value B of the absorbance in a wavelength range of 1400 to 1500 nm is, for example, preferably 0.01 to 0.5 and more preferably 0.02 to 0.3.

A film formed of the composition according to the embodiment of the present invention can be preferably used as a infrared transmitting filter. For example, by incorporating a film formed of the composition according to the embodiment of the present invention into an infrared sensor, moisture can be detected with high sensitivity.

<Pattern Forming Method>

Next, a pattern forming method using the composition according to the embodiment of the present invention will be described. It is preferable that a pattern forming method includes: a step of forming a composition layer on a support using the composition according to the embodiment of the present invention; and a step of forming a pattern on the composition layer using a photolithography method or a dry etching method.

It is preferable that the pattern formation using the photolithography method includes: a step of forming a composition layer on a support using the composition according to the embodiment of the present invention; a step of exposing the composition layer in a pattern shape; and a step of forming a pattern by removing a non-exposed portion by development. In addition, the formation of a pattern using a dry etching method can be performed using a method including: forming a composition layer on a support using the composition according to the embodiment of the present invention; curing the composition layer formed on the support to form a cured composition layer; forming a patterned resist layer on the cured composition layer; and dry-etching the cured composition layer with etching gas by using the patterned resist layer as a mask. Hereinafter, the respective steps will be described.

<<Step of Forming Composition Layer>>

In the step of forming a composition layer, a composition layer is formed on a support using the composition according to the embodiment of the present invention. Examples of the support include a substrate formed of a material such as silicon, non-alkali glass, soda glass, PYREX (registered trade name) glass, or quartz glass. In addition, for example, an InGaAs substrate is preferably used. The InGaAs substrate has excellent sensitivity to light having a wavelength of longer than 1000 nm. Therefore, by laminating the film according to the embodiment of the present invention on the InGaAs substrate, an infrared sensor having excellent sensitivity can be easily obtained. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat.

As a method of applying the composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A. In addition, the details of the method of applying the resin composition can be found in WO2017/030174A and WO2017/018419A, the contents of which are incorporated herein by reference.

The composition layer formed on the support may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 3000 seconds, more preferably 40 to 2500 seconds, and still more preferably 80 to 2200 seconds. Drying can be performed using a hot plate, an oven, or the like.

(Case where Pattern is Formed Using Photolithography Method)

<<Exposure Step>>

Next, the composition layer is exposed in a pattern shape (exposure step). For example, the composition layer can be exposed in a pattern shape using an exposure device such as a stepper through a mask having a predetermined mask pattern. As a result, an exposed portion can be cured. As radiation (light) used during the exposure, in particular, ultraviolet rays such as g-rays or i-rays are preferable, and i-rays are more preferable. The irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photocured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethyl ammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, a surfactant may be added to the developer for use. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

In the present invention, after the development step and the drying, a heat treatment (post-baking) or a curing step of curing the film by post-exposure may be performed.

Post-baking is a heat treatment which is performed after development to complete curing. For example, the heating temperature during post-baking is preferably 100° C. to 240° C. and more preferably 200° C. to 240° C. In addition, in a case where an organic electroluminescence (organic EL) element is used as a light-emitting light source, or in a case where a photoelectric conversion film of an image sensor is formed of an organic material, the heating temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batchwise using heating means such as a hot plate, a convection oven (hot air circulation dryer), a high-frequency heater under the above-described conditions.

For post-exposure, for example, g-rays, h-rays, i-rays, excimer laser such as KrF or ArF, electron beams, or X-rays can be used. It is preferable that post-baking is performed using an existing high-pressure mercury lamp at a low temperature of about 20° C. to 50° C. The irradiation time is 10 seconds to 180 seconds and preferably 30 seconds to 60 seconds. In a case where post-exposure and post-baking are performed in combination, it is preferable that post-exposure is performed before post-heating.

(Case where Pattern is Formed Using Dry Etching Method)

The formation of a pattern using a dry etching method can be performed using a method including: curing the composition layer on the support to form a cured composition layer; forming a patterned resist layer on the cured composition layer; and dry-etching the cured composition layer with etching gas by using the patterned resist layer as a mask. In particular, in a preferable aspect, as a process of forming the resist layer, baking after exposure or baking after development (post-baking) is performed. The details of the pattern formation using the dry etching method can be found in paragraphs "0010" to "0067" of JP2013-064993A, the content of which is incorporated herein by reference.

By performing the respective steps as described above, a pattern (pixel) of the film having the specific spectral characteristics according to the embodiment of the present invention can be formed.

<Film>

Next, a film according to the embodiment of the present invention will be described.

The film according to the embodiment of the present invention is obtained from the above-described composition according to the embodiment of the present invention. The film according to the embodiment of the present invention can be preferably used as an infrared transmitting filter. For example, by incorporating the film according to the embodiment of the present invention into an infrared sensor, moisture can be detected with high sensitivity.

It is preferable that the film according to the embodiment of the present invention has the following spectral characteristics (1). According to this aspect, a film capable of shielding light in a wavelength range of 400 to 1100 nm and allowing transmission of infrared light (preferably infrared light in a wavelength range of longer than 1.400 nm and more preferably infrared light in a wavelength range of 1400 to 1500 nm) in a state where noise generated from visible light is small can be formed.

(1) A maximum value of a light transmittance of the film in a thickness direction in a wavelength range of 400 to 1100 nm is 20% or lower (preferably 15% or lower and more preferably 10% or lower), and a minimum value of a light transmittance of the film in the thickness direction in a wavelength range of 1400 to 1500 nm is 70% or higher (preferably 75% or higher and more preferably 80% or higher).

The thickness of the film according to the embodiment of the present invention is not particularly limited and is preferably 0.1 to 50 µm, more preferably 0.1 to 20 µm, and still more preferably 0.5 to 10 µm.

<Laminate>

Next, a laminate according to the embodiment of the present invention will be described. The laminate according to the embodiment of the present invention includes: a layer (hereinafter, also referred to as "first layer") including a coloring material that allows transmission of infrared light and shields visible light; and a layer (hereinafter, also referred to as "second layer") including a material that shields light in a wavelength range of longer than 1000 nm and 1200 nm or shorter.

A ratio A/B of a minimum value A of an absorbance of the laminate in a wavelength range of 400 to 1100 nm to a maximum value B of an absorbance of the laminate in a wavelength range of 1400 to 1500 nm is 4.5 or higher. The value of the above-described ratio A/B is preferably 10 or higher, more preferably 20 or higher, and still more preferably 30 or higher. The upper limit is, for example, 90 or lower. The laminate according to the embodiment of the present invention can be preferably used as an infrared transmitting filter. For example, by incorporating the laminate according to the embodiment of the present invention into an infrared sensor, moisture can be detected with high sensitivity.

As the coloring material that shields visible light and the material that shields light in a wavelength range of longer than 1000 nm and 1200 nm or shorter, the materials described above regarding the composition according to the embodiment of the present invention can be used.

It is preferable that a maximum value of a light transmittance of the laminate according to the embodiment of the present invention in a thickness direction in a wavelength range of 400 to 1100 nm is 20% or lower (preferably 15% or lower and more preferably 10% or lower), and a minimum value of a light transmittance of the laminate according to the embodiment of the present invention in the thickness direction in a wavelength range of 1400 to 1500 nm is 70% or higher (preferably 75% or higher and more preferably 80% or higher).

It is preferable that the laminate according to the embodiment of the present invention has any one of the following spectral characteristics (1) to (4).

(1) At least one of the first layer or the second layer further includes the compound having an absorption maximum in a wavelength range of longer than 700 nm and 1000 nm or shorter.

(2) The laminate further includes a layer (hereinafter, also referred to as "third layer") including a compound having an absorption maximum in a wavelength range of longer than 700 nm and 1000 nm or shorter.

(3) At least one of the first layer or the second layer includes the compound having an absorption maximum in a wavelength range of longer than 900 nm and 1000 nm or shorter and the compound having an absorption maximum in a wavelength range of longer than 700 nm and 900 nm or shorter.

(4) At least one of the first layer or the second layer includes the compound having an absorption maximum in a wavelength range of longer than 900 nm and 1000 nm or shorter, and another one of the first layer or the second layer includes the compound having an absorption maximum in a wavelength range of longer than 700 nm and 900 nm or shorter.

The thickness of the laminate according to the embodiment of the present invention is preferably 1 to 5 μm and more preferably 1.5 to 3.5 μm.

The laminating order of the respective layers in the laminate according to the embodiment of the present invention is not particularly limited. The first layer and the second layer may be laminated disposed in this order from the support side, or the second layer and the first layer may be disposed in this order from the support side. In addition, in a case where the laminate further includes the third layer, the first layer, the second layer, and the third layer may be disposed in this order from the support side, the first layer, the third layer, and the second layer may be disposed in this order from the support side, the second layer, the third layer, and the first layer may be disposed in this order from the support side, the third layer, the first layer, and the second layer may be disposed in this order from the support side, and the third layer, the second layer, and the first layer may be disposed in this order from the support side.

In the laminate according to the embodiment of the present invention, a maximum value of a light transmittance of the first layer in the thickness direction in a wavelength range of 400 to 700 nm is preferably 20% or lower (preferably 15% or lower and more preferably 10% or lower).

In the laminate according to the embodiment of the present invention, the thickness of the first layer is preferably 0.5 to 4 μm and more preferably 1 to 3 μm.

In the laminate according to the embodiment of the present invention, it is preferable that a maximum value of a light transmittance of the second layer in a thickness direction in a wavelength range of 400 to 700 nm is 20% or lower (preferably 15% or lower and more preferably 10% or lower), and a minimum value of a light transmittance of the second layer in the thickness direction in a wavelength range of 1400 to 1500 nm is 70% or higher (preferably 75% or higher and more preferably 80% or higher).

In addition, in a case where the second layer includes a compound having an absorption maximum in a wavelength range of longer than 700 nm and 1000 nm or shorter, it is preferable that a maximum value of a light transmittance of the second layer in a thickness direction in a wavelength range of 700 to 1100 nm is 20% or lower (preferably 15% or lower and more preferably 10% or lower), and a minimum value of a light transmittance of the second layer in the thickness direction in a wavelength range of 1400 to 1500 nm is 70% or higher (preferably 75% or higher and more preferably 80% or higher).

In the laminate according to the embodiment of the present invention, the thickness of the second layer is preferably 0.4 to 4 μm and more preferably 0.6 to 3 μm.

In a case where the laminate according to the embodiment of the present invention includes the third layer, the thickness of the third layer is preferably 0.5 to 2 μm and more preferably 0.6 to 1.5 μm. In addition, it is preferable that a maximum value of a light transmittance of the third layer in a thickness direction in a wavelength range of 700 to 1000 nm is 20% or lower (preferably 15% or lower and more preferably 10% or lower), and a minimum value of a light transmittance of the third layer in the thickness direction in a wavelength range of 1400 to 1500 nm is 70% or higher (preferably 75% or higher and more preferably 80% or higher).

<Infrared Transmitting Filter>

Next, an infrared transmitting filter according to the embodiment of the present invention will be described. The infrared transmitting filter according to the embodiment of the present invention includes the film or the laminate according to the embodiment of the present invention.

It is preferable that the infrared transmitting filter according to the embodiment of the present invention is laminated on a support for use. Examples of the support include the above-described examples.

The infrared transmitting filter according to the embodiment of the present invention can be used in combination with a color filter that includes a chromatic colorant. The color filter can be manufactured using a coloring composition including a chromatic colorant. Examples of the chromatic colorant include the chromatic colorants described regarding the composition according to the embodiment of the present invention. The coloring composition may further include, for example, a resin, a polymerizable compound, a photopolymerization initiator, a surfactant, a solvent, a polymerization inhibitor, and an ultraviolet absorber. In more detail, for example, the materials described above regarding the composition according to the embodiment of the present invention can be used.

In the infrared transmitting filter according to the embodiment of the present invention, the film or the laminate according to the embodiment of the present invention can also be used in combination with another infrared transmitting filter having spectral characteristics different from those of the film or the laminate according to the embodiment of the present invention.

Examples of the other infrared transmitting filter include filters satisfying any one of the following spectral characteristics (1) to (3).

(1): A filter in which a maximum value of a light transmittance of the filter in a thickness direction in a wavelength range of 400 to 750 nm is 20% or lower (preferably 15% or lower and more preferably 10% or lower), and a minimum value of a light transmittance of the filter in the thickness direction in a wavelength range of 900 to 1300 nm is 70% or higher (preferably 75% or higher and more preferably 80% or higher). This filter can shield light in a wavelength range of 400 to 750 nm and can allow transmission of infrared light having a wavelength of longer than 850 nm can be formed.

(2): A filter in which a maximum value of a light transmittance of the filter in a thickness direction in a wavelength range of 400 to 830 nm is 20% or lower (preferably 15% or lower and more preferably 10% or lower), and a minimum value of a light transmittance of the filter in the thickness direction in a wavelength range of 1000 to 1300 nm is 70% or higher (preferably 75% or higher and more preferably 80% or higher). This filter can shield light in a wavelength range of 400 to 830 nm and can allow transmission of infrared light having a wavelength of longer than 940 nm can be formed.

(3): A filter in which a maximum value of a light transmittance of the filter in a thickness direction in a wavelength range of 400 to 950 nm is 20% or lower (preferably 15% or lower and more preferably 10% or lower), and a minimum value of a light transmittance of the filter in the thickness direction in a wavelength range of 1100 to 1300 nm is 70% or higher (preferably 75% or higher and more preferably 80% or higher). This filter can shield light in a wavelength range of 400 to 950 nm and can allow transmission of infrared light having a wavelength of longer than 1040 nm can be formed.

<Solid Image Pickup Element>

A solid image pickup element according to the embodiment of the present invention includes the film or the laminate according to the embodiment of the present invention. The solid image pickup element according to the embodiment of the present invention is configured to include the film or the laminate according to the embodiment of the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film or the laminate according to the embodiment of the present invention is formed on the device protective film. Further, a configuration in which light collecting means (for example, a microlens; hereinafter, the same shall be applied) is provided above the device protective film and below the film or the laminate according to the embodiment of the present invention (on a side thereof close the support), or a configuration in which light collecting means is provided on the film or the laminate according to the embodiment of the present invention may be adopted.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 111. Microlenses 115 are disposed on an incidence ray hv side of the color filters 112 and the infrared transmitting filters 114. A planarizing layer 116 is formed so as to cover the microlenses 115.

The near infrared cut filters 111 are filters that allow transmission of light in a visible range (for example, light in a wavelength range of 400 to 700 nm) and shield light in a near infrared range. The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are fonned in the color filters. For example, the details of the color filters can be found in paragraphs "0214" to "0263" of JP2014-043556A, the content of which is incorporated herein by reference. The infrared transmitting filters 114 have visible light shielding properties, allow transmission of infrared light having a specific wavelength, and are formed of the film or the laminate according to the embodiment of the present invention having the above-described spectral characteristics.

In the infrared sensor shown in FIG. 1, an infrared cut filter (other infrared cut filter) other than the infrared cut filter 111 may be further disposed on the planarizing layer 116. As the other infrared cut filter, for example, a layer containing copper and/or a dielectric multi-layer film may be provided. The details are as described above. In addition, as the other infrared cut filter, a dual band pass filter may be used.

In addition, in the embodiment shown in FIG. 1, the color filters 112 are provided on the incidence ray hv side compared to the infrared cut filter 111. The lamination order of the infrared cut filter 111 and the color filters 112 may be reversed, and the infrared cut filter 111 may be provided on the incidence ray hv side compared to the color filters 112.

In addition, in the embodiment shown in FIG. 1, the infrared cut filters 111 and the color filters 112 are laminated adjacent to each other. However, the infrared cut filters 111 and the color filters 112 are not necessarily provided adjacent to each other, and another layer may be provided therebetween.

In addition, in the embodiment shown in FIG. 1, another infrared transmitting filter having spectral characteristics different from those of the infrared transmitting filter 114 may be further provided.

Figure 2:
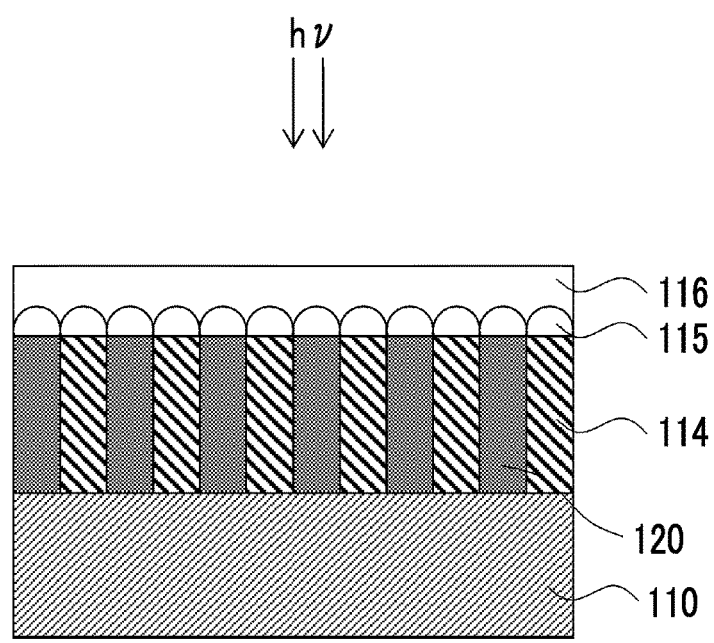
FIG. 2 is a schematic cross-sectional view showing a configuration of another embodiment of an infrared sensor according to the present invention.

An infrared sensor shown in FIG. 2 is another embodiment of the infrared sensor according to the embodiment of the present invention, and This infrared sensor includes: the infrared transmitting filters 114 and second infrared transmitting filters 120 different from the infrared transmitting filters 114 in an imaging region of the solid image pickup element 110. Microlenses 115 are disposed on an incidence ray hv side of the infrared transmitting filters 114 and the second infrared transmitting filters 120. A planarizing layer 116 is formed so as to cover the microlenses 115.

In the infrared sensor shown in FIG. 2, two or more kinds of infrared transmitting filters having different spectral characteristics may be further provided as the second infrared transmitting filters 120.

<Image Display Device>

The film or the laminate according to the embodiment of the present invention can also be used in an image display device such as a liquid crystal display device or an organic electroluminescence (organic EL) display device. The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The type of the liquid crystal display device to which the embodiment of the present invention is applicable is not particularly limited. For example, the present invention is applicable to various liquid crystal display devices described in "Next-Generation Liquid Crystal Display Techniques".

The image display device may include a white organic EL element as a display element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 run). It is more preferable that the spectrum has a maximum emission peak in a red range (650 nm to 700 nm) in addition to the above-described emission peaks.

EXAMPLES

Hereinafter, the present invention will be described in more detail using examples. However, the present invention is not limited to the following examples as long as it does not depart from the scope of the present invention. Unless specified otherwise, "part(s)" and "%" represent "part(s) by mass" and "mass %".

Test Example 1

[Preparation of Pigment Dispersion]

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, pigment dispersions A-1, A-2, and B-1 to B-5 were prepared.

(Pigment Dispersion A-1)

| | |
|---|---|
| Mixed pigment including a red pigment (C.I. Pigment Red 254) and a yellow pigment (C.I. Pigment Yellow 139) (red pigment: yellow pigment = 70:30 (mass ratio)) | 18.0 parts by mass |
| Dispersant 1 | 8.1 parts by mass |
| Propylene glycol methyl ether acetate (PGMEA) | 73.1 parts by mass |

(Pigment Dispersion A-2)

| | |
|---|---|
| Mixed pigment including a blue pigment (C.I. Pigment Blue 15:6) and a violet pigment (C.I. Pigment Violet 23) (blue pigment: violet pigment = 80:20 (mass ratio)) | 18.0 parts by mass |
| Dispersant 1 | 3.1 parts by mass |
| Alkali-soluble resin 1 | 5.0 parts by mass |
| Cyclohexanone | 31.2 parts by mass |
| PGMEA: | 42.7 parts by mass |

(Pigment Dispersion B-1)

| | |
|---|---|
| Pigment 1 | 5.4 parts by mass |
| Derivative 1 | 2.1 parts by mass |
| Dispersant 1 | 6.0 parts by mass |
| PGMEA: | 86.5 parts by mass |

(Pigment Dispersion B-2)

| | |
|---|---|
| Pigment 2 | 5.4 parts by mass |
| Derivative 1 | 2.1 parts by mass |
| Dispersant 1 | 6.0 parts by mass |
| PGMEA: | 86.5 parts by mass |

(Pigment Dispersion B-3)

| | |
|---|---|
| Pigment 3 | 5.4 parts by mass |
| Derivative 2 | 2.1 parts by mass |
| Dispersant 1 | 6.0 parts by mass |
| PGMEA: | 86.5 parts by mass |

(Pigment Dispersion B-4)

| | |
|---|---|
| Pigment 4 | 5.4 parts by mass |
| Derivative 3 | 2.1 parts by mass |
| Dispersant 1 | 6.0 parts by mass |
| PGMEA: | 86.5 parts by mass |

(Pigment Dispersion B-5)

| | |
|---|---|
| Pigment 5 | 5.4 parts by mass |
| Derivative 4 | 2.1 parts by mass |
| Dispersant 2 | 6.0 parts by mass |
| PGMEA: | 86.5 parts by mass |

[Preparation of Composition]

(Compositions 101 to 108, 201, and 301)

Components shown in the table below were mixed with each other at a ratio shown in the table below to prepare a composition. The table below shows the amounts (unit: part(s) by mass) of the corresponding components.

TABLE 3

|  | Composition 101 | Composition 102 | Composition 103 | Composition 104 | Composition 105 | Composition 106 | Composition 107 |
|---|---|---|---|---|---|---|---|
| Pigment Dispersion A-1 | 16 | 16 | 16 | 16 | 16 | 16 | 16 |
| Pigment Dispersion A-2 | 12.8 | 12.8 | 12.8 | 12.8 | 12.8 | 12.8 | 12.8 |
| Pigment Dispersion B-1 |  |  |  | 2 |  |  |  |
| Pigment Dispersion B-2 |  | 12.8 |  |  | 12.8 | 12.8 |  |
| Pigment Dispersion B-3 | 12.8 |  |  | 12.8 |  |  |  |
| Pigment Dispersion B-4 | 33.3 | 33.3 | 33.3 | 33.3 | 33.3 | 33.3 | 33.3 |
| Pigment Dispersion B-5 |  |  |  |  |  |  |  |
| Dye C-1 | 3.8 | 3.8 | 3.8 | 3.8 | 3.8 | 3.8 | 3.8 |
| Dye C-2 |  |  | 1 |  |  |  |  |
| Dye C-3 |  |  |  |  | 0.2 |  |  |
| Dye C-4 |  |  |  |  |  |  | 1 |
| Dye C-5 |  |  |  |  |  | 0.2 |  |
| Dye C-6 |  |  |  |  |  |  |  |
| Dye C-7 |  |  |  |  |  |  |  |
| Dye C-8 |  |  |  |  |  |  |  |
| Dye C-9 |  |  |  |  |  |  |  |
| Dye C-10 |  |  |  |  |  |  |  |
| Dye C-11 |  |  |  |  |  |  |  |
| Dye C-12 |  |  |  |  |  |  |  |
| Dye C-13 |  |  |  |  |  |  |  |
| Dye C-14 |  |  |  |  |  |  |  |
| Alkali-Soluble Resin 1 | 2.2 | 2.2 | 2.2 | 2.2 | 2.2 | 2.2 | 2.2 |
| Polymerizable Compound 1 | 0.6 | 0.6 | 0.6 | 0.6 | 0.6 | 0.6 | 0.6 |
| Polymerizable Compound 2 | 0.5 | 0.5 | 0.5 | 0.5 | 0.5 | 0.5 | 0.5 |
| Silane Coupling Agent 1 | 1.4 | 1.4 | 1.4 | 1.4 | 1.4 | 1.4 | 1.4 |
| Photopolymerization Initiator 1 | 1 |  |  |  | 1 | 1 | 1 |
| Photopolymerization Initiator 2 |  | 1 |  |  |  |  |  |
| Photopolymerization Initiator 3 |  |  | 1 |  |  |  |  |
| Photopolymerization Initiator 4 |  |  |  | 1 |  |  |  |
| Surfactant 1 | 0.05 | 0.05 | 0.05 | 0.05 | 0.05 | 0.05 | 0.05 |
| Organic Solvent 1 | 15.55 | 15.55 | 27.35 | 13.55 | 15.35 | 15.35 | 27.35 |

TABLE 4

|  | Composition 108 | Composition 109 | Composition 110 | Composition 111 | Composition 112 | Composition 113 | Composition 114 |
|---|---|---|---|---|---|---|---|
| Pigment Dispersion A-1 | 16 | 16 | 16.0 | 16.0 | 16.0 | 16.0 | 16.0 |
| Pigment Dispersion A-2 | 12.8 | 12.8 | 12.8 | 12.8 | 12.8 | 12.8 | 12.8 |
| Pigment Dispersion B-1 |  |  |  |  |  |  |  |
| Pigment Dispersion B-2 |  |  |  |  |  |  |  |
| Pigment Dispersion B-3 |  |  |  |  |  |  |  |
| Pigment Dispersion B-4 | 33.3 | 33.3 | 33.3 | 33.3 | 33.3 | 33.3 | 33.3 |
| Pigment Dispersion B-5 |  | 12.8 |  |  |  |  |  |
| Dye C-1 |  | 3.8 |  |  |  |  |  |
| Dye C-2 |  |  |  |  |  |  |  |
| Dye C-3 |  |  |  |  |  |  |  |

TABLE 4-continued

|  | Composition 108 | Composition 109 | Composition 110 | Composition 111 | Composition 112 | Composition 113 | Composition 114 |
|---|---|---|---|---|---|---|---|
| Dye C-4 | 1 |  | 1.0 | 1.0 | 1.0 | 1.0 | 1.0 |
| Dye C-5 |  |  |  |  |  |  |  |
| Dye C-6 | 3.8 |  |  |  |  |  |  |
| Dye C-7 |  |  | 3.8 |  |  |  |  |
| Dye C-8 |  |  |  | 3.8 |  |  |  |
| Dye C-9 |  |  |  |  | 3.8 |  |  |
| Dye C-10 |  |  |  |  |  | 3.8 |  |
| Dye C-11 |  |  |  |  |  |  | 3.8 |
| Dye C-12 |  |  |  |  |  |  |  |
| Dye C-13 |  |  |  |  |  |  |  |
| Dye C-14 |  |  |  |  |  |  |  |
| Alkali-Soluble Resin 1 | 2.2 | 2.2 | 2.2 | 2.2 | 2.2 | 2.2 | 2.2 |
| Polymerizable Compound 1 | 0.6 | 0.6 | 0.6 | 0.6 | 0.6 | 0.6 | 0.6 |
| Polymerizable Compound 2 | 0.5 | 0.5 | 0.5 | 0.5 | 0.5 | 0.5 | 0.5 |
| Silane Coupling Agent 1 | 1.4 | 1.4 | 1.4 | 1.4 | 1.4 | 1.4 | 1.4 |
| Photopolymerizalion Initiator 1 | 1 | 1 | 1.0 | 1.0 | 1.0 | 1.0 | 1.0 |
| Photopolymerization Initiator 2 |  |  |  |  |  |  |  |
| Photopolymerization Initiator 3 |  |  |  |  |  |  |  |
| Photopolymerization Initiator 4 |  |  |  |  |  |  |  |
| Surfactant 1 | 0.05 | 0.05 | 0.1 | 0.1 | 0.1 | 0.1 | 0.1 |
| Organic Solvent 1 | 27.35 | 15.55 | 27.4 | 27.4 | 27.4 | 27.4 | 27.4 |

TABLE 5

|  | Composition 115 | Composition 116 | Composition 117 | Composition 201 | Composition 301 |
|---|---|---|---|---|---|
| Pigment Dispersion A-1 | 16.0 | 16.0 | 16.0 | 26.3 | 47.1 |
| Pigment Dispersion A-2 | 12.8 | 12.8 | 12.8 | 21.0 | 37.8 |
| Pigment Dispersion B-1 |  |  |  |  |  |
| Pigment Dispersion B-2 |  |  |  |  |  |
| Pigment Dispersion B-3 |  |  |  | 21.0 |  |
| Pigment Dispersion B-4 | 33.3 | 33.3 | 33.3 |  |  |
| Pigment Dispersion B-5 |  |  |  |  |  |
| Dye C-1 |  |  |  |  |  |
| Dye C-2 |  |  |  |  |  |
| Dye C-3 |  |  |  |  |  |
| Dye C-4 | 1.0 | 1.0 | 1.0 |  |  |
| Dye C-5 |  |  |  |  |  |
| Dye C-6 |  |  |  |  |  |
| Dye C-7 |  |  |  |  |  |
| Dye C-8 |  |  |  |  |  |
| Dye C-9 |  |  |  |  |  |
| Dye C-10 |  |  |  |  |  |
| Dye C-11 |  |  |  |  |  |
| Dye C-12 | 3.8 |  |  |  |  |
| Dye C-13 |  | 3.8 |  |  |  |
| Dye C-14 |  |  | 3.8 |  |  |
| Alkali-Soluble Resin 1 | 2.7 | 2.7 | 2.2 | 3.6 | 0.6 |
| Polymerizable Compound 1 | 0.6 | 0.6 | 0.6 | 1.0 | 0.6 |
| Polymerizable Compound 2 | 0.5 | 0.5 | 0.5 | 0.8 | 0.5 |
| Silane Coupling Agent 1 | 1.4 | 1.4 | 1.4 | 2.3 | 1.4 |
| Photopolymerization Initiator 1 | 1.0 | 1.0 | 1.0 | 1.6 | 1 |
| Photopolymcrization Initiator 2 |  |  |  |  |  |
| Photopolymerization Initiator 3 |  |  |  |  |  |
| Photopolymerization Initiator 4 |  |  |  |  |  |
| Surfactant 1 | 0.1 | 0.1 | 0.1 | 0.1 | 0.05 |
| Organic Solvent 1 | 27.4 | 27.4 | 27.4 | 22.2 | 10.95 |

(Composition 401)

2.5 mL of 0.5 g/L polystyrene sulfonic acid aqueous solution was added to 50 mL of 2.5 mmol/L sodium citrate aqueous solution, and the solution was heated to 35° C. 3 of 10 mmol/L sodium boron hydride aqueous solution was added to this solution, and 50 mL of 0.5 mmol/L silver nitrate aqueous solution was added under stirring at 20 mL/min. This solution was stirred for 30 minutes to prepare a seed solution.

Next, 2 mL of 10 mmol/L ascorbic acid aqueous solution was added to 250 mL of this seed solution, and the solution was heated to 35° C. 79.6 mL of 0.5 mmol/L silver nitrate aqueous solution was added to this solution under stirring at 10 mL/min. After stirring the obtained solution for 30 minutes, 71.1 mL of 0.35 mol/L hydroquinone potassium sulfonate aqueous solution was further added, and 200 g of 7 mass % gelatin aqueous solution was added. A white precipitate mixed solution of silver sulfite obtained by mixing 107 mL of 0.26 mol/L sodium sulfite aqueous solution and 107 mL of 0.47 mol/L silver nitrate aqueous solution was added to the solution. The solution was stirred until silver was sufficiently reduced, and 72 mL of 0.17 mol/L NaOH aqueous solution was added. This way, a silver flat particle dispersion A1 was obtained. It was verified that silver hexagonal flat particles (hereinafter, referred to as "Ag hexagonal flat particles") having an average equivalent circle diameter of 130 nm were formed in the obtained silver flat particle dispersion A1. In addition, in a case where the thickness of the hexagonal flat particles was measured using an atomic force microscope (Nanocute II, manufactured by Seiko Instruments Inc.), it was found that flat particles having an average thickness of 10 nm and an aspect ratio of 13 were formed.

0.5 mL of 1 mol/L NaOH was added to 60 mL of the obtained silver flat particle dispersion A1, 90 mL of ion exchange water was added, and centrifugal separation was performed using a centrifugal separator (H-200N, ANGLE ROTOR BN, manufactured by Kokusan Co., Ltd.). As a result, Ag hexagonal flat particles were precipitated. After the centrifugal separation, the supernatant liquid was wasted, 10 mL of water was added, and the precipitated Ag hexagonal flat particles were redispersed using a homogenizer SX-10 (manufactured by Mitsui Electric Co., Ltd.) at a rotation speed of 13000 rpm for 20 minutes. As a result, a composition 401 was obtained.

Raw materials used to prepare the pigment dispersions and the compositions are as follows.

Pigment 1: a compound having the following structure (a compound having an absorption maximum in a wavelength range of longer than 700 nm and 900 nm or shorter)

Pigment 2: a compound having the following structure (a compound having an absorption maximum in a wavelength range of longer than 700 nm and 900 nm or shorter)

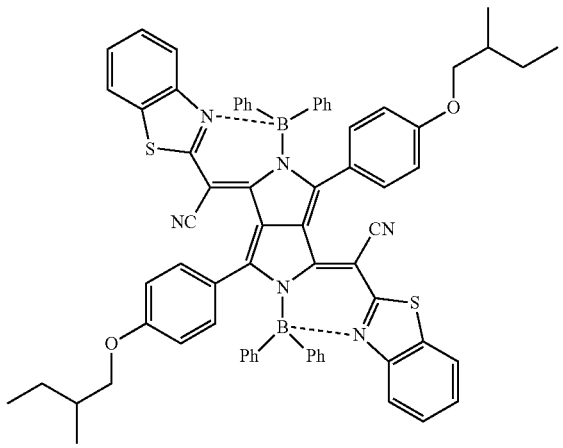

Pigment 3: a compound having the following structure (a compound having an absorption maximum in a wavelength range of longer than 700 μm and 900 nm or shorter)

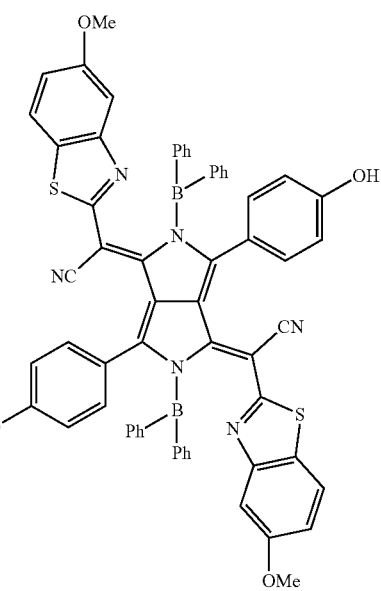

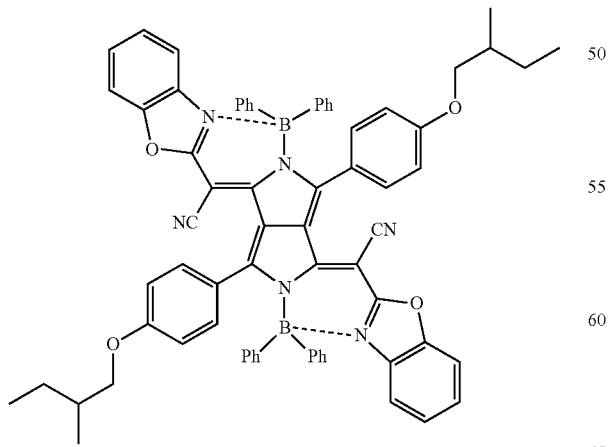

Pigment 4: a compound having the following structure (a compound having an absorption maximum in a wavelength range of longer than 900 n and 1000 mil or shorter)

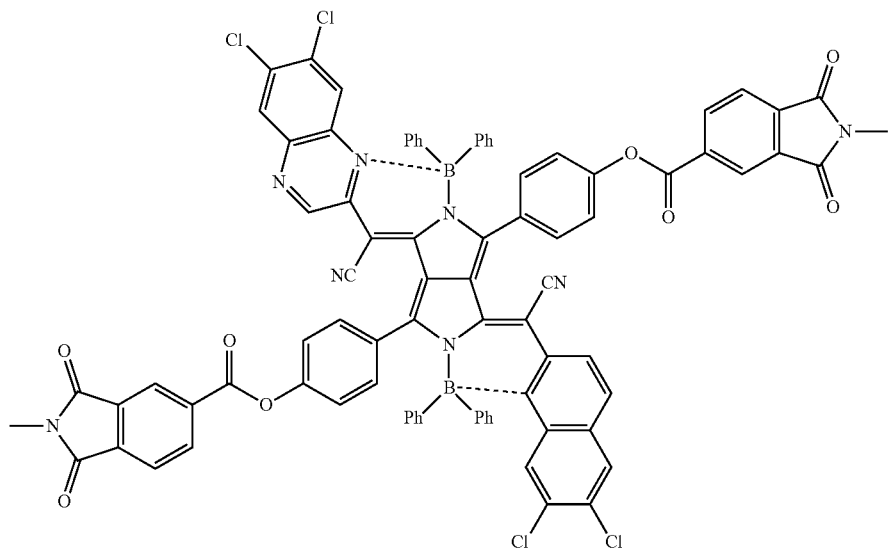

Pigment 5: a compound having the following structure (a compound having an absorption maximum in a wavelength range of longer than 700 nm and 900 nm or shorter)

Dye C-3: a compound having the following structure (a compound having an absorption maximum in a wavelength range of longer than 700 nm and 900 nm or shorter)

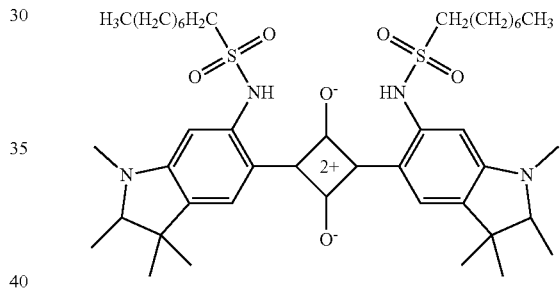

Dye C-4: a compound having the following structure (a compound having an absorption maximum in a wavelength range of longer than 700 nm and 900 nm or shorter)

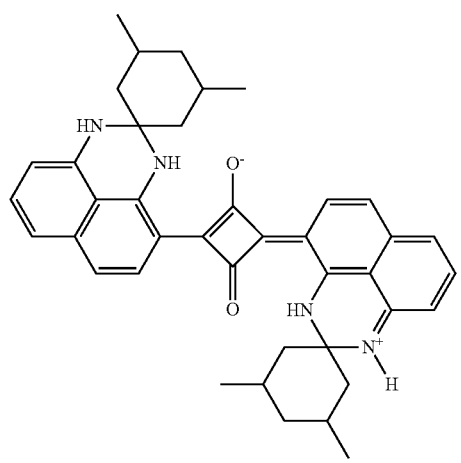 [SMILES: CC1CC(C)CC2(C1)Nc1cccc3ccc(C4=C([O-])/C(=c5\ccc6cccc7c6c5NC5(CC(C)CC(C)C5)[NH+]=7)C4=O)c(c13)N2]

Dye C-1: a compound having the following structure (a compound having an absorption maximum in a wavelength range of longer than 1000 nm and 1200 nm or shorter)

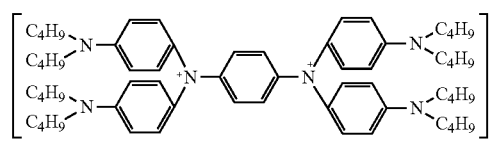

Dye C-2: IRA 884 manufactured by Exiton, Inc. (a compound having an absorption maximum in a wavelength range of longer than 700 nm and 900 nm or shorter)

Dye C-5: a compound having the following structure (a compound having an absorption maximum in a wavelength range of longer than 700 nm and 900 nm or shorter)

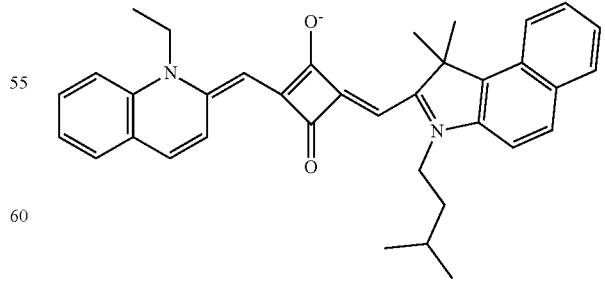

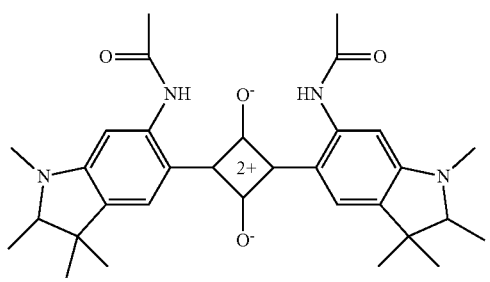
Dye C-6: IRG-068 manufactured by Nippon Kayaku Co., Ltd. (a compound having an absorption maximum in a wavelength range of longer than 1000 nm and 1200 nm or shorter)
Dyes C-7 to C-14: compounds having the following structures (compounds having an absorption maximum in a wavelength range of longer than 1000 nm and 1200 nm or shorter)
C-7
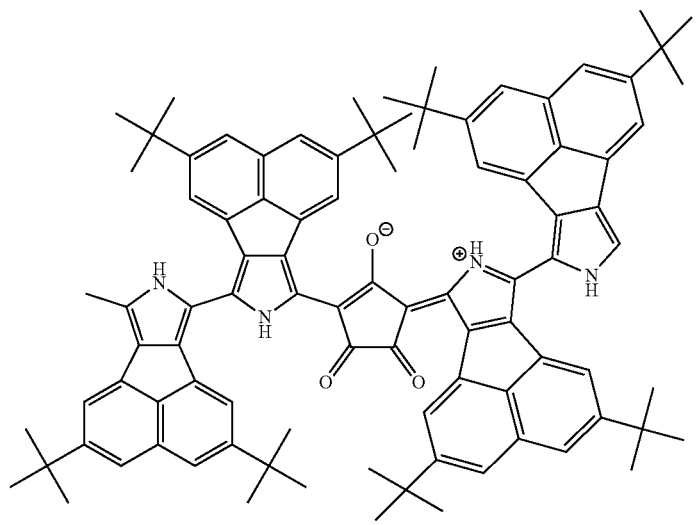
C-8
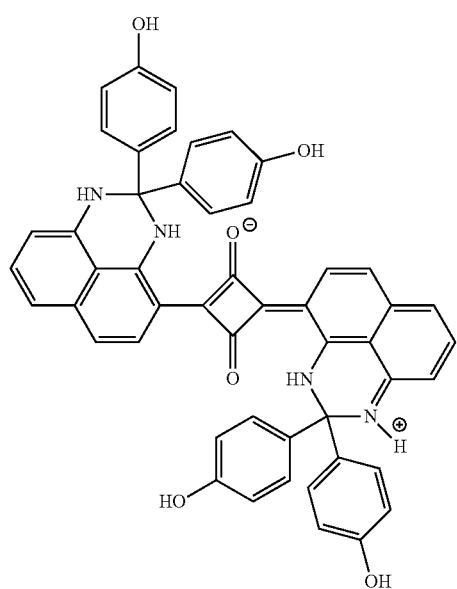

-continued
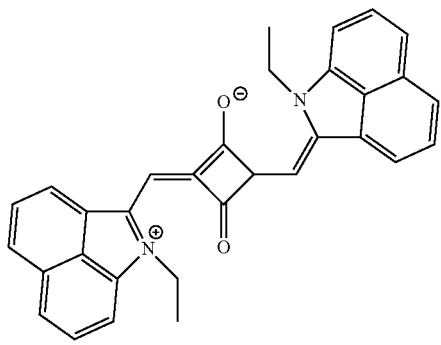
C-9
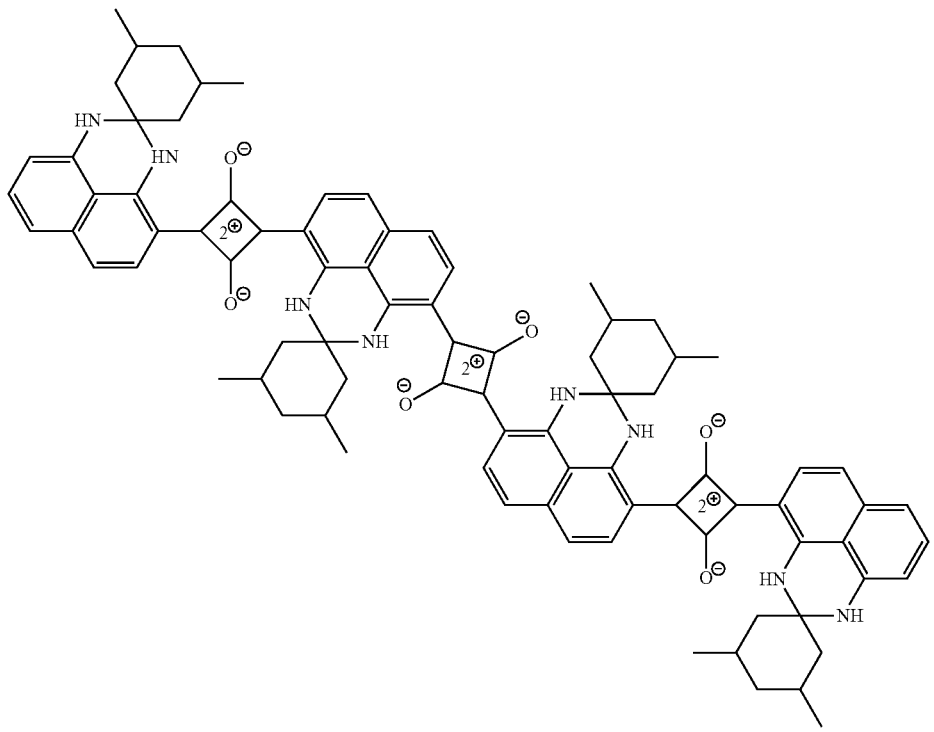
C-10
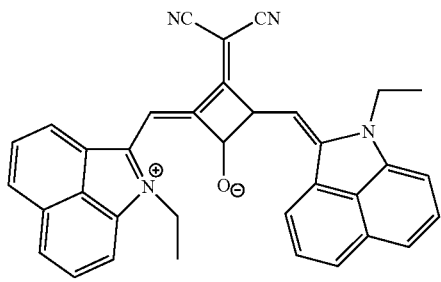
C-11
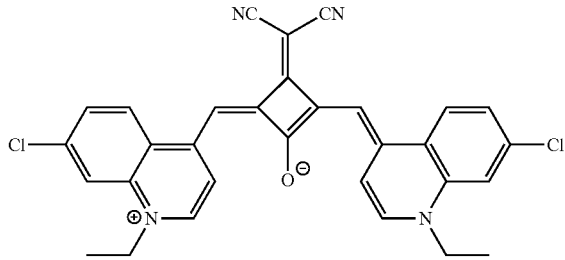
C-12

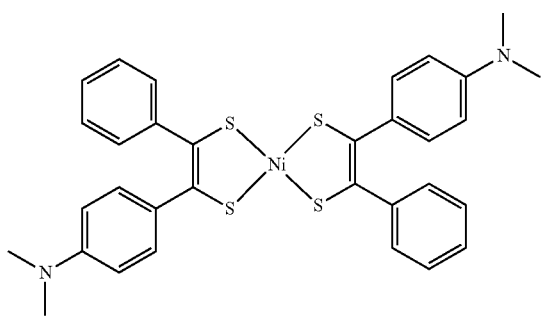
C-13
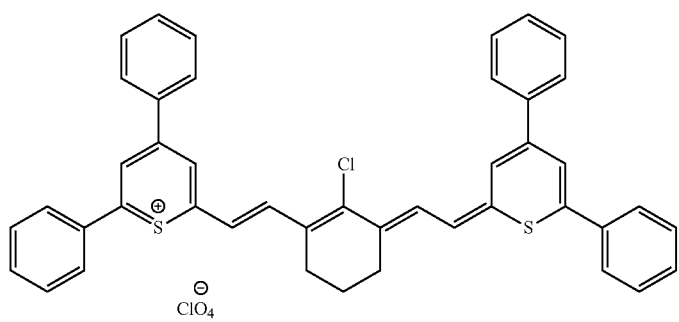
C-14
Derivatives 1 to 4: compounds 1 to 4 having the following structures
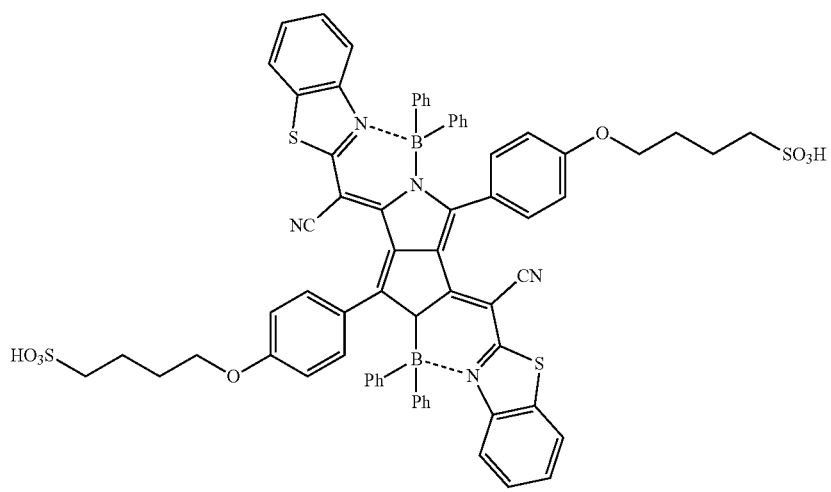
1

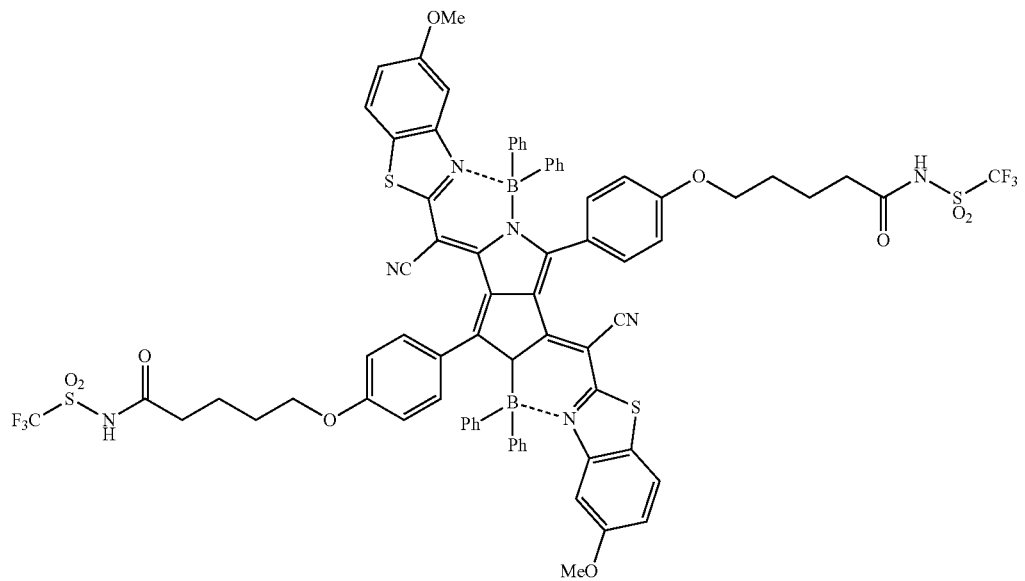
2
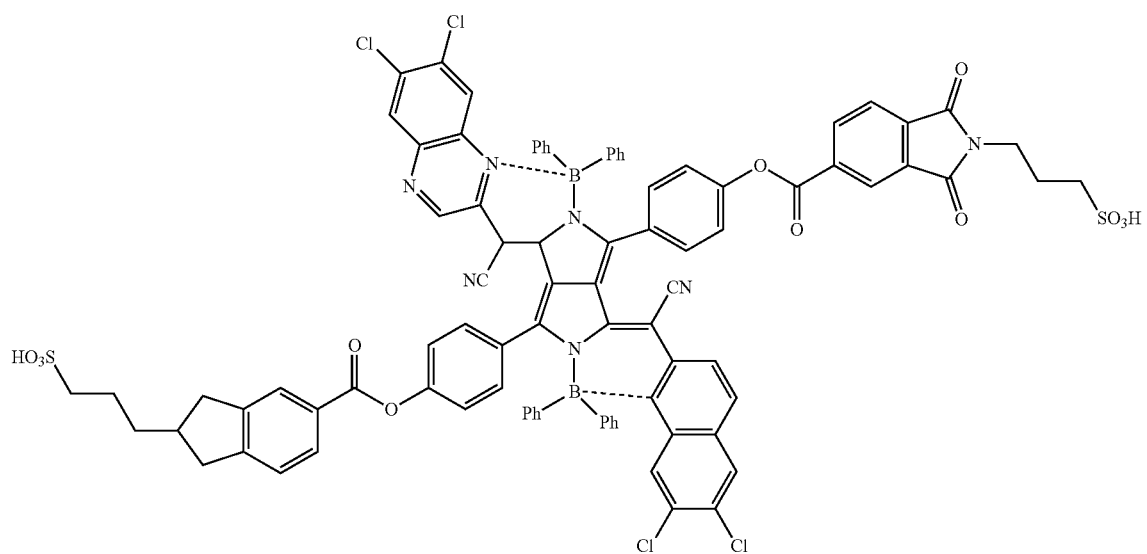
3

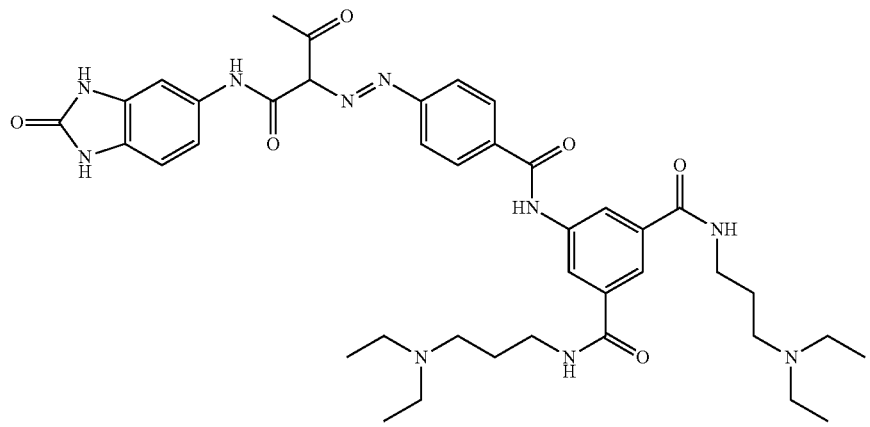

Dispersant 1: a resin having the following structure (a numerical value added to a main chain represents a molar ratio of a repeating unit, and a numerical value added to a side chain represents the number of repeating units; Mw=20900)

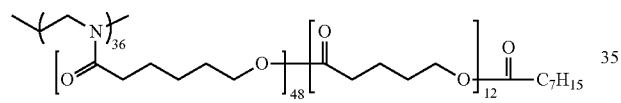

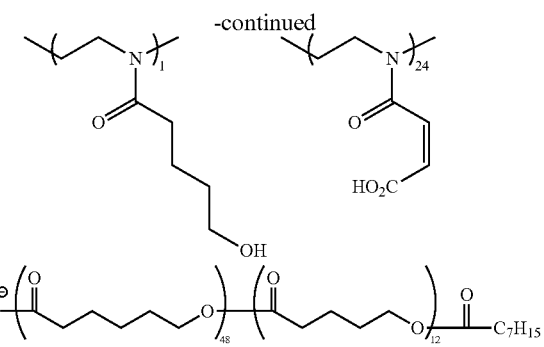

Dispersant 2: a resin having the following structure (a numerical value added to a main chain represents a molar ratio of a repeating unit, and a numerical value added to a side chain represents the number of repeating units; Mw=32700)

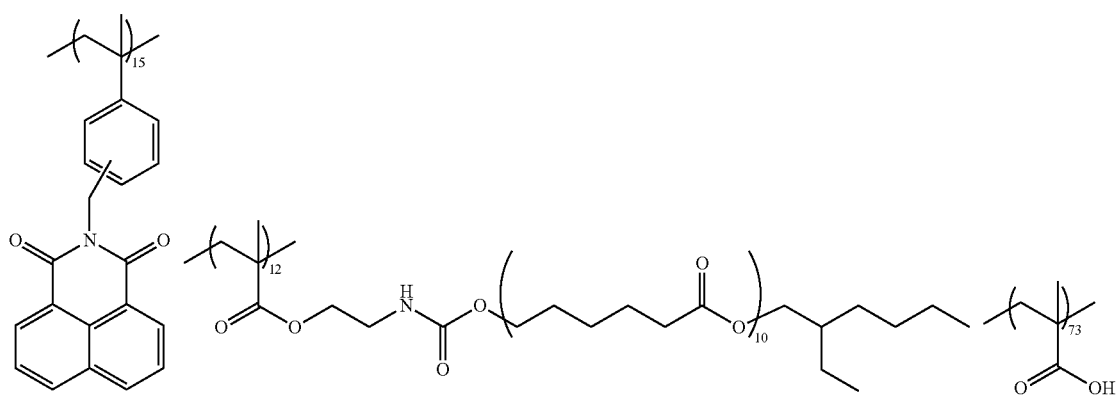

Polymerizable compound 1: a compound having the following structures (a mixture in which a molar ratio between a left compound and a right compound is 7:3)

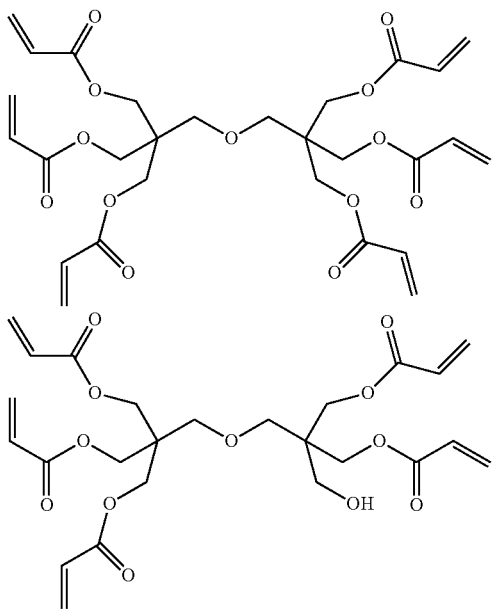

Polymerizable compound 2: a compound having the following structure

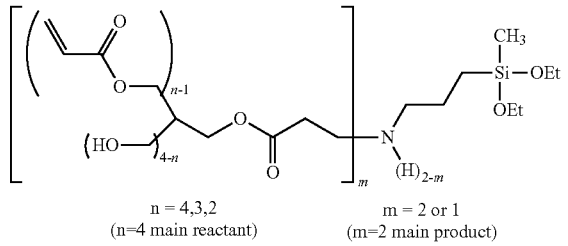

Silane coupling agent 1: a compound having the following structure

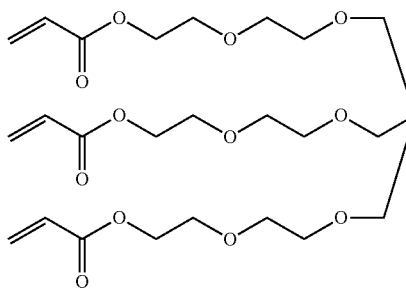

n = 4,3,2
(n=4 main reactant)

m = 2 or 1
(m=2 main product)

Alkali-soluble resin 1: a resin having the following structure (a numerical value added to a main chain represents a molar ratio of a repeating unit, Mw=11000)

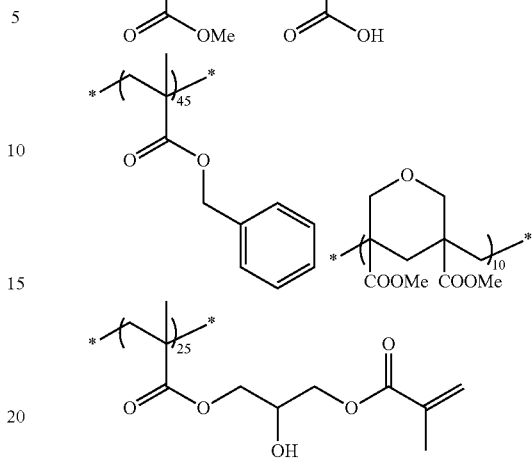

Photopolymerization Initiator 1: IRGACURE-OXE 01 (manufactured by BASF SE)

Photopolymerization Initiator 2: IRGACURE-OXE 02 (manufactured by BASF SE)

Photopolymerization Initiator 3: a compound having the following structure

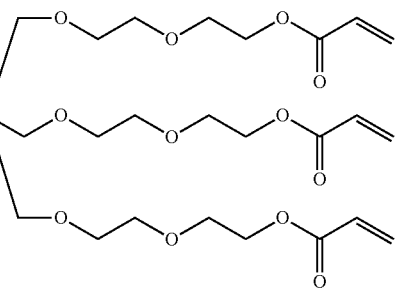

Photopolymerization Initiator 4: IRGACURE-369 (manufactured by BASF SE)

Surfactant 11: the following mixture (Mw=14000, in the following formula, "%" representing the proportion of a repeating unit is mol %)

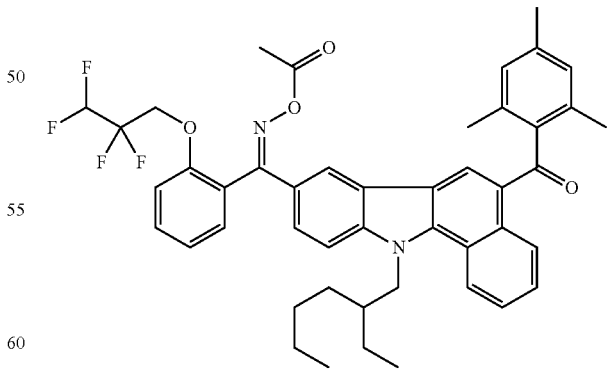

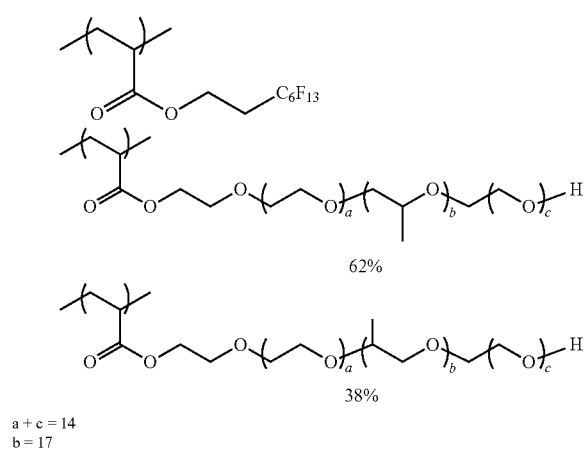

a + c = 14
b = 17

Organic Solvent 1: PGMEA

[Evaluation of Absorbance and Spectral Characteristics]

In each of Examples 1 to 17 and Comparative Example 1, each of the compositions was applied to a glass substrate using a spin coating method such that the thickness of a post-baked film was 1.0 µm. Next, the coating film was heated using a hot plate at 100° C. for 120 seconds. Next, the glass wafer was further heated (post-baked) using a hot plate at 200° C. for 300 seconds to form a film. In the glass substrate including the film, a minimum value A of the absorbance in a wavelength range of 400 to 1100 nm and a maximum value B of the absorbance in a wavelength range of 1400 to 1500 nm were measured using an ultraviolet-visible-near infrared spectrophotometer (U-4100, manufactured by Hitachi High-Technologies Corporation).

In Example 18, the composition 201 was applied to a glass substrate using a spin coating method such that the thickness of a post-baked film was 1.0 µm. Next, the coating film was heated using a hot plate at 100° C. for 120 seconds. Next, the coating film was further heated (post-baked) using a hot plate at 200° C. for 300 seconds to form a film. In Example 18, the composition 401 was applied to a surface of the film on the glass substrate using a spin coating method such that the thickness of a post-baked film was 0.1 µm. Next, the coating film was heated using a hot plate at 100° C. for 120 seconds. Next, the coating film was further heated (post-baked) using a hot plate at 200° C. for 300 seconds to form a film. As a result, a laminate was manufactured. In the glass substrate including the laminate, a minimum value A of the absorbance in a wavelength range of 400 to 1100 nm and a maximum value B of the absorbance in a wavelength range of 1400 to 1500 nm were measured using an ultraviolet-visible-near infrared spectrophotometer (U-4100, manufactured by Hitachi High-Technologies Corporation).

[Preparation of Filter]

Examples 1 to 17 and Comparative Example 1

A composition shown "IR Pixel 1" in the following table was applied to an InGaAs substrate using a spin coating method such that the thickness of a post-baked film was 1.0 Next, the coating film was heated using a hot plate at 100° C. for 120 seconds.

Next, using an i-ray stepper exposure device FPA-3000 i5+(manufactured by Canon Corporation), the coating film was exposed at an optimum exposure dose through a photomask on which a square pixel pattern having a size of 1.4×1.4 was formed. The optimum exposure dose was determined based on an exposure dose at which the square pixel pattern was resolved while increasing the exposure dose from 50 mJ/cm$^2$ to 750 mJ/cm$^2$ at an interval of 50 mJ/cm$^2$.

Next, the InGaAs substrate on which the exposed coating film was formed was placed on a horizontal rotary table of a spin-shower developing machine (DW-30, manufactured by Chemitronics Co., Ltd.) and underwent puddle development at 23° C. for 60 seconds using CD-2060 (a tetramethylammonium hydroxide aqueous solution, manufactured by Fujifilm Electronic Materials Co., Ltd.) to form a pattern of the IR pixel 1. The InGaAs substrate on which the pattern of the IR pixel 1 was formed was rinsed with pure water and was dried by spinning. Further, the coating film was further heated (post-baked) using a hot plate at 200° C. for 300 seconds.

Next, a composition shown "IR Pixel 2" in the following table was applied to the InGaAs substrate on which the pattern of the IR pixel 1 was formed using a spin coating method such that the thickness of a post-baked film was 1.0 nm. Next, the coating film was heated using a hot plate at 100° C. for 120 seconds. Next, using the same method as that of the IR pixel 1, the coating film was exposed and developed to form a pattern of the IR pixel 2. As a result, a filter was manufactured.

Example 18

In Example 18, the composition 201 was applied to an InGaAs substrate using a spin coating method such that the thickness of a post-baked film was 1.0 µm. Next, the coating film was heated using a hot plate at 100° C. for 120 seconds. Next, the coating film was further heated (post-baked) using a hot plate at 200° C. for 300 seconds to form a film. In Example 18, the composition 401 was applied to a surface of the film using a spin coating method such that the thickness of a post-baked film was 0.1 µm. Next, the coating film was heated using a hot plate at 100° C. for 120 seconds. Next, the coating film was further heated (post-baked) using a hot plate at 200° C. for 300 seconds to form a film. As a result, a laminate was manufactured.

Next, an IR pixel 1 of a 1.4 µm×1.4 µm square pixel pattern was formed by dry etching using an i-ray resist.

Next, the composition 201 was applied to the InGaAs substrate on which the pattern of the IR pixel 1 was formed using a spin coating method such that the thickness of a post-baked film was 1.0 µm. Next, the coating film was heated using a hot plate at 100° C. for 120 seconds. Next, using the same method as that of Examples 1 to 17, the coating film was exposed and developed to form a pattern of the IR pixel 2. As a result, a filter was manufactured.

[Evaluation 1]

The obtained filter was incorporated into a solid image pickup element using a well-known method. Using the obtained solid image pickup element, images of a white plate wetted by water and a dry white plate were obtained, and whether or not the wetting of water was distinguished was evaluated.

A: the dry plate and the plate wetted by water were clearly able to be distinguished.

B: the dry plate and the plate wetted by water were able to be distinguished.

C: the dry plate and the plate wetted by water were not able to be distinguished.

TABLE 6

|  | Example 1 | Example 2 | Example 3 | Example 4 | Example 5 | Example 6 | Example 7 |
|---|---|---|---|---|---|---|---|
| IRPixel 1 | Composition 101 | Composition 102 | Composition 103 | Composition 104 | Composition 105 | Composition 106 | Composition 107 |
| 1RPixel2 | Composition 201 | Composition 201 | Composition 201 | Composition 201 | Composition 201 | Composition 201 | Composition 201 |
| Minimum Value A of Absorbance (400 to 1100 nm) | 1.0 | 1.0 | 1.1 | 1.0 | 1.1 | 1.1 | 1.1 |
| Maximum Value B of Absorbance (1400 to 1500 nm) | 0.06 | 0.06 | 0.06 | 0.06 | 0.06 | 0.06 | 0.06 |
| A/B | 16.7 | 16.7 | 18.3 | 16.7 | 18.3 | 18.3 | 18.3 |
| Evaluation 1 | A | A | A | A | A | A | A |

TABLE 7

|  | Example 8 | Example 9 | Example 10 | Example 11 | Example 12 | Example 13 | Example 14 |
|---|---|---|---|---|---|---|---|
| IRPixcl 1 | Composition 108 | Composition 109 | Composition 110 | Composition 111 | Composition 112 | Composition 113 | Composition 114 |
| IRPixel 2 | Composition 201 | Composition 201 | Composition 201 | Composition 201 | Composition 201 | Composition 201 | Composition 201 |
| Minimum Value A of Absorbance (400 to 1100 nm) | 1.1 | 0.9 | 1.1 | 1.1 | 1.1 | 1.1 | 1.1 |
| Maximum Value B of Absorbance (1400 to 1500 nm) | 0.08 | 0.06 | 0.08 | 0.08 | 0.08 | 0.08 | 0.08 |
| A/B | 13.8 | 15.0 | 13.8 | 13.8 | 13.8 | 13.8 | 13.8 |
| Evaluation 1 | A | A | A | A | A | A | A |

TABLE 8

|  | Example 15 | Example 16 | Example 17 | Example 18 | Comparative Example 1 |
|---|---|---|---|---|---|
| IRPixel 1 | Composition 115 | Composition 116 | Composition 117 | Composition 201/ Composition 401 | Composition 301 |
| IRPixel 2 | Composition 201 | Composition 201 | Composition 201 | Composition 201 | Composition 201 |
| Minimum Value A of Absorbance (400 to 1100 nm) | 1.1 | 1.1 | 1.1 | 1.0 | 0.02 |
| Maximum Value B of Absorbance (1400 to 1500 nm) | 0.08 | 0.08 | 0.08 | 0.08 | 0.03 |
| A/B | 13.8 | 13.8 | 13.8 | 12.5 | 0.7 |
| Evaluation 1 | A | A | A | A | C |

In all Examples 1 to 18, the dry plate and the plate wetted by water were clearly able to be distinguished, and spectral identification was excellent. On the other hand, in Comparative Example 1, the dry plate and the plate wetted by water were not able to be distinguished, and spectral identification was insufficient.

In Composition 101, even in a case where any one of a lanthanum boride compound, metal flat metal particles, a quantum dot, or a rare earth-containing ceramic having the same light shielding capability is used instead of the dye C-1, the same effects can be obtained.

Test Example 2

An infrared cut filter-forming composition was applied to an InGaAs substrate using a spin coating method such that the thickness of the formed film was 1.0 μm. Next, the coating film was heated using a hot plate at 100° C. for 2 minutes. Next, using an i-ray stepper exposure device FPA-3000 i5+(manufactured by Canon Corporation), the coating film was exposed through a mask having a 2 μm×2 μm Bayer pattern at an exposure dose of 1000 mJ/cm².

Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, a 2 μm×2 μm Bayer pattern (infrared cut filter) was formed.

Next, a Red composition was applied to the Bayer pattern of the infrared cut filter using a spin coating method such that the thickness of the formed film was 1.0 μm. Next, the coating film was heated using a hot plate at 100° C. for 2 minutes. Next, using an i-ray stepper exposure device FPA-3000 i5+(manufactured by Canon Corporation), the coating film was exposed through a mask having a 2 μm×2 μm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the Bayer pattern of the infrared cut filter. Likewise, a Green composition and a Blue composition were sequentially patterned to form red, green, and blue color patterns.

Next, the composition 101 was applied to the pattern-formed film using a spin coating method such that the thickness of the formed film was 2.0 μm. Next, the coating film was heated using a hot plate at 100° C. for 2 minutes. Next, using an i-ray stepper exposure device FPA-3000 i5+(manufactured by Canon Corporation), the coating film was exposed through a mask having a 2 μm×2 μm Bayer pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method.

Using the obtained solid image pickup element, images of a white plate wetted by water and a dry white plate were obtained, and whether or not the wetting of water was distinguished was evaluated. As a result, the dry plate and the plate wetted by water were clearly able to be distinguished.

The Red composition, the Green composition, the Blue composition, and the infrared cut filter-forming composition used in Test Example 2 are as follows.

(Red Composition)

The following components were mixed and stirred, and the obtained mixture was filtered through a nylon filter (manufactured by Pall Corporation) having a pore size of 0.45 μm to prepare a Red composition.

| | |
|---|---|
| Red Pigment Dispersion | 51.7 parts by mass |
| Resin 102 | 0.6 parts by mass |
| Polymerizable compound 2 | 0.6 parts by mass |
| Photopolymerization Initiator 1 | 0.4 parts by mass |
| Surfactant 101 | 4.2 parts by mass |
| Ultraviolet absorber (UV-503, manufactured by Daito Chemical Co., Ltd.) | 0.3 parts by mass |
| PGMEA | 42.6 parts by mass |

(Green Composition)

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion | 73.7 parts by mass |
| Alkali-soluble resin 1 | 0.3 parts by mass |
| Polymerizable Compound 1 | 1.2 parts by mass |
| Photopolymerization Initiator 1 | 0.6 parts by mass |
| Surfactant 101 | 4.2 parts by mass |
| Ultraviolet absorber (UV-503, manufactured by Daito Chemical Co., Ltd.) | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | 44.9 parts by mass |
| Alkali-soluble resin 1 | 2.1 parts by mass |
| Polymerizable Compound 1 | 1.5 parts by mass |
| Polymerizable compound 2 | 0.7 parts by mass |
| Photopolymerization Initiator 1 | 0.8 parts by mass |
| Surfactant 101 | 4.2 parts by mass |
| Ultraviolet absorber (UV-503, manufactured by Daito Chemical Co., Ltd.) | 0.3 parts by mass |
| PGMEA | 45.8 parts by mass |

(Infrared Cut Filter-Forming Composition)

| | |
|---|---|
| Pigment dispersion B-1 | 12.8 parts by mass |
| Pigment dispersion B-4 | 33.3 parts by mass |
| Dispersion D-1: | 13.5 parts by mass |
| Alkali-soluble resin 1 | 3.0 parts by mass |
| Polymerizable Compound 1 | 0.9 parts by mass |
| Polymerizable compound 2 | 2.1 parts by mass |
| Silane coupling agent 1: | 0.9 parts by mass |
| Photopolymerization Initiator 1 | 1.0 part by mass |
| Surfactant 101 | 4.2 parts by mass |
| Ultraviolet absorber (UV-503, manufactured by Daito Chemical Co., Ltd.) | 1.6 parts by mass |
| PGMEA | 26.7 parts by mass |

Raw materials used in the Red composition, the Green composition, the Blue composition, and the infrared cut filter-forming composition are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm³ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm³ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), and 82.4 parts by mass of PGMEA were mixed with each other to obtain a mixed solution, and the mixed solution was mixed and dispersed using a beads mill (zirconia beads;

diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Dispersion D-1

A mixed solution of 28.1 parts by mass of tin-doped indium oxide powder (P4-ITO, manufactured by Mitsubishi Materials Corporation), 18.8 parts by mass of the dispersant 1 (solid content: 20%, solvent: propylene glycol monomethyl ether acetate), and 18.8 parts by mass of cyclohexanone was dispersed with a paint shaker (manufactured by Asada Iron Works Co., Ltd.) using zirconia beads having a diameter of 0.3 mm for 5 hours. As a result, the dispersion D-1 was prepared.

Surfactant 101: 1 mass % PGMEA solution of the following mixture (Mw: 14000). In the following formula, "%" representing the proportion of a repeating unit is mol %.

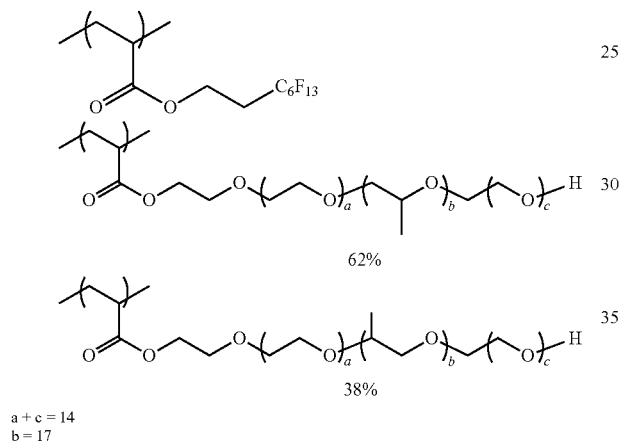

a + c = 14
b = 17

EXPLANATION OF REFERENCES

110: solid image pickup element
111: infrared cut filter
112: color filter
114: infrared transmitting filter
115: microlens
116: planarizing layer
120: second infrared transmitting filter

What is claimed is:

1. A composition comprising:
    a coloring material that allows transmission of infrared light and shields visible light;
    an infrared absorber; and
    a curable compound,
    wherein:
    the infrared absorber includes a material that shields light in a wavelength range of longer than 1000 nm and 1200 nm or shorter, and further includes a compound having an absorption maximum in a wavelength range of longer than 900 nm and 1000 nm or shorter,
    the material that shields light in a wavelength range of longer than 1000 nm and 1200 nm or shorter is a compound having an absorption maximum in a wavelength range of longer than 1000 nm and 1200 nm or shorter, and
    a ratio AB of a minimum value A of an absorbance of the composition in a wavelength range of 400 to 1100 nm to a maximum value B of an absorbance of the composition in a wavelength range of 1400 to 1500 nm is 4.5 or higher.

2. The composition according to claim 1,
    wherein in the compound having an absorption maximum in a wavelength range of longer than 1000 nm and 1200 nm or shorter, a ratio absorbance $A_{max}$/absorbance $A_{1400}$ of an absorbance $A_{max}$ at the absorption maximum to an absorbance $A_{1400}$ at a wavelength of 1400 nm is 4.5 or higher.

3. The composition according to claim 1,
    wherein the material that shields light in a wavelength range of longer than 1000 nm and 1200 nm or shorter is at least one selected from a diiminium compound, a squarylium compound, a croconium compound, a cyanine compound, a dithiol metal complex, a lanthanum boride compound, flat metal particles, a quantum dot, or a rare earth-containing ceramic.

4. The composition according to claim 1,
    wherein the infrared absorber further includes a compound having an absorption maximum in a wavelength range of longer than 700 nm and 900 nm or shorter.

5. A film which is formed using the composition according to claim 1.

6. The film according to claim 5,
    wherein a maximum value of a light transmittance of the film in a thickness direction in a wavelength range of 400 to 1100 nm is 20% or lower, and
    a minimum value of a light transmittance of the film in the thickness direction in a wavelength range of 1400 to 1500 nm is 70% or higher.

7. A laminate comprising:
    a layer including a coloring material that allows transmission of infrared light and shields visible light; and
    a layer including a material that shields light in a wavelength range of longer than 1000 nm and 1200 nm or shorter,
    wherein a ratio AB of a minimum value A of an absorbance of the laminate in a wavelength range of 400 to 1100 nm to a maximum value B of an absorbance of the laminate in a wavelength range of 1400 to 1500 nm is 4.5 or higher.

8. The laminate according to claim 7,
    wherein a maximum value of a light transmittance of the laminate in a thickness direction in a wavelength range of 400 to 1100 nm is 20% or lower, and
    a minimum value of a light transmittance of the laminate in the thickness direction in a wavelength range of 1400 to 1500 nm is 70% or higher.

9. An infrared transmitting filter comprising:
    the film according to claim 5.

10. A solid image pickup element comprising:
    the film according to claim 5.

11. An infrared sensor comprising:
    the film according to claim 5.

* * * * *